(12) United States Patent
Ito et al.

(10) Patent No.: US 6,333,206 B1
(45) Date of Patent: Dec. 25, 2001

(54) PROCESS FOR THE PRODUCTION OF SEMICONDUCTOR DEVICE

(75) Inventors: Satoshi Ito; Masaki Mizutani; Hiroshi Noro; Shinichiro Sudo; Takashi Fukushima; Makoto Kuwamura, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/297,980

(22) PCT Filed: Dec. 22, 1997

(86) PCT No.: PCT/JP97/04753

§ 371 Date: May 12, 1999

§ 102(e) Date: May 12, 1999

(87) PCT Pub. No.: WO98/28788

PCT Pub. Date: Jul. 2, 1998

(30) Foreign Application Priority Data

Dec. 24, 1996 (JP) .................................................. 8-343398
Apr. 2, 1997 (JP) .................................................. 9-083496
Jul. 25, 1997 (JP) .................................................. 9-200435
Nov. 11, 1997 (JP) .................................................. 9-308969

(51) Int. Cl.$^7$ .......................... H01L 21/44; H01L 23/495; H01L 23/22; H01L 23/29

(52) U.S. Cl. ........................ 438/106; 438/108; 438/110; 438/117; 257/687; 257/686; 257/789

(58) Field of Search ................................... 438/108, 110, 438/117, 106; 257/667, 687, 686, 700, 720, 781, 783, 793, 789

(56) References Cited

U.S. PATENT DOCUMENTS 5,068,712 * 11/1991 Murakam et al. ...................... 357/72
5,356,698 * 10/1994 Kawamoto et al. ................. 428/209

(List continued on next page.)

FOREIGN PATENT DOCUMENTS 5-13119    1/1993   (JP) .............................. H01R/11/01

(List continued on next page.)

*Primary Examiner*—Michael Lebentritt
(74) *Attorney, Agent, or Firm*—Sughrue, Mion, Zinn, Macpeak & Seas, PLLC

(57) ABSTRACT

The present invention provides a process for the production of a semiconductor device comprising a semiconductor element provided on a printed circuit board with a plurality of connecting electrode portions provided interposed therebetween, the gap between said printed circuit board and said semiconductor element being sealed with an underfill resin layer. In accordance with the present invention, (1) the underfill resin layer is formed by melting a lamellar solid resin provided interposed between said printed circuit board and said semiconductor element, and (2) the lamellar solid resin provided interposed between said printed circuit board and said semiconductor element is heated for a predetermined period of time until the temperature of the solid resin layer reaches a predetermined range where the two components are connected to each other under pressure under the following conditions (X) and (Y): (X) Supposing that the initial residual heat of reaction of the solid resin before heating is 100% as determined by a differential scanning calorimeter (DSC), the residual heat of reaction thereof is not more than 70% of the initial residual heat of reaction; and (Y) The temperature of the semiconductor element is predetermined higher than that of the printed circuit board, and the difference in temperature between them is not less than 50° C. In this manner, a production process which facilitates the resin sealing of the gap between the semiconductor element and the board and thus can inhibit warpage of the entire semiconductor device and a semiconductor device having an excellent reliability can be provided. In the present invention, the use of a sheet-like underfill material which gives an underfill resin layer having an elastic modulus in tension at 25° C. of from 300 to 15,000 MPa when hardened can provide a semiconductor device which exerts an excellent effect of relaxing the stress on the semiconductor element, printed circuit board and connecting electrode portions and thus exhibits a high reliability.

14 Claims, 11 Drawing Sheets

U.S. PATENT DOCUMENTS

| | | | |
|---|---|---|---|
| 5,659,203 | * | 8/1997 | Call et al. ............................. 257/778 |
| 5,930,597 | * | 7/1999 | Call et al. ............................. 438/106 |
| 6,060,150 | * | 5/2000 | Nakatani et al. .................... 428/209 |
| 6,127,460 | * | 10/2000 | Kazuto ................................ 523/443 |

FOREIGN PATENT DOCUMENTS

| | | | |
|---|---|---|---|
| 5-63031 | 3/1993 | (JP) | ............................... H01L/21/60 |
| 8-134330 | 5/1996 | (JP) | ............................... C08L/63/00 |
| 9-162235 | 6/1997 | (JP) | ............................... H01L/21/60 |

* cited by examiner

PROCESS FOR THE PRODUCTION OF SEMICONDUCTOR DEVICE

TECHNICAL FIELD

The present invention relates to a process for the production of a semiconductor device which comprises mounting a semiconductor element on a mother board or daughter board in a face-down arrangement.

BACKGROUND OF THE INVENTION

As a demand accompanying the recent improvement of the properties of semiconductor devices there has been noted a process which comprises mounting a semiconductor element on a mother board or daughter board having a wiring circuit provided thereon in a face-down arrangement (e.g., flip-chip process, direct chip attach process). This is attributed to the fact that processes which have heretofore been used, such as a process which comprises bringing a semiconductor element into electrical contact with a lead frame with a gold wire to give a packaged form which is then mounted on a mother board or daughter board, are liable to delay in data transmission through wiring, error in data transmission due to crosstalk.

On the other hand, the foregoing flip-chip process and direct chip attach process are disadvantageous in that a semiconductor element and a mother or daughter board which have different linear expansion coefficient are brought into direct electrical connection with each other, reducing the reliability of the connection. As a countermeasure against this difficulty there has been taken an action which comprises injecting into the gap between the semiconductor element and the foregoing board a liquid resin material which is then hardened to form a hardened resin in which the stress concentrated at the electrical connection can be dispersed, enhancing the reliability of the connection. However, the foregoing liquid resin material needs to be stored at ultra low temperatures (−40° C.) as well as needs to be injected into the gap between the foregoing semiconductor element and board through a syringe. Thus, this action is disadvantageous in that the injection position and the amount of the resin to be injected can hardly be controlled. Further, since this action requires that the resin used normally stay liquid, it is difficult to use a solid resin material having a high reliability such as phenolic resin.

The present invention has been worked out under these circumstances. An object of the present invention is to provide a process for the production of a semiconductor device which can easily form an underfill resin layer in the gap between the foregoing semiconductor and board and facilitates the resin underfilling.

DISCLOSURE OF THE INVENTION

In order to accomplish the foregoing object of the present invention, the first aspect of the process for the production of a semiconductor device according to the present application comprises mounting a semiconductor element on a printed circuit board with a plurality of connecting electrode portions provided interposed therebetween, and then sealing the gap between the foregoing printed circuit board and semiconductor element with an underfill resin layer, characterized in that said underfill resin layer is formed by melting a lamellar solid resin provided interposed between the foregoing printed circuit board and semiconductor element.

In other words, the present invention comprises sealing with an underfill resin layer the gap between a printed circuit board and a semiconductor element which have been connected to each other with a plurality of connecting electrode portions provided interposed therebetween to produce a semiconductor device, characterized in that said sealing resin layer is formed by melting and hardening a lamellar solid resin provided interposed between the foregoing printed circuit board and semiconductor element. Thus, the connection between the foregoing printed circuit board and semiconductor element is completed while melting the foregoing lamellar solid resin, preferably under pressure. Accordingly, as compared with the conventional complicated process which comprises connecting a printed circuit board to a semiconductor element, and then injecting a sealing resin into the gap therebetween to complete the connection, the connection between the foregoing printed circuit board and semiconductor element and the sealing the gap therebetween with a resin can be effected at a time, drastically simplifying the production process. Further, since a solid resin having excellent storage properties is used as a sealing resin instead of liquid resin, the production process is not liable to the foregoing various problems caused by the injection of the liquid resin into the gap.

Further, the inventors found during their study of the invention the fact that the use of an epoxy resin composition comprising an inorganic filler having a maximum grain diameter of not more than 100 $\mu$m in a predetermined proportion as the foregoing solid resin makes it possible to fairly effect the packing of the gap between the foregoing circuit board and semiconductor element without forming any voids.

The underfill resin layer formed by melting the foregoing solid resin can be easily formed by, e.g., a process which comprises placing an underfill resin sheet (a kind of lamellar solid resin) on the foregoing printed circuit board, placing a semiconductor element on the underfill resin sheet, heating and melting the underfill resin sheet so that the underfill resin thus molten is packed into the gap between the printed circuit board and the semiconductor element, and then hardening the underfill resin.

In some detail, the underfill resin layer formed by melting the foregoing solid resin can be easily formed by a process which comprises forming an underfill resin layer in such an arrangement that the connecting electrode portions provided on the surface of the foregoing printed circuit board are each partly exposed, placing a semiconductor element on the foregoing printed circuit board in such an arrangement that the electrodes of the semiconductor element come in contact with the connecting electrode portions, heating and melting the foregoing underfill resin layer so that the underfill resin thus molten is packed into the gap between the printed circuit board and the semiconductor element, and then hardening the underfill resin. Alternatively, the underfill resin layer formed by melting the foregoing solid resin can be easily formed by a process which comprises forming an underfill resin layer in such an arrangement that the connecting electrode portions provided on the surface of the foregoing printed circuit board are each partly exposed, placing a semiconductor element on the foregoing printed circuit board in such an arrangement that the electrodes of the semiconductor element come in contact with the connecting electrode portions, heating and melting the foregoing underfill resin layer, preferably while the joint ball forming the electrode portions are being flattened under pressure or after they have been thus flattened, so that the underfill resin thus molten is packed into the gap between the printed circuit board and the semiconductor element, and then hardening the underfill resin.

In addition, the underfill resin layer formed by melting the foregoing solid resin can be easily formed by a process which comprises providing an underfill resin layer on one side of the foregoing semiconductor element, placing the semiconductor element on a printed circuit board having a plurality of connecting electrode portions provided thereon in such an arrangement that the underfill resin layer comes in contact with the connecting electrode portions, heating and melting the foregoing underfill resin layer so that the underfill resin thus molten is packed into the gap between the printed circuit board and the semiconductor element, and then hardening the underfill resin. Alternatively, the underfill resin layer formed by melting the foregoing solid resin can be easily formed by a process which comprises providing an underfill resin layer on one side of the foregoing printed circuit board, placing a semiconductor element having a plurality of connecting electrode portions provided thereon on the printed circuit board in such an arrangement that the connecting electrode portions thereof come in contact with the underfill resin layer, heating and melting the foregoing underfill resin layer so that the underfill resin thus molten is packed into the gap between the printed circuit board and the semiconductor element, and then hardening the underfill resin.

In particular, when the underfill resin sheet or underfill resin layer as a sealing material for sealing the gap between the printed circuit board and the semiconductor element is pressed until it exhibits at least one of the following physical properties (a) to (c) while being heated for a predetermined period of time so that the underfill resin thus molten is packed into the gap between the printed circuit board and the semiconductor element, a homogeneous good underfill resin layer can be formed without trapping fine voids by the packed portion:

(a) Resin viscosity is not less than 5,000 poise;
(b) Supposing that the initial gelling time of the underfill resin sheet or underfill resin layer before heating is 100%, the gelling time thereof is 30% of the initial gelling time; and
(c) Supposing that the initial residual heat of reaction of the underfill resin sheet or underfill resin layer before heating is 100% as determined by a differential scanning calorimeter (hereinafter referred to as "DSC"), the residual heat of reaction thereof is not more than 70% of the initial residual heat of reaction.

BRIEF DESCRIPTION OF THE DRAWINGS

FIGS. 19(a) to (d) are schematic diagrams illustrating a continuous process for the production of a semiconductor device as a second embodiment of the production process according to the present invention, wherein FIG. 19(a) illustrates a B stage step, FIG. 19(b) illustrates a positioning and contact-bonding step, FIG. 19(c) illustrates a sealing resin gelling step, and FIG. 19(d) illustrates a curing step;

DESCRIPTION OF REFERENCE NUMERALS

1 . . . Printed circuit board, 2 . . . Connecting electrode, 3 . . . Semiconductor element, 4 . . . Underfill resin layer, 10 . . . Underfill resin sheet, 13 . . . Underfill resin layer, 14, 15 . . . Underfill resin layer, 18 . . . Underfill resin sheet.

The embodiments of the present invention will be further described hereinafter.

Figure 1:
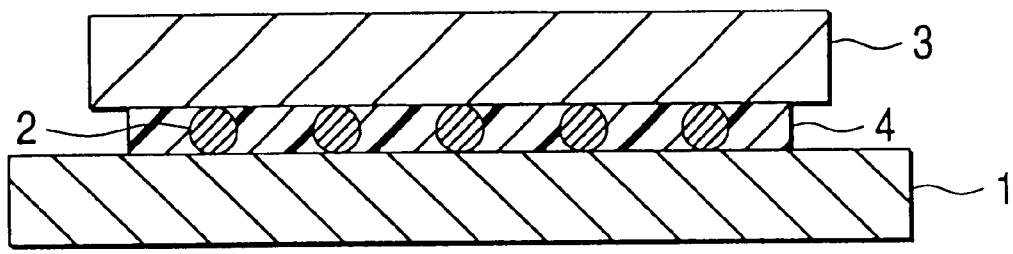
FIG. 1 is a sectional view illustrating an embodiment of the semiconductor device obtained by the process for the production of a semiconductor device according to the present invention.

The semiconductor device produced by the process for the production of a semiconductor device according to the present invention is configured such that a semiconductor element 3 is mounted on one side of a printed circuit board 1 with a plurality of connecting electrodes 2 provided interposed therebetween as shown in FIG. 1. Further, an underfill resin layer 4 is formed between the printed circuit board 1 and the semiconductor element 3.

In the present invention, the connecting electrode may be a known electrode alone but is a concept including an electrode and a conductor provided in the electrode such as joint ball. Thus, the connecting electrode portions of the printed circuit board and the connecting electrode portions of the semiconductor element may generally be connected to each other with an electrode alone provided interposed therebetween. In practice, however, at least one of the connecting electrode portions of the printed circuit board and the connecting electrode portions of the semiconductor element may be composed of an electrode and a joint ball, whereby the connecting electrode portions of the two sides are connected to each other.

Accordingly, in a normal embodiment, the plurality of connecting electrode portions 2 for electrically connecting the printed circuit board 1 to the semiconductor element 3 may have a joint ball or the like provided on the surface of either or both of the printed circuit board 1 and the semiconductor element 3. Both the two electrode portions may be made of an electrode alone.

The material constituting the plurality of connecting electrode portions (joint balls) 2 is not specifically limited. In practice, however, a gold stud bump, a low melting temperature solder bump, so-called eutectic solder bump, a high melting point solder bump, a gold-plated bump with a copper or nickel core, etc. may be used. The lamellar solid resin according to the present invention may be used also for the purpose of controlling the height of the connecting electrode portions 2 made of the foregoing eutectic solder or a solder material which deforms at a predetermined temperature.

The material constituting the foregoing printed circuit board 1 is not specifically limited. These materials can be roughly divided into two groups, i.e., ceramic board and plastic board. Examples of the foregoing plastic board include epoxy board, and bismaleimide triazine board. The lamellar solid resin according to the present invention, if its hardening temperature is predetermined low, may be preferably used without any restriction even in the case where the combination of a plastic board and a connecting electrode portion 2 made of a low melting solder makes it impossible to predetermine the connecting temperature to a high value.

In the present invention, as the material constituting the foregoing underfill resin layer 4 there may be used a lamellar solid resin. For example, a solid epoxy resin composition may be used.

The foregoing epoxy resin composition can be obtained from an epoxy resin (component a), a hardening agent (component b) and an inorganic filler (component c) as essential components and stays solid at an ordinary temperature. The term "ordinary temperature" as used herein is meant to indicate 20° C.

The foregoing epoxy resin (component a) is not specifically limited so far as it stays solid at an ordinary temperature. In practice, any known epoxy resin such as biphenyl type epoxy resin and cresol novolac type epoxy resin may be used. Further, a low viscosity epoxy resin which exhibits good wetting properties during melting is preferably used. In particular, from the standpoint of wetting properties, epoxy resins having the following structural formulae (1) to (3) are desirable. These epoxy resins may be used singly or in combination.

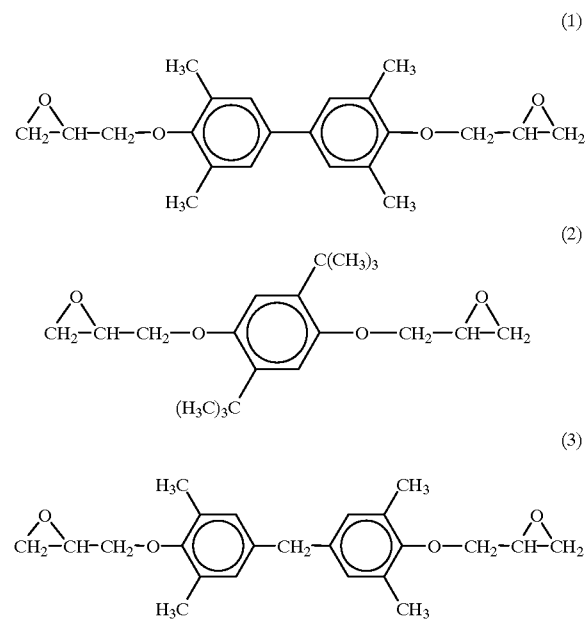

Among epoxy resins represented by the foregoing structural formulae (1) to (3), those having an epoxy equivalent of from 150 to 230 g/eq and a melting point of from 60° C. to 160° C. are desirable. For the purpose of enhancing the wetting properties of the resin component, the resin component preferably comprises a liquid epoxy resin in a certain amount.

The hardening agent (component b) to be used with the foregoing epoxy resin (component a) is not specifically limited. In practice, any hardening agent which has been commonly used, such as acid anhydride-based hardening agent, e.g., phenolic resin and methylhexahydrophthalic anhydride, may be used. In particular, phenolic resin is desirable. As the foregoing phenolic resin there may be used a phenol novolac or the like. A phenol novolac having a low viscosity is particularly desirable. In particular, those having a hydroxyl group equivalent of from 80 to 120 g/eq, preferably from 90 to 110 g/eq, particularly from 100 to 110 g/eq, and a softening point of not higher than 80° C., preferably from 50° C. to 70° C., particularly from 55 to 65° C., are desirable.

Referring to the mixing proportion of the foregoing epoxy resin (component a) and hardening agent (component b), if a phenolic resin is used as a hardening agent, the hydroxyl group equivalent in the phenolic resin with respect to one epoxy equivalent in the epoxy resin is preferably predetermined to a range of from 0.7 to 1.3, more preferably from 0.9 to 1.1.

As the inorganic filler (component c) to be used with the foregoing components a and b there may be used any inorganic filler which has heretofore been used, such as silica powder, calcium carbonate and titanium dioxide (titanium white). In particular, spherical silica powder or ground silica powder is desirable. Spherical silica powder is particularly desirable. The maximum grain diameter of the foregoing inorganic filler (component c) is preferably not more than 100 μm, particularly not more than 50 μm. This is because if the maximum grain diameter of the inorganic filler exceeds 100 μm, the packing of the gap between the printed circuit board and the semiconductor element (gap to be filled with an underfill resin layer) may be impossible. Further, the inorganic filler preferably has an average grain diameter of from 1 to 20 μm, particularly from 2 to 10 μm, while satisfying the foregoing requirement for maximum grain diameter. Accordingly, from the standpoint of the maximum grain diameter of the foregoing inorganic filler (component c) is preferably predetermined to not more than half, more preferably from $\frac{1}{10}$ to $\frac{1}{3}$ of the distance between the printed circuit board and the semiconductor element (gap to be filled with an underfill resin layer). This is because if the maximum grain diameter of the inorganic filler is predetermined to not more than half the distance between the printed circuit board and the semiconductor element, the packing of the molten underfill resin layer into the gap between the printed circuit board and the semiconductor element can be fairly effected without producing voids.

In general, the content of the foregoing inorganic filler (component c) is preferably predetermined to not more than 90% by weight, more preferably not more than 80% by weight, particularly not more than 70% by weight of the total weight of the epoxy resin composition. This is because if the content of the inorganic filler is far more than the above defined range, electrical connection between the electrode of the semiconductor element and the electrode of the printed circuit board cannot be fairly effected, causing defects.

The epoxy resin composition to be used in the present invention may comprise an agent for reducing stress such as silicone compound (side-chain ethylene glycol type dimethyl siloxane, etc.) and acrylonitrile-butadiene rubber, a flame retardant, a wax such as polyethylene and carnauba, a coupling agent such as silane coupling agent (e.g., γ-glycidoxypropyltrimethoxysilane) or the like incorporated therein as necessary in a proper amount besides the components a to c.

As the foregoing flame retardant there may be used a brominated epoxy resin or the like. A flame retarding aid such as diammonium trioxide may be used in combination with the flame retardant.

The foregoing epoxy resin composition to be used in the present invention can be obtained by, e.g., the following method. In some detail, the components a and b as the resin components are melted in admixture preferably under heating. The resin components thus molten are then mixed with the foregoing component c and optionally other additives. Thereafter, to the mixture is added a catalyst for controlling the reactivity thereof to give a uniform system. The uniform system is withdrawn by a pallet, cooled, and then subjected to press-rolling or the like to form a sheet. Thus, the desired epoxy resin composition can be obtained. In general, the epoxy resin composition thus obtained is mixed with a thixotropic agent so that the hot fluidity during hot curing can be suppressed. As such a thixotropic agent there may be used an acrylonitrile-butadiene copolymer.

The catalyst to be blended for the purpose of controlling the reactivity is not specifically limited. In practice, compounds which have heretofore been used as hardening accelerator may be used. Examples of such a hardening agent include triphenyl phosphine, tetraphenyl phosphate, tetraphenyl borate and 2-methylimidazole.

The method for mixing the foregoing various components and producing a sheet therefrom are not limited to the foregoing methods. For example, the mixing of the foregoing various components may be carried out by means of a twin roll, triple roll or the like. The production of a sheet can be accomplished by rolling the resin composition or by applying the resin composition mixed with a solvent to a base film, and then allowing the solvent to evaporate away. The supply of the foregoing epoxy resin composition in the form of tape makes it possible to produce semiconductor devices on a reel-to-reel mass production basis.

In the present invention, the thickness of the sheet, i.e., underfill resin sheet is normally from 5 to 200 μm, preferably from 10 to 120 μm.

As previously mentioned, the process for the production of a semiconductor device according to the present invention comprises mounting a semiconductor element on a printed circuit board with a plurality of connecting electrode portions provided interposed therebetween, and then sealing the gap between the printed circuit board and the semiconductor element with an underfill resin layer, characterized in that said underfill resin layer is formed by melting a lamellar solid resin provided interposed between the printed circuit board and the semiconductor element. The foregoing process for the production of a semiconductor device can be roughly divided into three embodiments.

(1) Firstly, the first embodiment of the process for the production of a semiconductor device according to the present invention will be described in sequence in connection with the attached drawings. In this production process (first embodiment), as the foregoing lamellar solid resin there may be used a sheet-like resin, i.e., underfill resin sheet.

Figure 2:
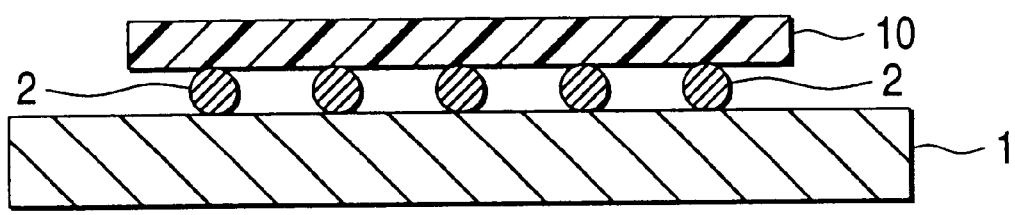
FIG. 2 is a sectional view illustrating a first embodiment of the process for the production of a semiconductor device according to the present invention.
Figure 3:
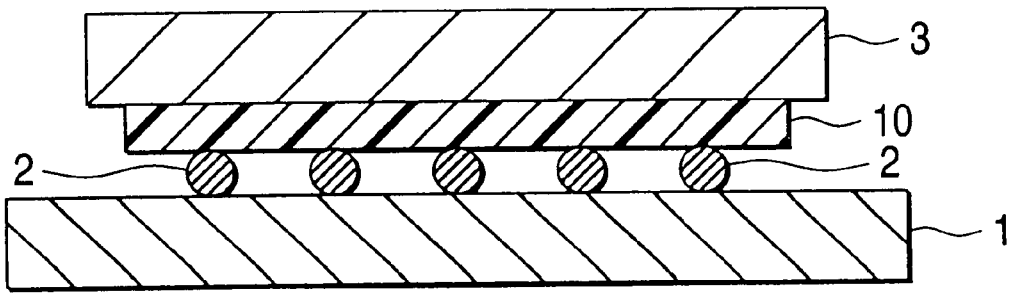
FIG. 3, too, is a sectional view illustrating a first embodiment of the process for the production of a semiconductor device according to the present invention.

As shown in FIG. 2, a solid underfill resin sheet 10 is placed on a printed circuit board 1 having a plurality of spherical connecting electrode portions (joint balls) 2 provided thereon with the connecting electrode portions 2 provided interposed therebetween. Subsequently, as shown in FIG. 3, a semiconductor element 3 is placed on the underfill resin sheet 10 in a predetermined position. The semiconductor element 3 is then tentatively bonded to the underfill resin sheet 10 optionally by making the use of tack. The underfill resin sheet 10 is then heated and melted under pressure so that it is packed into the gap between the semiconductor element 3 and the printed circuit board 1. The underfill resin sheet thus molten is then hardened to seal the gap. Thus, an underfill resin layer 4 is formed. In order to tackify the underfill resin sheet, a rubber component such as acrylonitrile-butadiene copolymer is incorporated in the epoxy resin composition used. In this manner, a semiconductor device shown in FIG. 1 is produced. In accordance with the foregoing pressing procedure, the joint balls 2 are pressed so that they are normally flattened (reduced in height) to further secure the connection between the electrodes.

Figure 4:
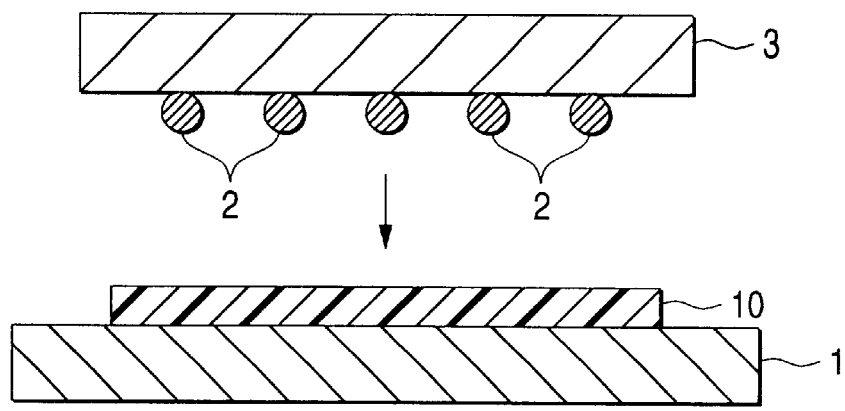
FIG. 4, too, is a sectional view illustrating a first embodiment of the process for the production of a semiconductor device according to the present invention.
Figure 5:
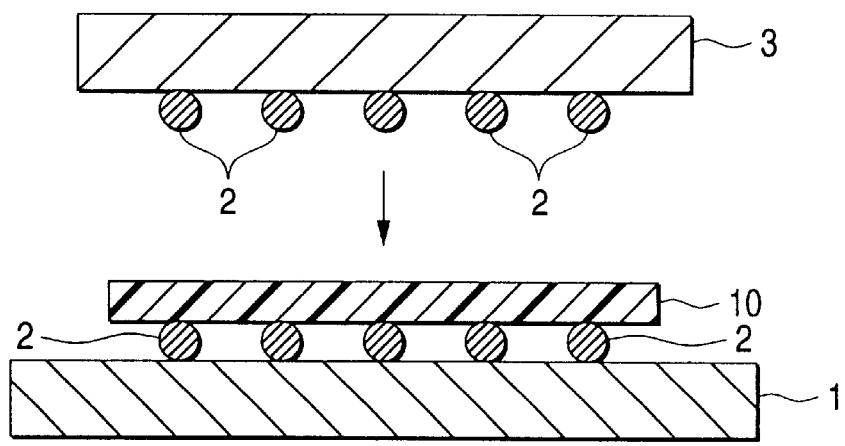
FIG. 5, too, is a sectional view illustrating a first embodiment of the process for the production of a semiconductor device according to the present invention.

The foregoing process for the production of a semiconductor device has been described with reference to the use of the printed circuit board 1 having a plurality of spherical connecting electrode portions (joint balls) 2 provided thereon. However, the present invention is not limited to such a configuration. For example, a semiconductor element 3 having the plurality of spherical connecting electrode portions (joint balls) 2 provided on one side (connection side) thereof may be used. In this case (case where a semiconductor element 3 having the plurality of spherical connecting electrode portions 2 provided on the surface thereof is used), a solid underfill resin sheet 10 is placed on the surface of a printed circuit board 1 as shown in FIG. 4. Subsequently, a semiconductor element 3 having connecting electrode portions 2 provided thereon is placed on the underfill resin sheet 10 in such an arrangement that the printed circuit board 1 and the connecting electrode portion side of the semiconductor element 3 are opposed to each other. In the case where the connecting electrode portions 2 are provided on both the printed circuit board 1 and the semiconductor element 3, the underfill resin sheet 10 is provided interposed between the connecting electrode portions 2 of the two components as shown in FIG. 5. The subsequent procedure is the same as mentioned above.

As the foregoing underfill resin sheet 10 there may be preferably used a tackified sheet-like epoxy resin composition if the underfill resin sheet 10 is tentatively bonded to the semiconductor element 3 or printed circuit board 1. The size of the foregoing underfill resin sheet 10 is properly determined by the size (area) of the semiconductor element 3 to be mounted thereon. In general, the of the foregoing underfill resin sheet 10 is preferably predetermined slightly smaller than the size (area) of the semiconductor element 3. Similarly, the thickness and weight of the underfill resin sheet 10 can be properly predetermined by the size of the semiconductor element 3 to be mounted thereon and the size of the spherical connecting electrode portions provided on the printed circuit board 1, i.e., the volume occupied by the underfill resin layer 4 formed by packing the gap between the semiconductor element 3 and the printed circuit board 1.

In the foregoing process for the production of a semiconductor device, the heating temperature at which the foregoing sealing resin sheet 10 is melted is preferably predetermined to a range of from 70° C. to 300° C., particularly from 120° C. to 200° C., taking into account the deterioration of the semiconductor element 3 and the printed circuit board 1 and other factors. Heating can be accomplished by means of an infrared reflow furnace, hot air oven, heating plate, etc.

The packing of the underfill resin thus molten into the gap between the semiconductor element 3 and the printed circuit board 1 is preferably effected under pressure as mentioned above. The pressing conditions may be properly predetermined by the number of connecting electrode portions (joint balls) 2 and other factors. In some detail, the pressure is predetermined to a range of from 0.02 to 0.5 kg, preferably from 0.04 to 0.2 kg per connecting electrode portion.

In the foregoing first embodiment of the production process, it is particularly preferred that the step of placing the underfill resin sheet 10 on the printed circuit board 1 and then placing the semiconductor element 3 on the underfill resin sheet 10 or the step of placing the underfill resin sheet 10 on the semiconductor element 3 and then placing the printed circuit board 1 on the underfill resin sheet 10 be followed by the step of pressing the laminate until the foregoing underfill resin sheet 10 exhibits at least one of the following physical properties (a) to (c) while being heated for a predetermined period of time so that the molten underfill resin is packed into the gap between the printed circuit board 1and the semiconductor element 3. In this manner, the laminate is pressed so that the underfill resin sheet 10 exhibits the following physical properties (at the end of pressing). Thus, a good homogeneous underfill resin layer can be formed without catching fine voids by the packed portion. In other words, if the printed circuit board 1 and the semiconductor element 3 are merely contact-bonded to each other under pressure, as in the case where the underfill resin sheet 10 exhibits a resin viscosity of less than 5,000 poise, a gelling time exceeding 30% of the initial gelling time and a residual heat of reaction exceeding 70% of the initial residual heat of reaction, it is likely that fine voids can be formed in the underfill resin packed in the gap, i.e., underfill resin layer portion.

(a) Resin viscosity is not less than 5,000 poise;
(b) Supposing that the initial gelling time of the underfill resin sheet or underfill resin layer before heating is 100%, the gelling time thereof is 30% of the initial gelling time; and
(c) Supposing that the initial residual heat of reaction of the underfill resin sheet or underfill resin layer before heating is 100% as determined by a differential scanning calorimeter (DSC), the residual heat of reaction thereof is not more than 70% of the initial residual heat of reaction.

Referring to the resin viscosity defined in the physical property (a), it is preferably not less than 5,000 poise, particularly not less than 10,000 poise, as mentioned above. The resin viscosity was determined at 175° C. by means of a flow tester available from Shimadzu Corp.

Referring to the physical property (b), the gelling time is preferably not less than 30%, particularly not less than 20% of the initial gelling time. The gelling time is measured, e.g., as follows. In some detail, the specimen to be measured is placed on a heating plate. The period between the point at which the specimen is melted (end of the initial gelling time) and the point at which a line drawn by a wire on the surface of the thin specimen film thus spread begins to extend and deform is determined as gelling time.

Referring to the physical property (c), the residual heat of reaction is preferably not more than 70%, particularly not more than 65% of the initial residual heat of reaction. For the measurement of residual heat of reaction, DSC is used as mentioned above. In some detail, the specimen is heated to a temperature of from 60° C. to 200° C. at a rate of 5° C./min. Under these conditions, the heat of reaction at a temperature of from 90° C. to 180° C. is measured.

(2) The second embodiment of the process for the production of a semiconductor device according to the present invention will be described in sequence in connection with the attached drawings. In this production process (second embodiment), as the foregoing lamellar solid resin there may be used an underfill resin layer directly formed on at least one of the surface of a printed circuit board and a semiconductor element both having connecting electrode portions provided thereon.

Figure 6:
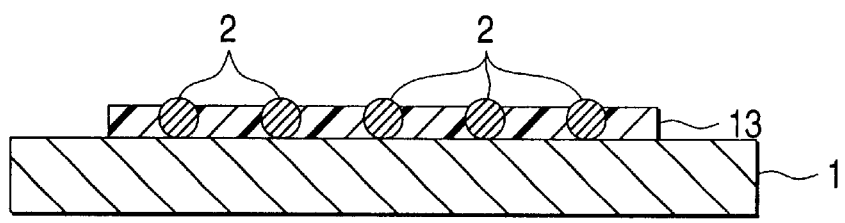
FIG. 6 is a sectional view illustrating a second embodiment of the process for the production of a semiconductor device according to the present invention.
Figure 7:
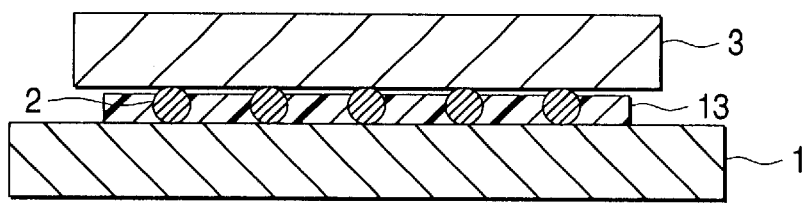
FIG. 7, too, is a sectional view illustrating a second embodiment of the process for the production of a semiconductor device according to the present invention.

As shown in FIG. 6, an underfill resin layer 13 is formed on the surface of a printed circuit board 1 having a plurality of spherical connecting electrode portions (joint balls) 2 provided thereon in such an arrangement that the top of the connecting electrode portions 2 are exposed. Subsequently, as shown in FIG. 7, a semiconductor element 3 is placed on the printed circuit board 1 in such an arrangement that the connecting electrode portions 2 the top of which have been exposed to the exterior of the underfill resin layer 13 is brought into contact with the electrode portions of the semiconductor element 3. Subsequently, the entire laminate is heated to melt the underfill resin layer 13. The laminate is pressed so that the molten underfill resin layer 13 is packed into the gap between the semiconductor element 3 and the printed circuit board 1. The underfill resin layer 13 is then hardened to seal the gap. Thus, an underfill resin layer 4 is formed. In this manner, the semiconductor device shown in FIG. 1 is produced.

The underfill resin layer 13 formed on the surface of the printed circuit board 1 having spherical connecting electrode portions 2 provided thereon such that the top of the connecting electrode portions 2 are exposed as shown in FIG. 6 can be produced, e.g., as follows. In some detail, as shown in FIG. 2, a solid underfill resin sheet 10 is placed on a printed circuit board 1 having a plurality of spherical connecting electrode portions 2 provided thereon (same as in the foregoing first embodiment of the process for the production of a semiconductor element). Subsequently, the foregoing underfill resin sheet 10 is heated and melted so that an underfill resin layer 13 is formed on the surface of the printed circuit board 1 having a plurality of spherical connecting electrode portions 2 provided thereon in such an arrangement that the top of the connecting electrode portions 2 are exposed as shown in FIG. 6.

Figure 8:
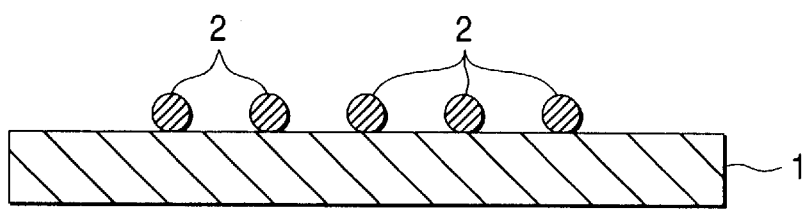
FIG. 8 is a sectional view illustrating the process for the production of a substrate on which a semiconductor element is placed, which is used in the second embodiment of the process for the production of a semiconductor device according to the present invention.

The sealing resin layer 13 may be produced by the following method besides the foregoing method. In some detail, as shown in FIG. 8, a printed circuit board 1 having connecting electrode portions 2 previously provided thereon is prepared. Subsequently, an epoxy resin composition is applied to the surface of the printed circuit board 1 having connecting electrode portions 2 provided thereon by a print coating method to form an underfill resin layer 13. In this manner, an underfill resin layer 13 is formed in such an arrangement that the top of the connecting electrode portions 2 are exposed as shown in FIG. 6.

Figure 9:
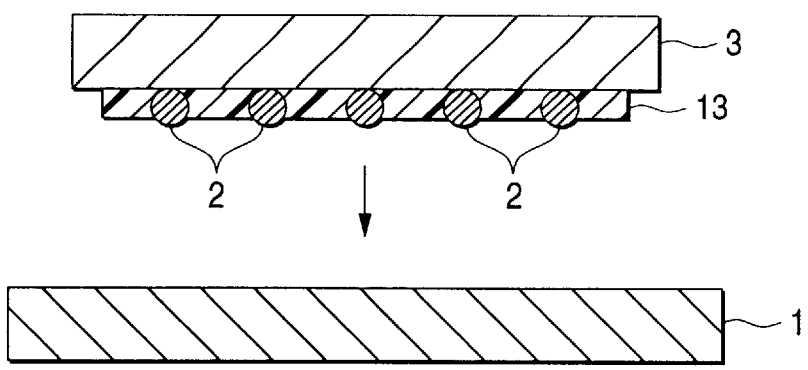
FIG. 9, too, is a sectional view illustrating a second embodiment of the process for the production of a semiconductor device according to the present invention.

The foregoing process for the production of a semiconductor device has been described with reference to the use of the printed circuit board 1 having a plurality of spherical connecting electrode portions (joint balls) 2 provided thereon. The present invention is not limited to this configuration. Similarly to the previously mentioned first embodiment, a semiconductor element 3 having the plurality of spherical connecting electrode portions (joint balls) 2 provided on one side (connection side) thereof may be used. In this case, as shown in FIG. 9, an underfill resin layer 13 is formed on the surface of a semiconductor element 3 having a plurality of spherical connecting electrode portions (joint balls) 2 provided thereon in such an arrangement that the top of the spherical connecting electrode portions 2 are exposed. Subsequently, the foregoing printed circuit board 1 is mounted on the semiconductor element 3 in such an arrangement that the connecting electrode portions 2 the top of which are exposed to the exterior of the underfill resin layer 13 is brought into contact with the electrode portions of the printed circuit board 1.

Figure 10:
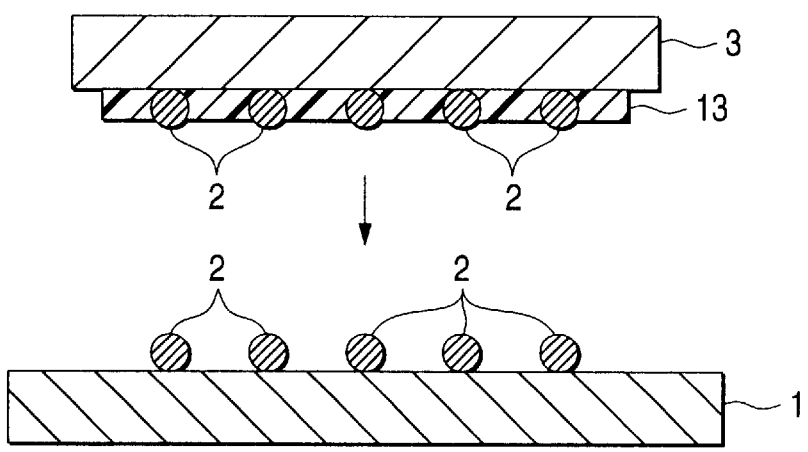
FIG. 10, too, is a sectional view illustrating a second embodiment of the process for the production of a semiconductor device according to the present invention.
Figure 11:
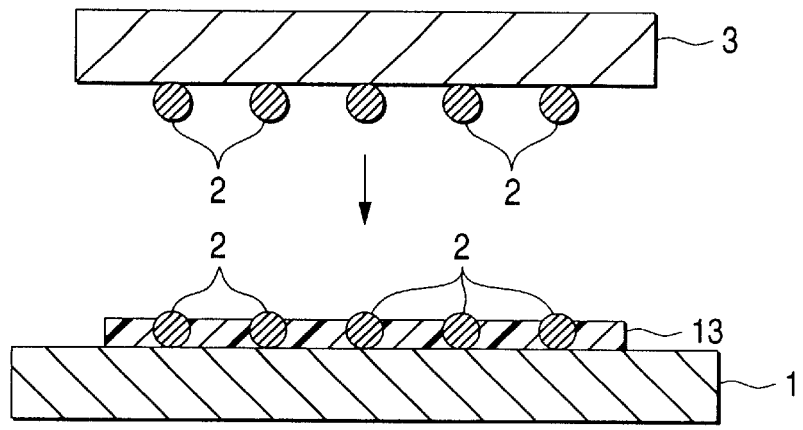
FIG. 11, too, is a sectional view illustrating a second embodiment of the process for the production of a semiconductor device according to the present invention.
Figure 12:
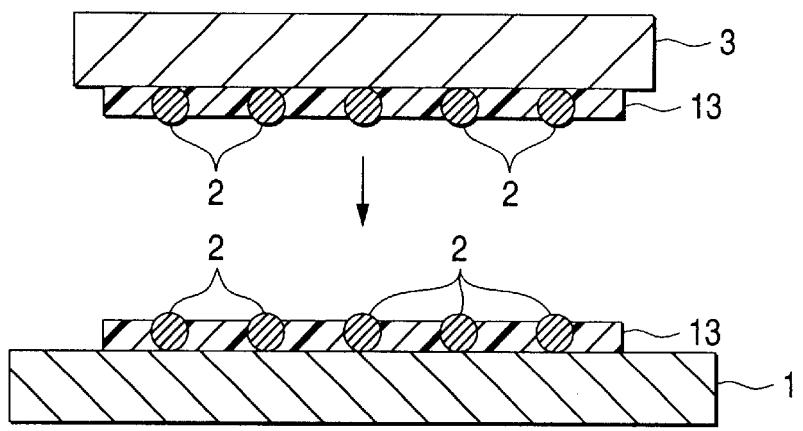
FIG. 12, too, is a sectional view illustrating a second embodiment of the process for the production of a semiconductor device according to the present invention.

If the connecting electrode portions 2 are provided on both the printed circuit board 1 and the semiconductor element 3, the underfill resin layer 13 is formed on at least one of the connecting electrode portion side of both the two components in such an arrangement that the top of the foregoing connecting electrode portions 2 are exposed. For example, as shown in FIG. 10, an underfill resin layer 13 is formed on the surface of a semiconductor element 3 having a plurality of spherical connecting electrode portions (joint balls) 2 provided thereon in such an arrangement that the top of the spherical connecting electrode portions 2 are exposed. Subsequently, the semiconductor element 3 having connecting electrode portions 2 the top of which are exposed to the exterior of the underfill resin layer 13 is mounted on a printed circuit board 1 having connecting electrode portions provided thereon. Alternatively, as shown in FIG. 11, an underfill resin layer 13 is formed on the surface of a printed circuit board 1 having a plurality of spherical connecting electrode portions 2 provided thereon in such an arrangement that the top of the spherical connecting electrode portions 2 are exposed. Subsequently, the semiconductor element 3 having connecting electrode portions 2 provided thereon is mounted on the printed circuit board 1 having connecting electrode portions 2 the top of which are exposed to the exterior of the underfill resin layer 13. Alternatively, as shown in FIG. 12, the underfill resin layer 13 is formed on the surface of the semiconductor element 3 having connecting electrode portions 2 the top of which are exposed to the exterior of the underfill resin layer 13 in such an arrangement that the top of the spherical connecting electrode portions 2 are exposed. On the other hand, an underfill resin layer 13 is formed on the surface of a printed circuit board 1 having a plurality of spherical connecting electrode portions 2 provided thereon in such an arrangement that the top of the spherical connecting electrode portions 2 are exposed. Subsequently, the semiconductor element 3 having connecting electrode portions 2 the top of which are exposed to the exterior of the underfill resin layer 13 is mounted on the printed circuit board 1 having connecting electrode portions 2 the top of which are exposed to the exterior of the underfill resin layer 13. The subsequent step is as mentioned above. The underfill resin layer may be hardened while the joint balls are being flattened preferably under pressure or after the joint balls have been thus flattened.

In FIGS. 10 to 12, the formation of the underfill resin layer 13 on the printed circuit board 1 having connecting electrode portions 2 provided thereon can be accomplished by a method similar to the process described above with reference to the printed circuit board 1 having connecting electrode portions 2provided thereon. Further, the formation of the underfill resin layer 13 on the semiconductor element 3 having connecting electrode portions 2 provided thereon can be accomplished by heating and melting an underfill resin sheet 10 or applying an underfill resin layer to the surface of the semiconductor element 3 having connecting electrode portions 2 provided thereon as in the foregoing process.

In the foregoing second embodiment, the underfill resin layer 13 thus formed is preferably provided with thixotropy or otherwise designed such that it is prevented from flowing out beyond the gap between the semiconductor element 3 and the printed circuit board 1 as mentioned above.

In the foregoing second embodiment of the production process, the temperature at which the underfill resin layer 13 is heated is preferably predetermined to a range of from 70° C. to 300° C., particularly from 120° C. to 200° C., taking into account the deterioration of the semiconductor element 3 and the printed circuit board and other factors, as in the first embodiment of the production process. Heating can be accomplished by means of an infrared reflow furnace, hot air oven, heating plate, etc. as mentioned above. The foregoing pressing conditions may be properly predetermined by the number of connecting electrode portions (joint balls) 2 as in the first embodiment. In some detail, the pressure is predetermined to a range of from 0.02 to 0.5 kg, preferably from 0.04 to 0.2 kg per connecting electrode portion.

In the foregoing second embodiment, as shown in FIGS. 10 to 12, further embodiments are possible in the configuration that where a underfill resin layer 13 is formed on at least one of the connecting electrode portion side of the printed circuit board 1 having connecting electrode portions 2 provided thereon and the semiconductor element 3 having connecting electrode portions 2 provided thereon in such an arrangement that the top of the connecting electrode portions 2 are exposed. In some detail, in addition to the underfill resin layer 13, an underfill resin sheet is provided interposed between the printed circuit board 1 and the semiconductor element 3.

Figure 13:
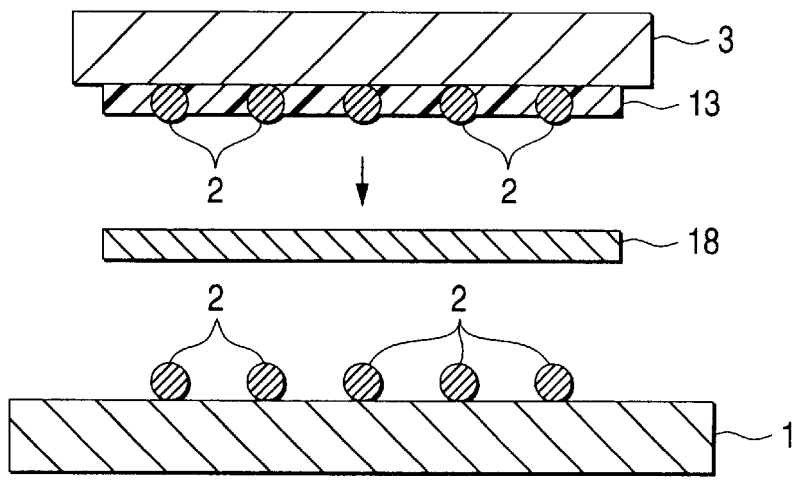
FIG. 13 is a sectional view illustrating another second embodiment of the process for the production of a semiconductor device according to the present invention.

In other words, in a further embodiment of the type shown in FIG. 10, an underfill resin layer 13 is formed on the surface of a semiconductor element 3 having a plurality of spherical connecting electrode portions 2 provided thereon in such an arrangement that the top of the spherical connecting electrode portions 2 are exposed as shown in FIG. 13. Subsequently, the semiconductor element 3 having connecting electrode portions 2 the top of which are exposed to the exterior of the underfill resin layer 13 is mounted on a printed circuit board 1 having connecting electrode portions provided thereon with an underfill resin sheet 18 provided interposed therebetween. The underfill resin layer 13 and the underfill resin sheet 18 are heated and melted, and then hardened.

Figure 14:
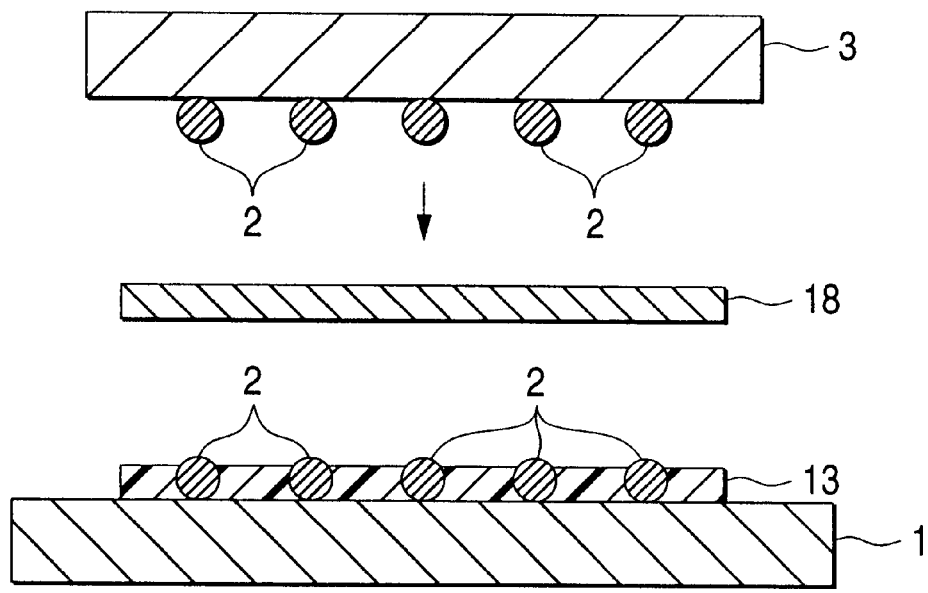
FIG. 14 is a sectional view illustrating a further second embodiment of the process for the production of a semiconductor device according to the present invention.

In a further embodiment of the type shown in FIG. 11, an underfill resin layer 13 is formed on the surface of a printed circuit board 1 having a plurality of spherical connecting electrode portions 2 provided thereon in such an arrangement that the top of the spherical connecting electrode portions 2 are exposed as shown in FIG. 14. Subsequently, a semiconductor element 3 having connecting electrode portions 2 is mounted on the printed circuit board 1 having connecting electrode portions 2 the top of which are exposed to the exterior of the underfill resin layer 13 with an underfill resin sheet 18 provided interposed therebetween. The underfill resin layer 13 and the underfill resin sheet 18 are heated and melted, and then hardened, preferably under pressure.

Figure 15:
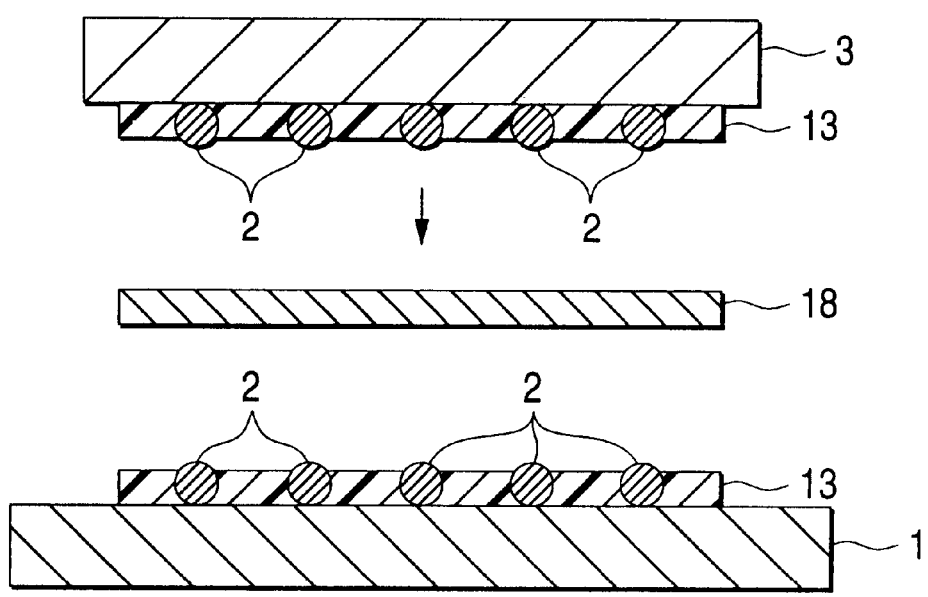
FIG. 15 is a sectional view illustrating a still further second embodiment of the process for the production of a semiconductor device according to the present invention.

In a further embodiment of the type shown in FIG. 12, an underfill resin layer 13 is formed on the surface of a semiconductor element 3 having a plurality of spherical connecting electrode portions 2 provided thereon in such an arrangement that the top of the spherical connecting electrode portions 2 are exposed as shown in FIG. 15. On the other hand, an underfill resin layer 13 is formed on the surface of a printed circuit board 1 having a plurality of spherical connecting electrode portions 2 provided thereon in such an arrangement that the spherical connecting electrode portions 2 are exposed. Subsequently, the semiconductor element 3 having connecting electrode portions 2 the top of which are exposed to the exterior of the underfill resin layer 13 is mounted on the printed circuit board 1 having connecting electrode portions 2 the top of which are exposed to the exterior of the underfill resin layer 13 with an underfill resin sheet 18 provided interposed therebetween. The subsequent step is the same as described above.

In a further embodiment shown in FIGS. 13 to 15, the temperature at which the underfill resin layer 13 and the underfill resin sheet 18 are heated is predetermined to a range of from 70° C. to 300° C., preferably from 120° C. to 200° C., taking into account the deterioration of the semiconductor element 3 and the printed circuit board 1 and other factors, as mentioned above. Heating can be effected in the same manner as mentioned above. Further, the pressing conditions may be properly predetermined by the number of connecting electrode portions 2 and other factors as in the foregoing embodiments. In some detail, the pressure is predetermined to a range of from 0.02 to 0.5 kg, preferably from 0.04 to 0.2 kg per connecting electrode portion.

In the foregoing second embodiment of the production process, it is particularly preferred that the step of placing the semiconductor element 3 on the printed circuit board 1 in such an arrangement that the connecting electrode portions 2 of the semiconductor element 3 are brought into contact with the connecting electrode portions (joint balls) 2 provided on the surface of the printed circuit board 1 or the step of placing the printed circuit board 1 on the semiconductor element 3 in such an arrangement that the connecting electrode portions 2 of the printed circuit board 1 are brought into contact with the connecting electrode portions (joint balls) 2 provided on the surface of the semiconductor element 3 be followed by the step of pressing the laminate until the foregoing underfill resin sheet 13 exhibits at least one of the following physical properties (a) to (c) while being heated for a predetermined period of time so that the molten underfill resin is packed into the gap between the printed circuit board 1 and the semiconductor element 3. In this manner, the underfill resin layer 13 exhibits the following physical properties for the same reason as mentioned with reference to the first embodiment.

Thus, a good homogeneous underfill resin layer can be formed without trapping fine voids by the packed portion.

(a) Resin viscosity is not less than 5,000 poise;
(b) Supposing that the initial gelling time of the underfill resin sheet or underfill resin layer before heating is 100%, the gelling time thereof is 30% of the initial gelling time; and
(c) Supposing that the initial residual heat of reaction of the underfill resin sheet or underfill resin layer before heating is 100% as determined by a differential scanning calorimeter (DSC), the residual heat of reaction thereof is not more than 70% of the initial residual heat of reaction.

A particularly preferred range of the resin viscosity (a), a particularly preferred range of the gelling time (b) and a particularly preferred range of the residual heat of reaction (c) are the same as those described with reference to the first embodiment. The methods for the measurement of the resin viscosity, gelling time and residual heat of reaction are the same as used in the first embodiment.

(3) The third embodiment of the process for the production of a semiconductor device according to the present invention will be described in connection with the attached drawings. In this production process (third embodiment), the lamellar solid resin there is not used alone but may be used in the form of underfill resin layer provided on the surface of a semiconductor element or printed circuit board on which no joint balls are provided at the connecting electrode portions.

Figure 16:
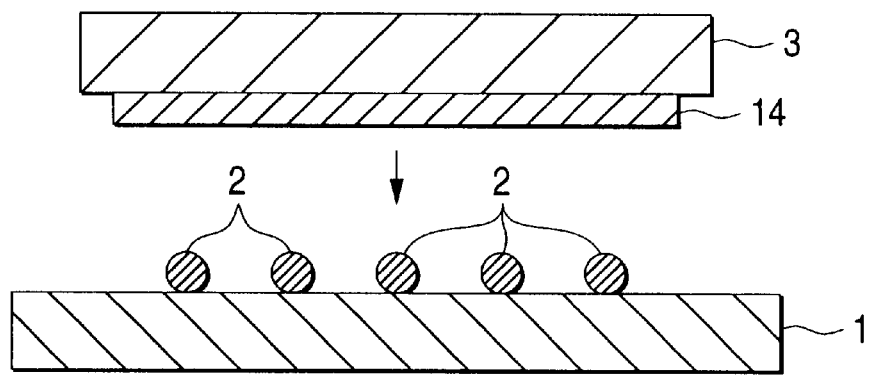
FIG. 16 is a sectional view illustrating a third embodiment of the process for the production of a semiconductor device according to the present invention.

The third embodiment will be described with reference to the use of an underfill resin layer laminated with the surface of a semiconductor element. In some detail, as shown in FIG. 16, an underfill resin layer 14 formed on one side of a semiconductor element 3 is prepared. Subsequently, the semiconductor element 3 is placed on a printed circuit board 1 having a plurality of spherical connecting electrode portions (joint balls) 2 provided thereon in a predetermined position in such an arrangement that the underfill resin layer 14 laminated with the semiconductor element 3 is brought into contact with the connecting electrode portions 2. Thereafter, the underfill resin layer 14 is heated and melted. The molten resin is packed into the gap between the semiconductor element 3 and the printed circuit board 1 while the joint balls 2 are being flattened, preferably under pressure. The resin is then hardened to seal the gap. Thus, an underfill resin layer is formed. In this manner, the semiconductor device shown in FIG. 1 is produced.

Figure 17:
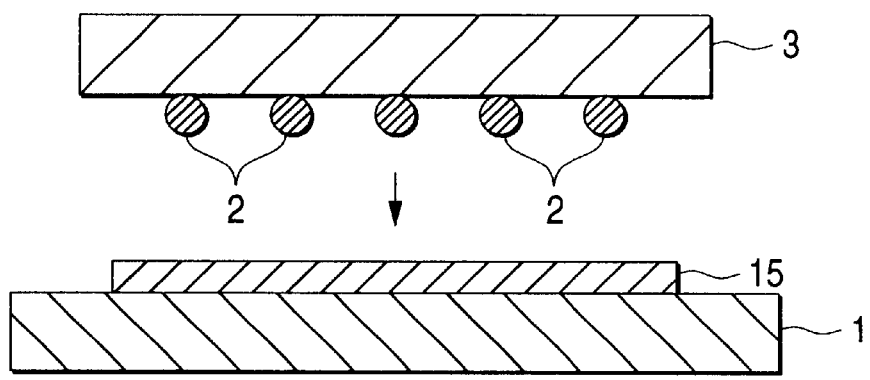
FIG. 17, too, is a sectional view illustrating a third embodiment of the process for the production of a semiconductor device according to the present invention.

On the other hand, another example of the third embodiment of the production process will be described with reference to the use of an underfill resin layer laminated on the surface of a printed circuit board. In some detail, as shown in FIG. 17, an underfill resin layer 15 formed on one side of a printed circuit board 1 is prepared. Subsequently, a semiconductor element 3 having a plurality of spherical connecting electrode portions (joint balls) 2 provided thereon is placed on the underfill resin layer 15 formed on the surface of the printed circuit board 1 in such an arrangement that the connecting electrode portions 2 are brought into contact with the underfill resin layer 15. Thereafter, the underfill resin layer 15 is heated and melted, preferably under pressure, so that the molten resin is packed into the gap between the semiconductor element 3 and the printed circuit board 1. The resin is then hardened to seal the gap. Thus, an underfill resin layer is formed. In this manner, a semiconductor device shown in FIG. 1 is produced.

The formation of the underfill resin layers 14, 15 in FIGS. 16 and 17 can be accomplished by, e.g., applying an underfill resin layer-forming material for sticking the underfill resin sheet to the surface of the semiconductor element 3 or the printed circuit board 1.

The size of the underfill resin layers 14, 15 is properly predetermined by the size (area) of the semiconductor element 3 as in the first embodiment. In general, the size of the underfill resin layers 14, 15 is preferably predetermined slightly smaller than the size (area) of the semiconductor element 3. Similarly, the thickness and weight of the underfill resin layers 14, 15 can be properly predetermined by the size of the semiconductor element 3 and the size of the connecting electrode portions 2, i.e., the volume occupied by the underfill resin layer 4 formed by packing the gap between the semiconductor element 3 and the printed circuit board 1.

In the third embodiment of the production process, the temperature at which the underfill resin layers 14, 15 are heated is predetermined to a range of from 70° C. to 300° C., preferably from 120° C. to 200° C., taking into account the deterioration of the semiconductor element 3 and the printed circuit board 1 and other factors, as in the first and second embodiments. Heating can be accomplished by means of an infrared reflow furnace, hot air oven, heating plate, etc. The packing of the underfill resin thus molten into the gap between the semiconductor element 3 and the printed circuit board 1 is preferably effected under pressure as mentioned above. The pressing conditions may be properly predetermined by the number of connecting electrode portions (joint balls) 2 and other factors. In some detail, the pressure is predetermined to a range of from 0.02 to 0.5 kg, preferably from 0.04 to 0.2 kg per connecting electrode portion.

In the foregoing third embodiment of the production process, it is particularly preferred that the step of bringing the underfill resin layer 14 provided on one side of the semiconductor element 3 into contact with the connecting electrode portions of the printed circuit board 1 or the step of bringing the underfill resin layer 15 provided on one side of the printed circuit board 1 into contact with the connecting electrode portions of the semiconductor element 3 be followed by the step of pressing the laminate until the foregoing underfill resin layers 14, 15 exhibit at least one of the following physical properties (a) to (c) while being heated for a predetermined period of time so that the molten underfill resin is packed into the gap between the printed circuit board 1 and the semiconductor element 3. In this manner, the underfill resin layer 13 exhibits the following physical properties. Thus, a good homogeneous underfill resin layer can be formed without trapping fine voids by the packed portion.

(a) Resin viscosity is not less than 5,000 poise;

(b) Supposing that the initial gelling time of the underfill resin sheet or underfill resin layer before heating is 100%, the gelling time thereof is 30% of the initial gelling time; and (c) Supposing that the initial residual heat of reaction of the underfill resin sheet or underfill resin layer before heating is 100% as determined by a differential scanning calorimeter (DSC), the residual heat of reaction thereof is not more than 70% of the initial residual heat of reaction.

A particularly preferred range of the resin viscosity (a), a particularly preferred range of the gelling time (b) and a particularly preferred range of the residual heat of reaction (c) are the same as those described with reference to the first embodiment. The methods for the measurement of the resin viscosity, gelling time and residual heat of reaction are the same as used in the first embodiment.

Figure 18:
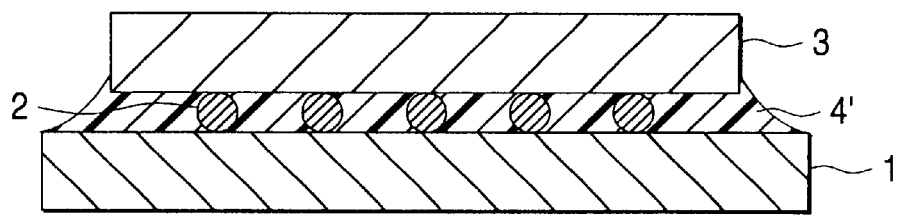
FIG. 18 is a sectional view illustrating another embodiment of the semiconductor device obtained by the process for the production of a semiconductor device according to the present invention.

An example the semiconductor device produced according to the first to third embodiments of the production process is a semiconductor device of the type in which the underfill resin layer 4 thus formed doesn't protrude from the periphery of the semiconductor element 3 on which it has been mounted as shown in FIG. 1. However, another example may be of the type in which the underfill resin layer 4' protrudes from the periphery of the semiconductor element 3 on which it has been mounted as shown in FIG. 18 depending on the purpose of semiconductor device.

In the semiconductor device thus produced, the size of the semiconductor element 3 is normally predetermined to a width of from 2 to 20 mm, a length of from 2 to 30 mm and a thickness of from 0.1 to 2.0 mm, preferably from 0.2 to 1.0 mm. The size of the printed circuit board 1 having a wiring circuit formed thereon, on which the semiconductor element 3 is mounted, is normally predetermined to a width of from 5 to 120 mm, preferably from 10 to 70 mm, a length of from 5 to 120 mm, preferably from 10 to 70 mm, and a thickness of from 0.05 to 3.0 mm. The gap between the semiconductor element 3 and the printed circuit board 1 into which the underfill resin thus molten is packed is normally from 5 to 200 $\mu$m, preferably from 5 to 100 $\mu$m.

Referring to the properties of the underfill resin layer 4 formed by sealing the gap with the underfill resin, i.e., properties of the underfill resin, the melt viscosity of the resin at various temperatures is preferably from 1 to 1,000 poise. The gelling time of the resin at 150° C. is preferably from 0.5 to 30 minutes. The linear expansion coefficient of the hardened resin is preferably from 7 to 50 ppm. More preferably, the melt viscosity of the resin is from 1 to 500 poise, the gelling time of the resin at 150° C. is from 1.0 to 15 minutes, and the linear expansion coefficient of the hardened resin is from 12 to 40 ppm. In other words, if the melt viscosity of the resin is predetermined to the above defined range, the resulting resin exhibits good packing properties. Further, if the gelling time of the resin is predetermined to the above defined range, the resulting resin can exhibit a good formability. In particular, the resin can be hardened in a reduced period of time. Moreover, if the linear expansion coefficient of the resin is predetermined to the above defined range, the hardened resin and the semiconductor element can be prevented from undergoing defects due to stress such as crack. The melt viscosity was measured by a flow tester viscometer. The gelling time was measured on a heating plate. The linear expansion coefficient was measured by thermal mechanical analysis (TMA).

As mentioned above, the process for the production of a semiconductor device according to the present invention comprises sealing the gap between a printed circuit board and a semiconductor element connected to each other with a plurality of connecting electrode portions provided interposed therebetween with an underfill resin layer, characterized in that the underfill resin layer is formed by melting a lamellar solid resin provided interposed between the printed circuit board and the semiconductor element. Thus, the resin thus molten is packed into the gap between the printed circuit board and the semiconductor element to connect the two components. Accordingly, as compared with the conventional complicated process, the connection between the printed circuit board and the semiconductor element and the sealing the gap therebetween with a resin can be effected at a time, drastically simplifying the production process. Further, since a solid resin having excellent storage properties is used as an underfill resin instead of liquid resin, the production process is not liable to the foregoing various problems caused by the injection of the liquid resin into the gap.

Further, the use of, as the solid resin, an epoxy resin composition comprising an inorganic filler having a maximum grain diameter predetermined to not more than 100 μm incorporated therein in a predetermined proportion makes it possible to fairly pack into the gap between the printed circuit board and the semiconductor element without producing any voids.

The underfill resin layer formed by melting the solid resin can be formed by a process which comprises mounting an underfill resin sheet on the printed circuit board, placing a semiconductor element on the underfill resin sheet, heating and melting the underfill resin sheet so that the resin thus molten is packed into the gap between the printed circuit board and the semiconductor element, and then hardening the resin. Thus, the use of an underfill resin sheet as the lamellar solid resin makes it possible to drastically enhance the efficiency of production of semiconductor device.

The underfill resin layer formed by melting the solid resin can be formed by a process which comprises forming an underfill resin layer on the printed circuit board in such an arrangement that the connecting electrode portions are each partly exposed, placing a semiconductor element on the semiconductor element mounting substrate in such an arrangement that the electrode portions of the semiconductor element come in contact with the connecting electrodes, heating and melting the underfill resin layer so that the underfill resin thus molten is packed into the gap between the printed circuit board and the semiconductor element, and then hardening the resin. Alternatively, the underfill resin layer formed by melting the solid resin can be formed by a process which comprises forming an underfill resin layer on a semiconductor element in such an arrangement that the connecting electrode portions provided on the surface of the semiconductor element are each partly exposed, placing the semiconductor element on the printed circuit board in such an arrangement that the electrode portions of the printed circuit board come in contact with the connecting electrodes, heating and melting the underfill resin layer so that the underfill resin thus molten is packed into the gap between the printed circuit board and the semiconductor element, and then hardening the resin. Thus, the use of an underfill resin layer as the lamellar solid resin makes it possible to drastically enhance the efficiency of production of semiconductor device.

The underfill resin layer formed such that the connecting electrodes are each partly exposed can be easily formed by a process which comprises placing an underfill resin sheet on a printed circuit board or a semiconductor element having connecting electrode portions provided thereon with the connecting electrode portions provided interposed therebetween, and then heating and melting the underfill resin sheet or by a process which comprises applying an underfill resin layer-forming material to the surface of a printed circuit board or a semiconductor element having connecting electrode portions provided thereon.

The underfill resin layer formed by melting the solid resin can be easily formed by a process which comprises preparing an underfill resin layer provided on one side of the semiconductor element, placing the semiconductor element on a printed circuit board having a plurality of connecting electrode portions provided thereon in such an arrangement that the underfill resin layer comes in contact with the connecting electrode portions, heating and melting the underfill resin layer so that the underfill resin thus molten is packed into the gap between the printed circuit board and the semiconductor element, and then hardening the resin. Alternatively, the underfill resin layer formed by melting the solid resin can be easily formed by a process which comprises preparing an underfill resin layer provided on one side of the printed circuit board, placing a semiconductor element having a plurality of connecting electrode portions provided thereon on the printed circuit board in such an arrangement that the connecting electrode portions of the semiconductor element come in contact with the underfill resin layer, heating and melting the underfill resin layer so that the underfill resin thus molten is packed into the gap between the printed circuit board and the semiconductor element, and then hardening the resin.

In particular, in the various production processes, if the underfill resin sheet and the underfill resin layer, which are underfill materials for sealing the gap between the printed circuit board and the semiconductor element, are pressed until they exhibit at least one of the following physical properties (a) to (c) while being heated for a predetermined period of time so that the underfill resin thus molten is packed into the gap between the printed circuit board and the semiconductor element, a good homogeneous seal resin layer can be formed without catching any fine voids by the packed portion, making it possible to obtain a semiconductor device excellent in the reliability (conductivity, etc.) of the joint of the semiconductor element with the substrate.

(a) Resin viscosity is not less than 5,000 poise;

(b) Supposing that the initial gelling time of the underfill resin sheet or underfill resin layer before heating is 100%, the gelling time thereof is 30% of the initial gelling time; and (c) Supposing that the initial residual heat of reaction of the underfill resin sheet or underfill resin layer before heating is 100% as determined by a differential scanning calorimeter (DSC), the residual heat of reaction thereof is not more than 70% of the initial residual heat of reaction.

The prior art underfill process using a liquid resin comprises bringing the electrode of the semiconductor element and the electrode (mostly solder electrode) of the printed circuit board into contact with each other, melting the solder by a heating furnace, allowing the solder to cool to ordinary temperature, and then injecting a liquid resin into the gap between the printed circuit board and the semiconductor element. If a flexible board such as film is used as the printed circuit board, the gap between the printed circuit board and the semiconductor element becomes smaller at the central portion of the board than at the periphery of the board due to thermal shrinkage during the course between withdrawal from the heating furnace and cooling to ordinary temperature, occasionally causing the gap to be insufficiently filled with the liquid resin thus injected. Thus, if such a flexible board is used as a printed circuit board, it has been a common practice to attach a stiffener such as metal plate to the board.

However, the present invention makes it possible to secure sealing with a predetermined thickness of underfill resin layer without attaching any such a stiffener.

As mentioned above, the process for the production of a semiconductor device using an underfill resin sheet according to the present invention has many advantages as compared with the prior art production process.

However, the semiconductor device thus obtained may warp due to the thermal shrinkage coefficient of the semiconductor element and, the board depending on the conditions of production of semiconductor device.

In general, warpage occurs with the semiconductor chip side as outer surface.

The inventors made further studies to solve the problem of warpage. As a result, solution was obtained. Thus, the second aspect of the present invention will be described hereinafter.

The second aspect of the present invention has been worked out under these circumstances. Thus, another object of the present invention is to provide a process for the production of a semiconductor device which can inhibit the occurrence of warpage in the entire device during the formation of an underfill resin layer in the gap between the semiconductor element and the board, making it easy to produce a semiconductor device having an excellent reliability.

The foregoing object of the present invention can be accomplished by a process for the production of a semiconductor device which comprises mounting a semiconductor element on a printed circuit board with a plurality of connecting electrode portions provided interposed therebetween, and then sealing the gap between the printed circuit board and the semiconductor element with an underfill resin layer, characterized in that a lamellar solid resin provided interposed between the printed circuit board and the semiconductor element is heated for a predetermined period of time until the temperature of the solid resin layer reaches a predetermined range where the printed circuit board and the semiconductor element are connected to each other under pressure under the following conditions (X) and (Y) so that the solid resin is melted to form the underfill resin layer.

(X) Supposing that the initial residual heat of reaction of the solid resin before heating is 100% as determined by a differential scanning calorimeter (DSC), the residual heat of reaction thereof is not more than 70% of the initial residual heat of reaction; and (Y) The temperature of the semiconductor element is predetermined higher than that of the printed circuit board, and the difference in temperature between them is not less than 50° C.

In other words, the process for the production of a semiconductor device according to the present invention comprises mounting a semiconductor element on a printed circuit board with a plurality of connecting electrode portions provided interposed therebetween, and then sealing the gap between the printed circuit board and the semiconductor element with an underfill resin layer, characterized in that a lamellar solid resin provided interposed between the printed circuit board and the semiconductor element is heated for a predetermined period of time until the temperature of the solid resin layer reaches a predetermined range where the printed circuit board and the semiconductor element are connected to each other under pressure under the following conditions (X) and (Y) so that the solid resin is melted to form the underfill resin layer. Thus, the satisfaction of the foregoing specific conditions (X) and (Y) during the connection of the printed circuit board and the semiconductor element under pressure makes it possible to suppress the degree of warpage of semiconductor device due to the difference in thermal shrinkage coefficient between the printed circuit board and the semiconductor element, reducing the stress applied to the semiconductor element. As a result, a semiconductor device excellent in reliability can be obtained.

It was also found that the use of, as solid resin, an epoxy resin composition comprising an inorganic filler having a maximum grain diameter predetermined to not more than 100 $\mu$m incorporated therein in a predetermined proportion makes it possible to fairly fill the gap between the printed circuit board and the semiconductor element without producing any voids.

The seal resin layer formed by melting the solid resin can be easily formed by, e.g., a process which comprises placing an underfill resin sheet on the printed circuit board, placing a semiconductor element on the underfill resin sheet, connecting the printed circuit board and the semiconductor element to each other under pressure under the foregoing conditions (X) and (Y) while being heated for a predetermined period of time so that the underfill resin thus molten is packed into the gap between the printed circuit board and the semiconductor element, and then hardening the underfill resin.

Further, the underfill resin layer formed by melting the solid resin can be easily formed by a process which comprises forming an underfill resin layer on a printed circuit board having connecting electrode portions provided thereon in such an arrangement that the connecting electrode portions are each partly exposed, placing a semiconductor element on the printed circuit board in such an arrangement that the electrode portions of the semiconductor element come in contact with the connecting electrode portions, connecting the printed circuit board and the semiconductor element to each other under pressure under the foregoing conditions (X) and (Y) while being heated for a predetermined period of time so that the underfill resin thus molten is packed into the gap between the printed circuit board and the semiconductor element, and then hardening the underfill resin. Alternatively, the underfill resin layer formed by melting the solid resin can be easily formed by a process which comprises forming an underfill resin layer on a semiconductor element having connecting electrode portions provided thereon in such an arrangement that the connecting electrode portions are each partly exposed, placing the semiconductor element on a printed circuit board in such an arrangement that the electrode portions of the printed circuit board come in contact with the connecting electrode portions, connecting the printed circuit board and the semiconductor element to each other under pressure under the foregoing conditions (X) and (Y) while being heated for a predetermined period of time so that the underfill resin thus molten is packed into the gap between the printed circuit board and the semiconductor element, and then hardening the underfill resin.

In addition, the underfill resin layer formed by melting the solid resin can be easily formed by a process which comprises preparing an underfill resin layer provided on one side of the semiconductor element, placing the semiconductor element on a printed circuit board having connecting electrode portions provided thereon in such an arrangement that the underfill resin layer comes in contact with the connecting electrode portions, connecting the printed circuit board and the semiconductor element to each other under pressure under the foregoing conditions (X) and (Y) while being heated for a predetermined period of time so that the underfill resin thus molten is packed into the gap between the printed circuit board and the semiconductor element, and then hardening the underfill resin. Alternatively, the underfill resin layer formed by melting the solid resin can be easily formed by a process which comprises preparing an underfill resin layer provided on one side of the printed circuit board, placing a semiconductor element having connecting electrode portions provided thereon on the printed circuit board in such an arrangement that the underfill resin layer comes in contact with the connecting electrode portions of the semiconductor element, connecting the printed circuit board and the semiconductor element to each other under pressure under the foregoing conditions (X) and (Y) while being heated for a predetermined period of time so that the underfill resin thus molten is packed into the gap between the printed circuit board and the semiconductor element, and then hardening the underfill resin.

Embodiments of the second embodiment of the present application will be further described hereinafter.

The semiconductor device produced according to the process for the production of a semiconductor device according to the present invention is shown in FIG. 1.

In the present invention, the material constituting the joint ball, wiring and board, the kind of the lamellar solid resin, the epoxy resin which can be preferably used, the epoxy equivalent, the epoxy resin hardener, the mixing proportion of epoxy resin and hardener, the inorganic filler to be used, the maximum grain diameter and content thereof, the method for the production of underfill resin sheet, the kind of catalyst to be used, etc. are quite the same as mentioned above with reference to the first aspect of the present invention.

As mentioned above, the process for the production of a semiconductor device according to the present invention comprises mounting a semiconductor element on a printed circuit board with a plurality of connecting electrode portions provided interposed therebetween, and then sealing the gap between the printed circuit board and the semiconductor element with an underfill resin layer, characterized in that a lamellar solid resin provided interposed between the printed circuit board and the semiconductor element is heated for a predetermined period of time until the temperature of the solid resin layer reaches a predetermined range where the printed circuit board and the semiconductor element are connected to each other under pressure under the following conditions (X) and (Y) so that the solid resin is melted to form the underfill resin layer. The foregoing process for the production of a semiconductor device can be roughly divided into three embodiments. The foregoing pressing is preferably effected to an extent such that the joint balls can be flattened as in the first embodiment of the present invention.

(X) Supposing that the initial residual heat of reaction of the solid resin before heating is 100% as determined by a differential scanning calorimeter (DSC), the residual heat of reaction thereof is not more than 70% of the initial residual heat of reaction; and (Y) The temperature of the semiconductor element is predetermined higher than that of the printed circuit board, and the difference in temperature between them is not less than 50° C.

(1) The first embodiment of the process for the production of a semiconductor device according to the present invention will be described in sequence in connection with the attached drawings. In this production process (first embodiment), as the foregoing lamellar solid resin there may be used a sheet-like resin, i.e., underfill resin sheet.

As shown in FIG. 2, a solid underfill resin sheet 10 is placed on a printed circuit board 1 having a plurality of spherical connecting electrode portions (joint balls) 2 provided thereon with the connecting electrode portions 2 provided interposed therebetween. Subsequently, as shown in FIG. 3, a semiconductor element 3 is placed on the underfill resin sheet 10 in a predetermined position. The semiconductor element 3 is then tentatively bonded to the underfill resin sheet 10. The laminate is then pressed until the underfill resin sheet 10 satisfies the foregoing condition (X) while being heated for a predetermined period of time. At the same time, the two components are connected to each other under pressure under the foregoing condition (Y). In this manner, the underfill resin thus molten is packed into the gap between the semiconductor element 3 and the printed circuit board 1. The underfill resin is then hardened to seal the gap. Thus, an underfill resin layer 4 is formed. In this manner, a semiconductor device shown in FIG. 1 is produced.

The foregoing process for the production of a semiconductor device has been described with reference to the use of the printed circuit board 1 having a plurality of spherical connecting electrode portions (joint balls) 2 provided thereon. However, the present invention is not limited to such a configuration. For example, a semiconductor element 3 having the plurality of spherical connecting electrode portions (joint balls) 2 provided on one side (connection side) thereof may be used. In this case (case where a semiconductor element 3 having the plurality of spherical connecting electrode portions 2 provided on the surface thereof is used), a solid underfill resin sheet 10 is placed on the surface of a printed circuit board 1 as shown in FIG. 4. Subsequently, a semiconductor element 3 having connecting electrode portions 2 provided thereon is placed on the underfill resin sheet 10 in such an arrangement that the printed circuit board 1 and the connecting electrode portion side of the semiconductor element 3 are opposed to each other. In the case where the connecting electrode portions 2 are provided on both the printed circuit board 1 and the semiconductor element 3, the underfill resin sheet 10 is provided interposed between the connecting electrode portions 2 of the two components as shown in FIG. 5. The subsequent procedure is the same as mentioned above.

As the foregoing underfill resin sheet 10 there may be preferably used a tackified sheet-like epoxy resin composition if the underfill resin sheet 10 is tentatively bonded to the semiconductor element 3 or printed circuit board 1. The size of the foregoing underfill resin sheet 10 is properly determined by the size (area) of the semiconductor element 3 to be mounted thereon. In general, the of the foregoing underfill resin sheet 10 is preferably predetermined slightly smaller than the size (area) of the semiconductor element 3. Similarly, the thickness and weight of the underfill resin sheet 10 can be properly predetermined by the size of the semiconductor element 3 to be mounted thereon and the size of the spherical connecting electrode portions provided on the printed circuit board 1, i.e., the volume occupied by the underfill resin layer 4 formed by packing the gap between the semiconductor element 3 and the printed circuit board 1.

In the foregoing process for the production of a semiconductor device, the temperature at which the foregoing underfill resin sheet 10 is heated for a predetermined period of time after the semiconductor element 3 has been placed thereon in a predetermined position is preferably predetermined to a range of from 70° C. to 300° C., particularly from 120° C. to 200° C., taking into account the deterioration of the semiconductor element 3 and the printed circuit board 1 and other factors. Heating can be accomplished by means of an infrared reflow furnace, hot air oven, heating plate, etc.

If the underfill resin sheet 10 is pressed until it satisfies the foregoing condition (X) while being heated for a predetermined period of time so that the underfill resin thus molten is packed into the gap between the semiconductor element 3 and the printed circuit board 1 to connect the two components to each other, the pressing conditions may be properly predetermined by the kind of the underfill resin sheet, the size of the semiconductor chip, the number of bumps, the final desired thickness, etc. In some detail, the pressure is predetermined to a range of from 10 to 40 kg/cm². The pressure can also vary with the number of bumps per unit area of the semiconductor chip. Therefore, the laminate is pressed under a pressure of 80 g per bump as a standard. In practice, however, the pressure is properly predetermined depending on the desired final thickness of the semiconductor device.

The first embodiment of the production process comprises placing an underfill resin sheet 10 on the printed circuit board 1, placing a semiconductor element 3 on the underfill resin sheet 10, or placing an underfill resin sheet 10 on the semiconductor element 3, placing the printed circuit board 1 on the underfill resin sheet 10, and then connecting the printed circuit board 1 and the semiconductor element 3 to each other under pressure under the foregoing conditions (X) and (Y) while being heated for a predetermined period of time. In this manner, when pressed, the underfill resin sheet 10 exhibits a specified residual heat of reaction [condition (X)] (at the end of pressing). Further, when the temperature of the semiconductor element is predetermined higher than that of the printed circuit board, and the difference in temperature between them is not less than 50° C. [condition (Y)], the resulting semiconductor device is liable to warpage. As a result, the stress applied to the semiconductor element 3 can be drastically reduced, making it possible to obtain a semiconductor device excellent in reliability. In other words, if the residual heat of reaction of the underfill resin sheet 10 exceeds 70% of the initial residual heat of reaction, and if the temperature of the printed circuit board 1 is the same as or higher than that of the semiconductor element 3, or, even if the temperature of the semiconductor element 3 is higher than that of the printed circuit board 1, the difference in temperature between the two components falls below 50° C., the resulting semiconductor device may warp due to the difference in thermal shrinkage between the printed circuit board 1 and the semiconductor element 3. As a result, the reliability of the semiconductor device may be reduced.

As mentioned above, the condition (X) requires that the residual heat of reaction reach not more than 70%, particularly not more than 65% of the initial residual heat of reaction. For the measurement of residual heat of reaction, DSC is used. In some detail, the specimen is heated to a temperature of from 60° C. to 200° C. at a rate of 5° C./min. Under these conditions, the heat of reaction at a temperature of from 90° C. to 180° C. is measured.

As mentioned above, the temperature of the semiconductor element 3 and the printed circuit board 1 under the foregoing condition (Y) can be measured by means of a thermocouple.

An example of continuous process for the production of a semiconductor device at a good production efficiency according to the first embodiment of the present invention will be described. In some detail, as shown in FIG. 19(a), a printed circuit board 1 having connecting electrode portions 2 provided thereon, on which an underfill resin sheet 10 has been placed, is passed through a drying furnace 40 so that the underfill resin sheet 10 is put in B stage state (half-cured state) (B stage step). Subsequently, as shown in FIG. 19(b), a semiconductor element 3 attached to the end of a heating contact-bonding tool 41 is positioned above the printed circuit board 1 in such an arrangement that the semiconductor element 3 is placed on the underfill resin sheet 10 which has been put in B stage state in a predetermined position. At the same time, the semiconductor element 3 is placed on and tentatively bonded to the underfill resin sheet 10 provided on the printed circuit board 1 in a predetermined position (positioning and contact-bonding step). Subsequently, as shown in FIG. 19(c), the heating tool 42 is allowed to come in contact with the surface of the semiconductor element 3 which has been tentatively bonded to the underfill resin sheet 10 so that the underfill resin sheet 10 is heated for a predetermined period of time. In this manner, the underfill resin sheet 10 is gelled (step of gelling underfill resin). This operation is predetermined such that the foregoing conditions (X) and (Y) are satisfied. In this manner, the underfill resin is packed into and gelled in the gap between the printed circuit board and the semiconductor element. After the packing of underfill resin, as shown in FIG. 19(d), the underfill resin which has been gelled by bringing the heating tool 43 into contact with the semiconductor element 3 is cured at a predetermined temperature. Subsequently, the printed circuit board 1 is cooled by a cooling plate 44 positioned below the printed circuit board 1 (curing step). In this manner, as shown in FIGS. 19(a) to (d), the various steps are assigned by operations and connected in series to make a continuous line, making it possible to seal the semiconductor device shown in FIG. 1 in a short period of time. In some detail, the semiconductor device production system comprising the foregoing continuous line makes it possible to complete sealing within 10 seconds per unit of semiconductor device.

(2) The second embodiment of the process for the production of a semiconductor device according to the present invention will be described in sequence in connection with the attached drawings. In this production process (second embodiment), as the foregoing lamellar solid resin there may be used an underfill resin layer directly formed on at least one of the surface of a printed circuit board and a semiconductor element both having connecting electrode portions provided thereon.

As shown in FIG. 6, an underfill resin layer 13 is formed on the surface of a printed circuit board 1 having a plurality of spherical connecting electrode portions (joint balls) 2 provided thereon in such an arrangement that the top of the connecting electrode portions 2 are exposed. Subsequently, as shown in FIG. 7, a semiconductor element 3 is placed on the printed circuit board 1 in such an arrangement that the connecting electrode portions 2 the top of which have been exposed to the exterior of the underfill resin layer 13 is brought into contact with the electrode portions of the semiconductor element 3. Subsequently, the entire laminate is pressed until the underfill resin layer 13 satisfies the foregoing condition (X) while being heated for a predetermined period of time. At the same time, the two components are connected to each other under pressure under the foregoing condition (Y) so that the molten underfill resin layer 13 is packed into the gap between the semiconductor element 3 and the printed circuit board 1. The underfill resin layer 13 is then hardened to seal the gap. Thus, an underfill resin layer 4 is formed. In this manner, the semiconductor device shown in FIG. 1 is produced.

The underfill resin layer 13 formed on the surface of the printed circuit board 1 having spherical connecting electrode portions 2 provided thereon such that the top of the connecting electrode portions 2 are exposed as shown in FIG. 6 can be produced, e.g., as follows. In some detail, as shown in FIG. 2, a solid underfill resin sheet 10 is placed on a printed circuit board 1 having a plurality of spherical connecting electrode portions 2 provided thereon (same as in the foregoing first embodiment of the process for the production of a semiconductor element). Subsequently, the foregoing underfill resin sheet 10 is heated and melted so that an underfill resin layer 13 is formed on the surface of the printed circuit board 1 having a plurality of spherical connecting electrode portions 2 provided thereon in such an arrangement that the top of the connecting electrode portions 2 are exposed as shown in FIG. 6.

The underfill resin layer 13 may be produced by the following method besides the foregoing method. In some detail, as shown in FIG. 8, a printed circuit board 1 having connecting electrode portions 2 previously provided thereon is prepared. Subsequently, an epoxy resin composition is applied to the surface of the printed circuit board 1 having connecting electrode portions 2 provided thereon by a print coating method to form an underfill resin layer 13. In this manner, an underfill resin layer 13 is formed in such an arrangement that the top of the connecting electrode portions 2 are exposed as shown in FIG. 6.

The foregoing process for the production of a semiconductor device has been described with reference to the use of the printed circuit board 1 having a plurality of spherical connecting electrode portions (joint balls) 2 provided thereon. The present invention is not limited to this configuration. Similarly to the previously mentioned first embodiment, a semiconductor element 3 having the plurality of spherical connecting electrode portions (joint balls) 2 provided on one side (connection side) thereof may be used. In this case, as shown in FIG. 9, an underfill resin layer 13 is formed on the surface of a semiconductor element 3 having a plurality of spherical connecting electrode portions (joint balls) 2 provided thereon in such an arrangement that the top of the spherical connecting electrode portions 2 are exposed. Subsequently, the semiconductor element 3 is mounted on the printed circuit board 1 in such an arrangement that the connecting electrode portions 2 the top of which are exposed to the exterior of the underfill resin layer 13 is brought into contact with the electrode portions of the printed circuit board 1.

If the connecting electrode portions 2 are provided on both the printed circuit board 1 and the semiconductor element 3, the underfill resin layer 13 is formed on at least one of the connecting electrode portion side of both the two components in such an arrangement that the top of the foregoing connecting electrode portions 2 are exposed. For example, as shown in FIG. 10, an underfill resin layer 13 is formed on the surface of a semiconductor element 3 having a plurality of spherical connecting electrode portions (joint balls) 2 provided thereon in such an arrangement that the top of the spherical connecting electrode portions 2 are exposed. Subsequently, the semiconductor element 3 having connecting electrode portions 2 the top of which are exposed to the exterior of the underfill resin layer 13 is mounted on a printed circuit board 1 having connecting electrode portions provided thereon. Alternatively, as shown in FIG. 11, an underfill resin layer 13 is formed on the surface of a printed circuit board 1 having a plurality of spherical connecting electrode portions 2 provided thereon in such an arrangement that the top of the spherical connecting electrode portions 2 are exposed. Subsequently, the semiconductor element 3 having connecting electrode portions 2 provided thereon is mounted on the printed circuit board 1 having connecting electrode portions 2 the top of which are exposed to the exterior of the underfill resin layer 13. Alternatively, as shown in FIG. 12, the underfill resin layer 13 is formed on the surface of the semiconductor element 3 having connecting electrode portions 2 the top of which are exposed to the exterior of the underfill resin layer 13 in such an arrangement that the top of the spherical connecting electrode portions 2 are exposed. On the other hand, an underfill resin layer 13 is formed on the surface of a printed circuit board 1 having a plurality of spherical connecting electrode portions 2 provided thereon in such an arrangement that the top of the spherical connecting electrode portions 2 are exposed. Subsequently, the semiconductor element 3 having connecting electrode portions 2 the top of which are exposed to the exterior of the underfill resin layer 13 is mounted on the printed circuit board 1 having connecting electrode portions 2 the top of which are exposed to the exterior of the underfill resin layer 13. The subsequent step is as mentioned above.

In FIGS. 10 to 12, the formation of the underfill resin layer 13 on the printed circuit board 1 having connecting electrode portions 2 provided thereon can be accomplished by a method similar to the process described above with reference to the printed circuit board 1 having connecting electrode portions 2 provided thereon. Further, the formation of the underfill resin layer 13 on the semiconductor element 3 having connecting electrode portions 2 provided thereon can be accomplished by heating and melting an underfill resin sheet 10 or applying an underfill resin layer to the surface of the semiconductor element 3 having connecting electrode portions 2 provided thereon as in the foregoing process.

In the foregoing second embodiment, the underfill resin layer 13 thus formed is preferably designed such that it is prevented from flowing out beyond the gap between the semiconductor element 3 and the printed circuit board 1 as mentioned above.

In the foregoing second embodiment of the production process, the temperature at which the underfill resin layer 13 is heated is preferably predetermined to a range of from 70° C. to 300° C., particularly from 120° C. to 200° C., taking into account the deterioration of the semiconductor element 3 and the printed circuit board and other factors, as in the first embodiment of the production process. Heating can be accomplished by means of an infrared reflow furnace, hot air oven, heating plate, etc. as mentioned above. If the underfill resin layer 13 is pressed until it satisfies the foregoing condition (X) while being heated for a predetermined period of time so that the underfill resin thus molten is packed into the gap between the semiconductor element 3 and the printed circuit board 1 to connect the two components to each other, the pressing conditions may be properly predetermined by the kind of the underfill resin sheet, the size of the semiconductor chip, the number of bumps, the final desired thickness, etc. as in the first embodiment of the present invention. In some detail, the pressure is predetermined to a range of from 10 to 40 kg/cm$^2$. The pressure can also vary with the number of bumps per unit area of the semiconductor chip. Therefore, the laminate is pressed under a pressure of 80 g per bump as a standard. In practice, however, the pressure is properly predetermined depending on the desired final thickness of the semiconductor device.

In the foregoing second embodiment, as shown in FIGS. 10 to 12, further embodiments are possible in the configuration that where an underfill resin layer 13 is formed on at least one of the connecting electrode portion side of the printed circuit board 1 having connecting electrode portions 2 provided thereon and the semiconductor element 3 having connecting electrode portions 2 provided thereon in such an arrangement that the top of the connecting electrode portions 2 are exposed. In some detail, in addition to the underfill resin layer 13, an underfill resin sheet is provided interposed between the printed circuit board 1 and the semiconductor element 3.

In other words, in a further embodiment of the type shown in FIG. 10, an underfill resin layer 13 is formed on the surface of a semiconductor element 3 having a plurality of spherical connecting electrode portions 2 provided thereon in such an arrangement that the top of the spherical connecting electrode portions 2 are exposed as shown in FIG. 13. Subsequently, the semiconductor element 3 having connecting electrode portions 2 the top of which are exposed to the exterior of the underfill resin layer 13 is mounted on a printed circuit board 1 having connecting electrode portions provided thereon with an underfill resin sheet 18 provided interposed therebetween.

In a further embodiment of the type shown in FIG. 11, an underfill resin layer 13 is formed on the surface of a printed circuit board 1 having a plurality of spherical connecting electrode portions 2 provided thereon in such an arrangement that the top of the spherical connecting electrode portions 2 are exposed as shown in FIG. 14. Subsequently, a semiconductor element 3 having connecting electrode portions 2 is mounted on the printed circuit board 1 having connecting electrode portions 2 the top of which are exposed to the exterior of the underfill resin layer 13 with an underfill resin sheet 18 provided interposed therebetween.

In a further embodiment of the type shown in FIG. 12, an underfill resin layer 13 is formed on the surface of a semiconductor element 3 having a plurality of spherical connecting electrode portions 2 provided thereon in such an arrangement that the top of the spherical connecting electrode portions 2 are exposed as shown in FIG. 15. On the other hand, an underfill resin layer 13 is formed on the surface of a printed circuit board 1 having a plurality of spherical connecting electrode portions 2 provided thereon in such an arrangement that the spherical connecting electrode portions 2 are exposed. Subsequently, the semiconductor element 3 having connecting electrode portions 2 the top of which are exposed to the exterior of the underfill resin layer 13 is mounted on the printed circuit board 1 having connecting electrode portions 2 the top of which are exposed to the exterior of the underfill resin layer 13 with an underfill resin sheet 18 provided interposed therebetween. The subsequent step is the same as described above.

In further embodiments of the production process shown in FIGS. 13 to 15, too, the heating temperature of the underfill resin layer 13 and the underfill resin sheet 18 are preferably predetermined to the same range as mentioned above, and the heating method may be the same as mentioned above. Further, if the underfill resin layer 13 and the underfill resin sheet 18 are pressed until they satisfy the foregoing condition (X) while being heated for a predetermined period of time so that the underfill resin thus molten is packed into the gap between the semiconductor element 3 and the printed circuit board 1 to connect the two components to each other, the pressing conditions may be predetermined as mentioned above.

The second embodiment of the production process comprises placing a semiconductor element 3 on the printed circuit board 1 in such an arrangement that the connecting electrode portions 2 of the semiconductor element 3 come in contact with the connecting electrode portions 2 provided on the surface of the printed circuit board 1 or placing the printed circuit board 1 on the semiconductor element 3 in such an arrangement that the connecting electrode portions 2 of the printed circuit board 1 come in contact with the connecting electrode portions 2 provided on the surface of the semiconductor element 3, and then pressing the laminate under the foregoing conditions (X) and (Y) while being heated for a predetermined period of time to connect the two components to each other. In this manner, when pressed, the underfill resin layer 13 exhibits a specified residual heat of reaction [condition (X)] (at the end of pressing). Further, when the temperature of the semiconductor element 3 is predetermined higher than that of the printed circuit board 1, and the difference in temperature between them is not less than 50° C. [condition (Y)], the resulting semiconductor device is liable to warpage. As a result, the stress applied to the semiconductor element 3 can be drastically reduced, making it possible to obtain a semiconductor device excellent in reliability. In other words, if the residual heat of reaction of the underfill resin layer 13 exceeds 70% of the initial residual heat of reaction, and if the temperature of the printed circuit board 1 is the same as or higher than that of the semiconductor element 3, or, even if the temperature of the semiconductor element 3 is higher than that of the printed circuit board 1, the difference in temperature between the two components falls below 50° C., the resulting semiconductor device may warp due to the difference in thermal shrinkage between the printed circuit board 1 and the semiconductor element 3. As a result, the reliability of the semiconductor device may be reduced.

As mentioned above, the residual heat of reaction under the condition (X) has the same particularly preferred range as mentioned with reference to the first embodiment of the production process. For the measurement of residual heat of reaction, the same method as used in the first embodiment of the present invention can be used.

For the measurement of the temperature of the semiconductor element 3 and the printed circuit board 1 under the foregoing condition (Y), the same method as used in the first embodiment of the present invention can be used. For example, the temperature of the various sites can be measured by means of a thermocouple.

An example of continuous process for the production of a semiconductor device at a good production efficiency according to the second embodiment of the present invention will be described. This process basically goes through the same production line as mentioned with reference to the first embodiment of the production process. In some detail, a printed circuit board 1 on which an underfill resin layer 13 has been formed in such an arrangement that the top of connecting electrode portions 2 are exposed is prepared (see FIG. 6). Subsequently, the printed circuit board 1 on which the underfill resin layer 13 has been formed is passed through a drying furnace so that the underfill resin layer 13 is put in B stage state (half-cured state) (B stage step). Subsequently, a semiconductor element 3 attached to the end of a heating contact-bonding tool is positioned above the printed circuit board 1 in such an arrangement that the semiconductor element 3 is placed on the underfill resin layer 13 which has been put in B stage state in a predetermined position. At the same time, the semiconductor element 3 is placed on and tentatively bonded to the underfill resin layer 13 provided on the printed circuit board in a predetermined position (positioning and contact-bonding step). Subsequently, the heating tool is allowed to come in contact with the surface of the semiconductor element which has been tentatively bonded to the underfill resin layer 13 so that the underfill resin layer 13 is heated for a predetermined period of time. In this manner, the underfill resin layer 13 is gelled (step of gelling underfill resin). This operation is predetermined such that the foregoing conditions (X) and (Y) are satisfied. In this manner, the underfill resin is packed into and gelled in the gap between the printed circuit board and the semiconductor element. After the packing of underfill resin, the underfill resin which has been gelled by bringing the heating tool into contact with the semiconductor element is cured at a predetermined temperature.

Subsequently, the printed circuit board 1 is cooled by a cooling plate positioned below the printed circuit board (curing step). In this manner, the various steps are assigned by operations and connected in series to make a continuous line, making it possible to seal the semiconductor device shown in FIG. 1 in a short period of time. In some detail, the semiconductor device production system comprising the foregoing continuous line makes it possible to complete underfill within 10 seconds per unit of semiconductor device.

(3) The third embodiment of the process for the production of a semiconductor device according to the present invention will be described in connection with the attached drawings. In this production process (third embodiment), the lamellar solid resin there is not used alone but may be used in the form of underfill resin layer provided on the surface of a semiconductor element or printed circuit board on which no connecting electrode portions are provided.

The third embodiment will be described with reference to the use of an underfill resin layer laminated with the surface of a semiconductor element. In some detail, as shown in FIG. 16, an underfill resin layer 14 formed on one side of a semiconductor element 3 is prepared. Subsequently, the semiconductor element 3 is placed on a printed circuit board 1 having a plurality of spherical connecting electrode portions (joint balls) 2 provided thereon in a predetermined position in such an arrangement that the underfill resin layer 14 laminated with the semiconductor element 3 is brought into contact with the connecting electrode portions 2. Subsequently, the entire laminate is pressed until the underfill resin layer 14 satisfies the foregoing condition (X) while being heated for a predetermined period of time. At the same time, the two components are connected to each other under pressure under the foregoing condition (Y) so that the molten underfill resin layer 14 is packed into the gap between the semiconductor element 3 and the printed circuit board 1. The underfill resin layer 14 is then hardened to seal the gap. Thus, an underfill resin layer is formed. In this manner, the semiconductor device shown in FIG. 1 is produced.

On the other hand, another example of the third embodiment of the production process will be described with reference to the use of an underfill resin layer laminated on the surface of a printed circuit board. In some detail, as shown in FIG. 17, an underfill resin layer 15 formed on one side of a printed circuit board 1 is prepared. Subsequently, a semiconductor element 3 having a plurality of spherical connecting electrode portions (joint balls) 2 provided thereon is placed on the underfill resin layer 15 formed on the surface of the printed circuit board 1 in such an arrangement that the connecting electrode portions 2 are brought into contact with the underfill resin layer 15. Subsequently, the entire laminate is pressed until the underfill resin layer 15 satisfies the foregoing condition (X) while being heated for a predetermined period of time. At the same time, the two components are connected to each other under pressure under the foregoing condition (Y) so that the molten underfill resin layer 15 is packed into the gap between the semiconductor element 3 and the printed circuit board 1. The underfill resin layer 15 is then hardened to seal the gap. Thus, an underfill resin layer is formed. In this manner, the semiconductor device shown in FIG. 1 is produced.

The formation of the underfill resin layers 14, 15 in FIGS. 16 and 17 can be accomplished by, e.g., applying a underfill resin layer-forming material for sticking the underfill resin sheet to the surface of the semiconductor element 3 or the printed circuit board 1 on the underfill resin layer side.

The size of the underfill resin layers 14, 15 is properly predetermined by the size (area) of the semiconductor element 3 as in the first embodiment. In general, the size of the underfill resin layers 14, 15 is preferably predetermined slightly smaller than the size (area) of the semiconductor element 3. Similarly, the thickness and weight of the underfill resin layers 14, 15 can be properly predetermined by the size of the semiconductor element 3 and the size of the connecting electrode portions 2, i.e., the volume occupied by the underfill resin layer 4 formed by packing the gap between the semiconductor element 3 and the printed circuit board 1.

In the foregoing third embodiment of the production process, the temperature at which the underfill resin layers 14, 15 are heated is preferably predetermined to a range of from 70° C. to 300° C., particularly from 120° C. to 200° C., taking into account the deterioration of the semiconductor element 3 and the printed circuit board 1 and other factors, as in the first and second embodiments of the production process. Heating can be accomplished by means of an infrared reflow furnace, hot air oven, heating plate, etc. as mentioned above. If the underfill resin layers 14, 15 are pressed until they satisfy the foregoing condition (X) while being heated for a predetermined period of time so that the underfill resin thus molten is packed into the gap between the semiconductor element 3 and the printed circuit board 1 to connect the two components to each other, the pressing conditions may be properly predetermined by the kind of the underfill resin layers 14, 15, the size of the semiconductor chip, the number of bumps, the final desired thickness, etc. as in the first and second embodiments of the present invention. In some detail, the pressure is predetermined to a range of from 10 to 40 kg/cm$^2$. The pressure can also vary with the number of bumps per unit area of the semiconductor chip. Therefore, the laminate is pressed under a pressure of 80 g per bump as a standard. In practice, however, the pressure is properly predetermined depending on the desired final thickness of the semiconductor device.

The third embodiment of the production process comprises bringing the underfill resin layer 14 provided on one side of the semiconductor element 3 into contact with the connecting electrode portions 2 of the printed circuit board 1, or bringing the underfill resin layer 15 provided on one side of the printed circuit board 1 into contact with the connecting electrode portions 2 of the semiconductor element 3, and then connecting the printed circuit board 1 and the semiconductor element 3 to each other under pressure under the foregoing conditions (X) and (Y) while being heated for a predetermined period of time. In this manner, when pressed, the underfill resin layers 14, 15 exhibit a specified residual heat of reaction [condition (X)] (at the end of pressing). Further, when the temperature of the semiconductor element 3 is predetermined higher than that of the printed circuit board 1, and the difference in temperature between them is not less than 50° C. [condition (Y)], the resulting semiconductor device is liable to warpage. As a result, the stress applied to the semiconductor element 3 can be drastically reduced, making it possible to obtain a semiconductor device excellent in reliability. In other words, if the residual heat of reaction of the underfill resin layers 14, 15 exceed 70% of the initial residual heat of reaction, and if the temperature of the printed circuit board 1 is the same as or higher than that of the semiconductor element 3, or, even if the temperature of the semiconductor element 3 is higher than that of the printed circuit board 1, the difference in temperature between the two components falls below 50° C., the resulting semiconductor device may warp due to the difference in thermal shrinkage between the printed circuit board 1 and the semiconductor element 3. As a result, the reliability of the semiconductor device may be reduced.

As mentioned above, the residual heat of reaction under the condition (X) has the same particularly preferred range as mentioned with reference to the first and second embodiments of the production process. For the measurement of residual heat of reaction, the same method as used in the first and second embodiments of the present invention can be used.

For the measurement of the temperature of the semiconductor element 3 and the printed circuit board 1 under the foregoing condition (Y), the same method as used in the first and second embodiments of the present invention can be used. For example, the temperature of the various sites can be measured by means of a thermocouple.

An example of continuous process for the production of a semiconductor device at a good production efficiency according to the third embodiment of the present invention will be described. This process basically goes through the same production line as mentioned with reference to the first and second embodiments of the production process. In some detail, a printed circuit board 1 on which an underfill resin layer 15 has been formed is prepared (see FIG. 17). Subsequently, the printed circuit board 1 on which the underfill resin layer 15 has been formed is passed through a drying furnace so that the underfill resin layer 15 is put in B stage state (half-cured state) (B stage step). Subsequently, a semiconductor element attached to the end of a heating contact-bonding tool is positioned above the printed circuit board 1 in such an arrangement that the semiconductor element is placed on the underfill resin layer 15 which has been put in B stage state in a predetermined position. At the same time, the semiconductor element is placed on and tentatively bonded to the underfill resin layer 15 provided on the printed circuit board in a predetermined position (positioning and contact-bonding step). Subsequently, the heating tool is allowed to come in contact with the surface of the semiconductor element which has been tentatively bonded to the underfill resin layer 15 so that the underfill resin layer 15 is heated for a predetermined period of time. In this manner, the underfill resin layer 15 is gelled (step of gelling underfill resin). This operation is predetermined such that the foregoing conditions (X) and (Y) are satisfied. In this manner, the underfill resin is packed into and gelled in the gap between the printed circuit board 1 and the semiconductor element. After the packing of underfill resin, the underfill resin which has been gelled by bringing the heating tool into contact with the semiconductor element is cured at a predetermined temperature. Subsequently, the printed circuit board 1 is cooled by a cooling plate positioned below the printed circuit board (curing step). In this manner, the various steps are assigned by operations and connected in series to make a continuous line, making it possible to seal the semiconductor device shown in FIG. 1 in a short period of time. In some detail, the semiconductor device production system comprising the foregoing continuous line makes it possible to complete sealing within 10 seconds per unit of semiconductor device.

An example the semiconductor device produced according to the first to third embodiments of the production process is a semiconductor device of the type in which the underfill resin layer 4 thus formed doesn't protrude from the periphery of the semiconductor element 3 on which it has been mounted as shown in FIG. 1. However, another example may be of the type in which the underfill resin layer 4' protrudes from the periphery of the semiconductor element 3 on which it has been mounted as shown in FIG. 18 depending on the purpose of semiconductor device.

In the semiconductor device thus produced, the size of the semiconductor element 3 is normally predetermined to a width of from 2 to 20 mm, a length of from 2 to 30 mm and a thickness of from 0.1 to 2.0 mm. The size of the printed circuit board 1 having a wiring circuit formed thereon, on which the semiconductor element 3 is mounted, is normally predetermined to a width of from 5 to 120 mm, preferably from 10 to 70 mm, a length of from 5 to 120 mm, preferably from 10 to 70 mm, and a thickness of from 0.05 to 3.0 mm. The gap between the semiconductor element 3 and the printed circuit board 1 into which the underfill resin thus molten is packed is normally from 5 to 200 $\mu$m, preferably from 5 to 100 $\mu$m.

Referring to the properties of the underfill resin layer 4 (or 4') formed by sealing the gap with the underfill resin, i.e., properties of the underfill resin, the melt viscosity of the resin at various temperatures is preferably from 1 to 1,000 poise. The gelling time of the resin at 150° C. is preferably from 0.5 to 30 minutes. The linear expansion coefficient of the hardened resin is preferably from 7 to 50 ppm. More preferably, the melt viscosity of the resin is from 1 to 500 poise, the gelling time of the resin at 150° C. is from 1.0 to 15 minutes, and the linear expansion coefficient of the hardened resin is from 12 to 40 ppm. In other words, if the melt viscosity of the resin is predetermined to the above defined range, the resulting resin exhibits good packing properties. Further, if the gelling time of the resin is predetermined to the above defined range, the resulting resin can exhibit a good formability. In particular, the resin can be hardened in a reduced period of time. Moreover, if the linear expansion coefficient of the resin is predetermined to the above defined range, the hardened resin and the semiconductor element can be prevented from undergoing defects due to stress such as crack. The melt viscosity was measured by a flow tester viscometer. The gelling time was measured on a heating plate. The linear expansion coefficient was measured by thermal mechanical analysis (TMA).

As made obvious in the foregoing description and Examples 35 to 57 described later, the second aspect of the process for the production of a semiconductor element according to the present application comprises sealing the gap between a printed circuit board and a semiconductor element with a plurality of connecting electrode portions provided interposed therebetween, characterized in that a lamellar solid resin provided interposed between the printed circuit board and the semiconductor element is heated for a predetermined period of time until the temperature of the solid resin layer reaches a predetermined range where the printed circuit board and the semiconductor element are connected to each other under pressure under the following conditions (X) and (Y) so that the solid resin is melted to form the underfill resin layer. Thus, when the gap between the printed circuit board and the semiconductor element is sealed with a resin, the printed circuit board and the semiconductor element are connected to each other under pressure under the foregoing specific conditions (X) and (Y). The resulting semiconductor device is liable to warpage due to the difference in thermal shrinkage coefficient between the printed circuit board and the semiconductor element. Thus, the stress applied to the semiconductor element can be reduced. As a result, a semiconductor device having a better reliability can be obtained.

On the contrary, the prior art sealing with a liquid resin generally comprises putting a semiconductor element and a printed circuit board in a drying furnace at the same time, and then injecting a liquid resin into the gap therebetween to seal the semiconductor device. Therefore, the prior art sealing cannot be subjected to the foregoing condition (Y) as defined in the second aspect of the present invention.

Accordingly, the degree of warpage of semiconductor device due to the difference in thermal shrinkage coefficient between the printed circuit board and the semiconductor element can be hardly suppressed.

Further, the use of, as the solid resin, an epoxy resin composition comprising an inorganic filler having a maximum grain diameter controlled to not more than 100 μm in a predetermined proportion makes it possible to fairly fill the gap between the printed circuit board and the semiconductor element without producing any voids.

The underfill resin layer formed by melting the solid resin can be formed by a process which comprises placing an underfill resin sheet on the printed circuit board, placing a semiconductor element on the underfill resin sheet, connecting the printed circuit board and the semiconductor element to each other under pressure under the foregoing specific conditions (X) and (Y) while being heated for a predetermined period of time so that the resin thus molten is packed into the gap between the printed circuit board and the semiconductor element, and then hardening the underfill resin. Thus, the use of an underfill resin sheet as the lamellar solid resin makes it possible to provide remarkable enhancement of the production efficiency of semiconductor device.

The underfill resin layer formed by melting the solid resin can be formed by a process which comprises preparing an underfill resin layer on the printed circuit board in such an arrangement that the connecting electrode portions are each partly exposed, placing a semiconductor element on the semiconductor element mounting substrate in such an arrangement that the electrode portions of the semiconductor element come in contact with the connecting electrode portions, connecting the printed circuit board and the semiconductor element to each other under pressure under the foregoing specific conditions (X) and (Y) while being heated for a predetermined period of time so that the underfill resin thus molten is packed into the gap between the printed circuit board and the semiconductor element, and then hardening the underfill resin. Alternatively, the underfill resin layer formed by melting the solid resin can be formed by a process which comprises forming an underfill resin layer on the semiconductor element in such an arrangement that the connecting electrode portions provided on the surface of the semiconductor element are each partly exposed, placing the semiconductor element on the printed circuit board in such an arrangement that the electrode portions of the printed circuit board come in contact with the connecting electrode portions, connecting the printed circuit board and the semiconductor element to each other under pressure under the foregoing specific conditions (X) and (Y) while being heated for a predetermined period of time so that the underfill resin thus molten is packed into the gap between the printed circuit board and the semiconductor element, and then hardening the underfill resin. Thus, the use of an underfill resin layer as the lamellar solid resin makes it possible to provide remarkable enhancement of the production efficiency of semiconductor device.

The underfill resin layer formed such that the connecting electrodes are each partly exposed can be easily formed by a process which comprises placing an underfill resin sheet on a printed circuit board or a semiconductor element having connecting electrode portions provided thereon with the connecting electrode portions provided interposed therebetween, and then heating and melting the underfill resin sheet or by a process which comprises print-coating an underfill resin layer-forming material onto the surface of a printed circuit board or a semiconductor element having connecting electrode portions provided thereon.

The underfill resin layer formed by melting the solid resin can be easily formed by a process which comprises preparing an underfill resin layer on one side of the semiconductor element, placing the semiconductor element on a printed circuit board having a plurality of connecting electrode portions provided thereon in such an arrangement that the underfill resin layer comes in contact with the connecting electrode portions, connecting the printed circuit board and the semiconductor element to each other under pressure under the foregoing specific conditions (X) and (Y) while being heated for a predetermined period of time so that the underfill resin thus molten is packed into the gap between the printed circuit board and the semiconductor element, and then hardening the underfill resin. Alternatively, the underfill resin layer formed by melting the solid resin can be easily formed by a process which comprises preparing an underfill resin layer on one side of the printed circuit board, placing a semiconductor element having a plurality of connecting electrode portions provided thereon on the printed circuit board in such an arrangement that the connecting electrode portions come in contact with the underfill resin layer, connecting the printed circuit board and the semiconductor element to each other under pressure under the foregoing specific conditions (X) and (Y) while being heated for a predetermined period of time so that the underfill resin thus molten is packed into the gap between the printed circuit board and the semiconductor element, and then hardening the underfill resin.

The object of the third aspect of the present application is to provide a semiconductor device which exhibits an excellent effect of relaxing the stress on the semiconductor element, the printed circuit board and the connecting electrode portions and thus exhibits a high reliability and a sheet-like underfill material which can easily form an underfill resin layer in the gap between the semiconductor element and the printed circuit board.

In order to accomplish the foregoing object, the first essence of the third aspect of the present application is a semiconductor device comprising a semiconductor element mounted on a printed circuit board with a plurality of connecting electrode portions provided interposed therebetween, the gap therebetween being sealed with an underfill resin layer, characterized in that said underfill resin layer exhibits the following physical property (Z) when hardened.

(Z) The elastic modulus in tension at 25° C. is from 300 to 1,500 MPa.

The second essence of the third aspect of the present application is a sheet-like underfill material for use in the formation of the underfill resin layer in the semiconductor device, characterized in that said sheet-like underfill material exhibits the following physical property (Z) when hardened.

(Z) The elastic modulus in tension at 25° C. is from 300 to 1,500 MPa.

In other words, in accordance with the third aspect of the present invention, a semiconductor device can be provided comprising an underfill resin layer formed in the gap between a printed circuit board and a semiconductor element connected to each other with a plurality of connecting electrode portions provided interposed therebetween, characterized in that said underfill resin layer itself exhibits an elastic modulus in tension falling within the above defined range as hardened physical property (Z). The resulting semiconductor device exhibits an enhanced reliability. In particular, the semiconductor device exhibits a stable electrical connection of semiconductor element to printed circuit board under hot-cold cycle.

Further, the inventors found during their study of the third aspect of the present invention the fact that the use of, as the material forming the underfill resin layer having the foregoing specific hardened physical property (X), an epoxy resin composition comprising a biphenyl type epoxy resin and an acrylonitrile-butadiene copolymer and optionally a specific phenolic resin incorporated therein makes it possible to form an underfill resin layer having a lower hygroscopicity and a higher adhesivity, resulting in the provision of a stabler electrical connection against stress tests such as vapor phase soldering (VPS) after moisture absorption.

As the material forming the underfill resin layer there may be preferably used a sheet-like underfill material having the foregoing hardened physical property (X), particularly a sheet-like underfill material made of the foregoing epoxy resin composition.

Embodiments of the third aspect of the present invention will be further described hereinafter.

Figure 20:
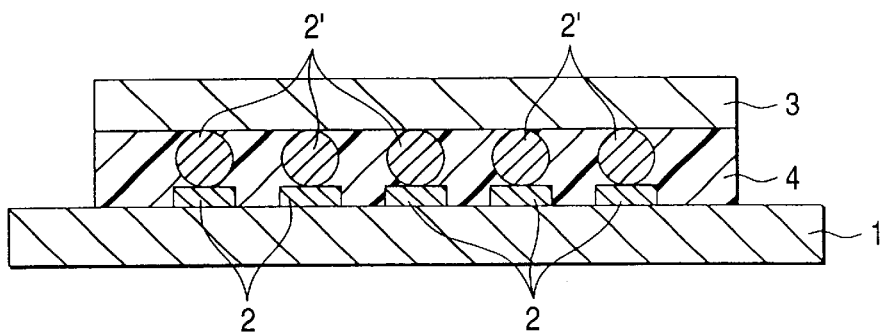
FIG. 20 is a sectional view illustrating an embodiment of the semiconductor device according to the present invention.

The semiconductor device according to the third aspect of the present invention has a face-down structure comprising a semiconductor element 3 mounted on one side of a printed circuit board 1 with a plurality of connecting electrode portions 2 and connecting electrode portions 2' provided interposed therebetween as shown in FIG. 20. An underfill resin layer 4 is formed between the printed circuit board 1 and the semiconductor element 3.

The material of the plurality of connecting electrode portions 2, 2' is not specifically limited. In practice, however, gold, silver, copper, aluminum, nickel, chromium, tin, lead, indium, solder and alloy thereof may be used. The shape of the connecting electrode portions is not specifically limited. In practice, however, the connecting electrode portions are preferably shaped to exert a high effect of extrude the underfill resin from the gap between the electrode portions 2, 2' of the printed circuit board 1 and the semiconductor element 3, respectively. The connecting electrode portions preferably have little indentations.

The material of the printed circuit board 1 is not specifically limited. These materials can be roughly divided into two groups, i.e., ceramic board and plastic board. Examples of the foregoing plastic board include epoxy glass board, bismaleimide triazine board, and polyphenyl ether board.

The underfill resin layer 4 formed in the gap between the printed circuit board 1 and the semiconductor element 3 of the semiconductor device according to the present invention will be further described hereinafter.

In the present invention, as the material forming the underfill resin layer 4 there may be used a sheet-like underfill material having specific physical properties such as epoxy resin composition.

The foregoing epoxy resin composition can be obtained from a specific epoxy resin (component A) and an acrylonitrilebutadiene copolymer (component B).

The foregoing specific epoxy resin (component A) is a biphenyl type epoxy resin. The biphenyl type epoxy resin is obtained by adding a $C_{1-4}$ alkyl group represented by any one of $R_1$ to $R_4$ to a phenyl ring having glycidyl group. Therefore, the sheet-like underfill material obtained from the epoxy resin composition containing a biphenyl type epoxy resin can exhibit water repellency and low hygroscopicity when used for the purpose of sealing semiconductor devices.

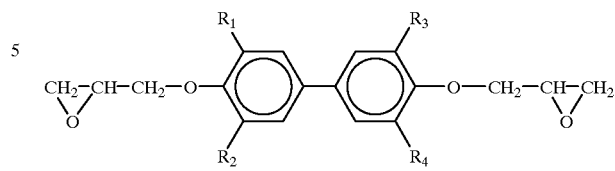

(1)

wherein $R_1$ to $R_4$ may be the same or different and each represent a $C_{1-4}$ alkyl group.

Examples of the $C_{1-4}$ alkyl group represented by any one of $R_1$ to $R_4$ in the foregoing general formula (1) include straight-chain or branched lower alkyl groups such as methyl group, ethyl group, propyl group, isopropyl group, butyl group, isobutyl group, sec-butyl group and tert-butyl group. Particularly preferred among these alkyl groups is methyl group. $R_1$ to $R_4$ may be the same or different. In particular, a biphenyl type epoxy resin represented by the following general formula (3) wherein $R_1$ to $R_4$ each represent a methyl group is desirable.

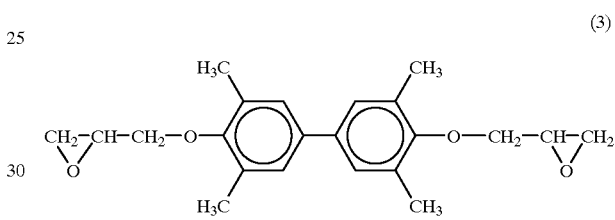

(3)

The biphenyl type epoxy resin represented by the foregoing general formula (1) preferably has an epoxy equivalent of from 177 to 240 g/eq, particularly from 177 to 220 g/eq, and a softening point of from 80° C. to 130° C., particularly from 80° C. to 120° C.

The proportion of the foregoing biphenyl type epoxy resin (component A) in all the organic components in the epoxy resin composition as a material forming the sheet-like underfill material of the present invention is preferably from 10 to 96% by weight, particularly from 20 to 94% by weight. If the proportion of the foregoing biphenyl type epoxy resin (component A) falls below 10% by weight, the resulting epoxy resin composition can hardly exhibit water repellency and a low hygroscopicity when used for the purpose of sealing semiconductor devices. On the contrary, if the proportion of the foregoing biphenyl type epoxy resin exceeds 96%, the resulting sheet-like underfill material can easily become brittle itself and thus possibly can be hardly handled.

The material forming the sheet-like underfill material according to the third aspect of the present invention may comprise other epoxy resins such as cresol novolac type epoxy resin, phenol novolac type epoxy resin and bisphenol A type epoxy resin, singly or in combination, incorporated therein besides the foregoing biphenyl type epoxy resin (component A). If the material forming the sheet-like underfill material comprises such other epoxy resins as well incorporated therein as mentioned above, it is preferred that the proportion of the foregoing biphenyl type epoxy resin (component A) be predetermined to not less than 20%, particularly not less than 50% of the entire epoxy resin component.

Further, the foregoing epoxy resin composition may comprise an epoxy resin hardener incorporated therein as necessary. The hardener is not specifically limited. For example, various hardeners which are commonly used, such as phenolic resin, methylhexahydrophthalic anhydride and amine compound, may be used. From the standpoint of reliability, a phenolic resin is particularly desirable. In particular, a novolac type phenolic resin is more desirable from the standpoint of adhesion. A phenolic resin represented by the following general formula (2) is particularly desirable for higher adhesion and excellent hygroscopicity.

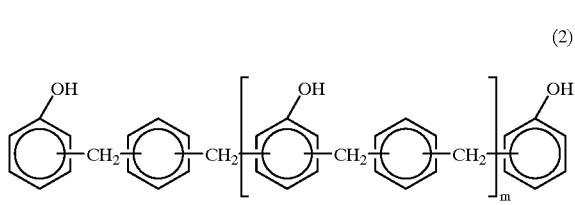

(2)

wherein m represents 0 or a positive integer.

In the foregoing general formula (2), the repetition number m represents 0 or a positive integer. In particular, m is preferably an integer of from 0 to 10, particularly from 0 to 8.

The phenolic resin represented by the foregoing general formula (2) can be obtained by the reaction of aralkyl ether with phenol in the presence of a Friedel-Crafts catalyst.

The foregoing phenolic resin preferably exhibits a hydroxyl group equivalent of from 147 to 250 g/eq, particularly from 147 to 220 g/eq, and a softening point of from 60° C. to 120° C., particularly from 60° C. to 110° C.

The proportion of the foregoing phenolic resin (component C) in the biphenyl type epoxy resin (component A) is preferably arranged such that the hydroxyl group in the foregoing phenolic resin (component C) is from 0.7 to 1.3 equivalents, particularly from 0.9 to 1.1 equivalents per equivalent of epoxy group in the biphenyl type epoxy resin (component A).

The material forming the sheet-like underfill material according to the third aspect of the present invention may further comprise a hardening accelerator incorporated therein besides the foregoing epoxy resin hardener. As such a hardening accelerator there may be used any of various hardening accelerators which have been heretofore known as a hardening accelerator for epoxy resin, such as amine-based, phosphorus-based, boron-based and phosphorus-boron-based hardening accelerators. In particular, triphenyl phosphine, diazabicycloundecene, etc. are desirable. These hardening accelerators may be used, singly or in combination.

The acrylonitrile-butadiene copolymer (component B) to be used with the foregoing biphenyl type epoxy resin (component A) is not limited to the acrylonitrile-butadiene copolymer (NBR) content of 100% but represents a copolymer in a broad sense, including NBR mixed with other copolymer components. Examples of the other copolymer components include hydrogenated acrylonitrile-butadiene rubber, acrylic acid, acrylic acid ester, styrene, and methacrylic acid. Particularly preferred among these copolymer components are acrylic acid and methacrylic acid, which are excellent in adhesion to metal or plastic. In some detail, acrylonitrile-butadiene-methacrylic acid copolymer and acrylonitrile-butadiene-acrylic acid copolymer are desirable. The content of acrylonitrile in the foregoing NBR is preferably from 10 to 50% by weight, particularly from 15 to 40% by weight.

The proportion of the foregoing acrylonitrile-butadiene copolymer (component B) in all the organic components in the epoxy resin composition as the material forming the sheet-like underfill material according to the third aspect of the present invention is preferably from 2 to 60% by weight, particularly from 3 to 50% by weight. If the proportion of the foregoing acrylonitrile-butadiene copolymer (component B) falls below 2% by weight, the resulting underfill material can hardly exhibit an excellent durability against various stress tests under high humidity and temperature conditions under hot-cold cycle when used for the purpose of sealing semiconductor devices. On the contrary, the proportion of the foregoing acrylonitrile-butadiene copolymer (component B) exceeds 60% by weight, the resulting underfill material tends to exhibit a reduced adhesion at high temperatures.

The epoxy resin composition as the material forming the sheet-like underfill material of the present invention may optionally comprise other materials (organic material, inorganic material) incorporated therein in a proper amount besides the foregoing components A, B and C. Examples of the organic material employable herein include silane coupling agent, titanium coupling agent, surface conditioner, and oxidation inhibitor. Examples of the inorganic material employable herein include various inorganic fillers such as alumina, silica and silicon nitride, particular metals such as copper, silver, aluminum, nickel and solder grains, pigments, and dyes. The proportion of the foregoing inorganic material is not specifically limited. In practice, however, the proportion of the foregoing inorganic material is preferably predetermined to not more than 90% by weight, more preferably not more than 80% by weight based on the total weight of the constituents (entire epoxy resin composition). If the proportion of the foregoing inorganic material is far beyond the above defined range, the electrical connection between the electrode of the semiconductor element and the electrode of the printed circuit board is insufficient, causing defects.

The sheet-like underfill material of the present invention can be produced as follows. In some detail, the foregoing biphenyl type epoxy resin (component A) and acrylonitrile-butadiene copolymer (component B) are blended in a predetermined amount. To the blend are then optionally added various components such as hardener, hardening accelerator and filler in a predetermined amount. Thus, an epoxy resin composition is prepared. The epoxy resin composition thus prepared is then dissolved in a solvent such as toluene, methyl ethyl ketone and ethyl acetate. The mixture solution is then applied to a base film such as polyester film which has been treated for easy release. The coated base film is then dried at a temperature of from 50° C. to 160° C. to remove the solvent such as toluene therefrom. Thus, a desired sheet-like underfill material can be formed on the base film. Otherwise, the desired sheet-like underfill material can be prepared by heat-extruding the foregoing blend free from solvent such as toluene.

The sheet-like underfill material thus obtained preferably exhibits a gelling time of from 10 to 120 seconds at 175° C. The gelling time is measured on a 175° C. heating plate.

The hardened material obtained by hardening the sheet-like underfill material according to the third aspect of the present invention thus obtained can be produced as follows. In some detail, the sheet-like underfill material thus obtained can be heat-cured at a temperature of from 70° C. to 300° C., preferably from 120° C. to 200° C., for 3 to 300 minutes, preferably 5 to 180 minutes, to produce a desired hardened material. The foregoing hardening conditions are the same as that used in the formation of the underfill resin layer in the process for the production of a semiconductor device described later.

The hardened material thus obtained needs to exhibit the following hardened physical property (Z).
(Z) The elastic modulus in tension at 25° C. is from 300 to 1,500 MPa.

More preferably, the elastic modulus in tension at 25° C. is from 500 to 12,000 MPa, particularly from 1,000 to 10,000 MPa. The hardened material having an elastic modulus in tension falling within the above defined range at 25° C. can relax the stress on the semiconductor element, the printed circuit board and the connecting electrode portions so that they can be well balanced under hot-cold cycle. If the elastic modulus in tension at 25° C. falls below 300 MPa, the resulting semiconductor device is liable to cracking at the connecting electrode portions. On the contrary, if the elastic modulus in tension at 25° C. exceeds 15,000 MPa, the resulting semiconductor device is liable to cracking at the semiconductor element.

The elastic modulus in tension at 25° C. is determined according to JIS K6900. In some detail, a universal tensile testing machine (autograph available from Shimadzu Corp.) may be used.

As previously mentioned, the semiconductor device according to the third aspect of the present invention has a face-down structure comprising a semiconductor element mounted on a printed circuit board with a plurality of connecting electrode portions provided interposed therebetween, the gap between the printed circuit board and the semiconductor element being sealed with an underfill resin layer. An example of such a semiconductor device will be described hereinafter, but the present invention is not limited thereto.

Figure 21:
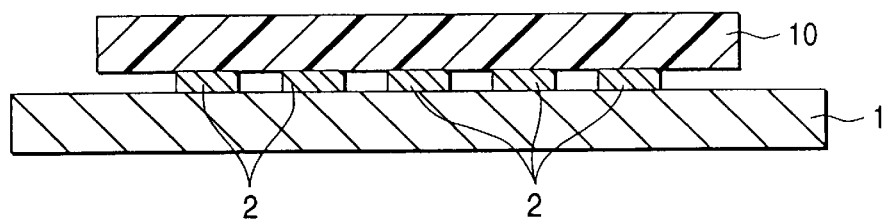
FIG. 21 is a sectional view illustrating the process for the production of a semiconductor device.
Figure 22:
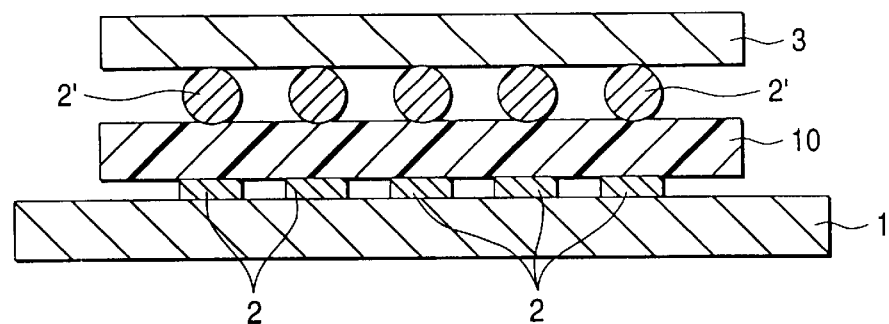
FIG. 22, too, is a sectional view illustrating the process for the production of a semiconductor device.

As shown in FIG. 21, a solid sheet-like underfill material 10 is placed on a printed circuit board 1 having a plurality of spherical connecting electrode portions 2 provided thereon with the connecting electrode portions 2 provided interposed therebetween. Subsequently, as shown in FIG. 22, a semiconductor element 3 having connecting electrode portions 2' provided thereon is placed on the sheet-like underfill material 10 in a predetermined position. The laminate is then heated under pressure to effect the electrical connection between the connecting electrode portions 2, 2' and the hardening of the sheet-like underfill material 10. Thus, the electrical connection and bonding of the printed circuit board 1 to the semiconductor element 3 is completed. The size of the sheet-like underfill material may be properly predetermined by the size (area) of the semiconductor element 3 on which the sheet-like underfill material 10 is mounted. In general, it is preferably predetermined almost the same as the size (area) of the semiconductor element 3.

The thickness of the sheet-like underfill material 10 is not specifically limited. In practice, however, the thickness of the sheet-like underfill material 10 may be properly predetermined so as to fill the gap between the semiconductor element 3 and the printed circuit board 1 and not to prevent the electrical connection between the connecting electrode portions 2, 2'. In general, it is predetermined to a range of from 10 to 200 $\mu$m.

In the foregoing process for the production of a semiconductor device, the heating temperature at which the sheet-like underfill material 10 is heated and melted may be properly predetermined taking into account the heat resistance of the semiconductor element 3 and the printed circuit board 1, the melting point of the connecting electrode portions 2, 2', the softening point and heat resistance of the sheet-like underfill material 10, and other factors. Heating can be accomplished by means of an infrared reflow furnace, hot air oven, heating plate, etc.

The packing of the underfill material thus molten into the gap between the semiconductor element 3 and the printed circuit board 1 is preferably effected under pressure as mentioned above. The pressing conditions may be properly predetermined by the material and number of the connecting electrode portions 2, 2', temperature, etc. In some detail, the pressure is predetermined to a range of from 0.02 to 0.5 kg, preferably from 0.04 to 0.2 kg per connecting electrode portion. The connecting electrode portions 2 and/or 2' are preferably pressed and flattened.

In the semiconductor device thus produced, the size of the semiconductor element 3 is normally predetermined to a width of from 2 to 20 mm, a length of from 2 to 30 mm and a thickness of from 0.1 to 2.0 mm. The size of the printed circuit board 1 having a wiring circuit formed thereon, on which the semiconductor element 3 is mounted, is normally predetermined to a width of from 5 to 120 mm, preferably from 10 to 70 mm, a length of from 5 to 120 mm, preferably from 10 to 70 mm, and a thickness of from 0.05 to 3.0 mm. The gap between the semiconductor element 3 and the printed circuit board 1 into which the underfill resin thus molten is packed is normally from 5 to 200 $\mu$m.

As previously mentioned, the underfill resin layer 5 formed by sealing with the sheet-like underfill material needs to exhibit the following hardened physical property (Z). More preferably, the elastic modulus in tension at 25° C. is from 500 to 12,000 MPa, particularly from 1,000 to 10,000 MPa.

(Z) The elastic modulus in tension at 25° C. is from 300 to 1,500 MPa.

In addition to the foregoing hardened physical property, the foregoing underfill resin layer 4 preferably exhibits a percent water absorption of not more than 1.5%, more preferably not more than 1.2%. Further, the underfill resin layer 5 preferably has an ionical impurity content (e.g., $Na^+$, $K^+$, $NH_3^+$, $Cl^-$, $SO_4^{2-}$) of not more than 50 ppm. For the measurement of percent water absorption, the hardened material was allowed to stand at a temperature of 85° C. and a relative humidity of 85% for 168 hours. The measurement of percent water absorption was carried out by means of a trace water content meter AQ-5, available from Hiranuma Sangyo K.K.). For the measurement of ionic impurity content, the hardened material was crushed, and then extracted with 121° C. pure water for 24 hours. The measurement of ionic impurity content was carried out by ion chromatography.

As made obvious in the foregoing description and Examples 58 to 67 described later, the third aspect of the present application is a semiconductor device comprising an underfill resin layer formed in the gap between a printed circuit board and a semiconductor element connected to each other with a plurality of connecting electrode portions provided interposed therebetween, characterized in that said underfill resin layer exhibits an elastic modulus in tension falling within the above defined range as hardened physical property (Z). In this arrangement, the stress developed at the printed circuit board, the semiconductor element and the connecting electrode portions can be relaxed, making it possible to obtain a semiconductor device excellent in connection reliability. In particular, the semiconductor device thus obtained exhibits a stabilized electrical connection between the semiconductor element and the printed circuit board under thermal cycle condition.

The use of, as the material forming the underfill resin layer having the foregoing specific hardened physical property (Z), an epoxy resin composition comprising a biphenyl type epoxy resin and an acrylonitrile-butadiene copolymer and optionally a specific phenolic resin incorporated therein makes it possible to form an underfill resin layer having a lower hygroscopicity and a higher adhesion, resulting in the provision of a stabler electrical connection against stress tests such as vapor phase soldering (VPS) after moisture absorption.

As the material forming the underfill resin layer there may be preferably used a sheet-like material having the foregoing specific hardened physical property (Z), particularly a sheet-like underfill material made of the foregoing epoxy resin composition, because it can easily fill the gap to provide a remarkable enhancement of production efficiency of semiconductor device.

Figure 23:
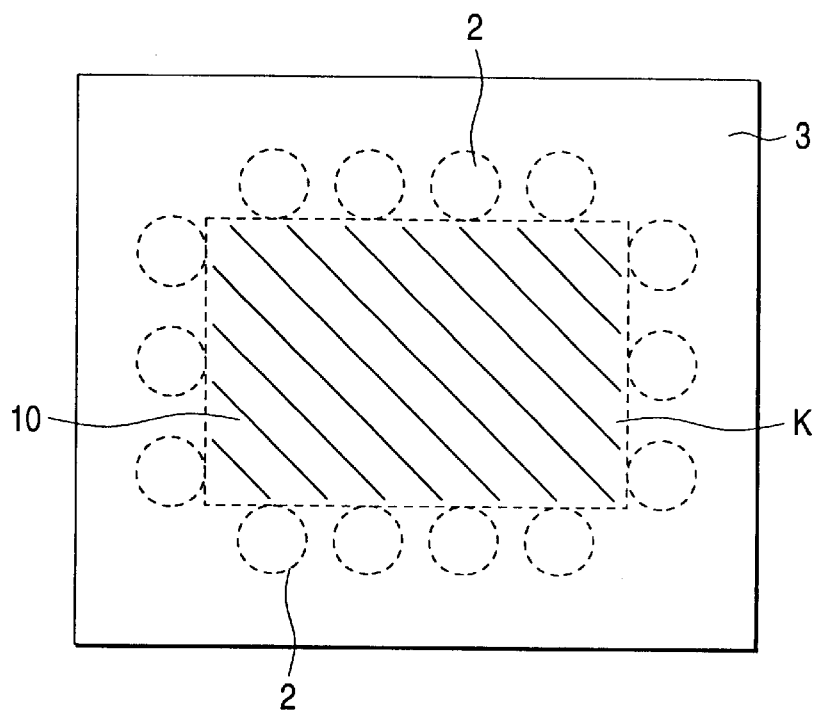
FIGS. 23 through 26 are diagrams illustrating how the sealing resin sheet to be used herein is properly used.
Figure 24:
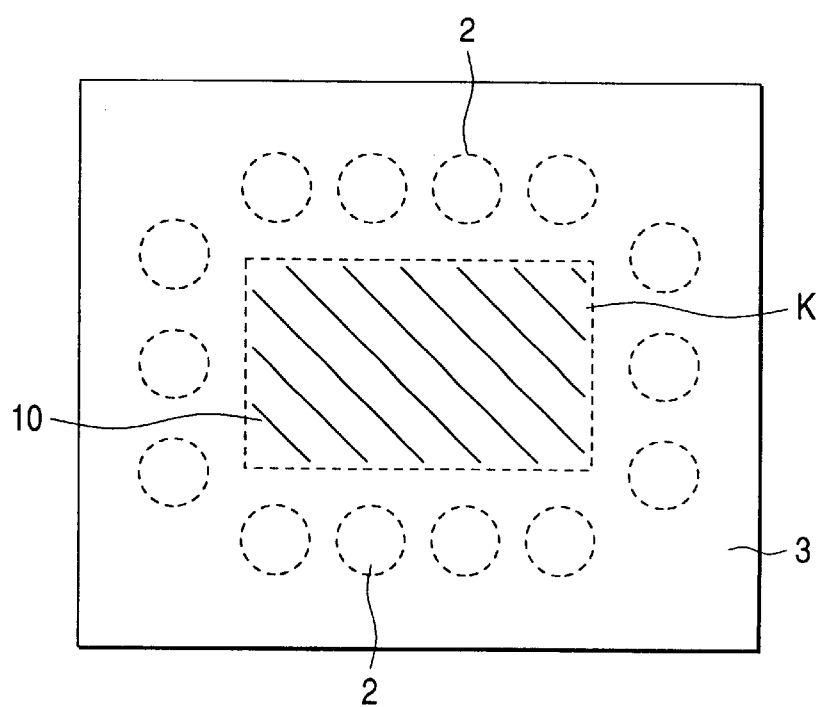

In the first to third aspects of the present application, the lamellar solid resin (underfill resin sheet) is preferably cut into a size that can be put in a spatial portion K surrounded by the periphery of the plurality of connecting electrode portions 2 formed on the surface of the semiconductor element 3 [or printed circuit board] as shown in FIGS. 23 and 24 before use.

Shown at 10 in these drawings is an underfill resin sheet.

In FIGS. 23 and 24, the connecting electrode portions 2, i.e., joint balls are shown only at their periphery.

The production of the semiconductor device of the present invention in this arrangement makes it possible to contact-bond the semiconductor element to the printed circuit board without any resin (resin composition) constituting the underfill resin sheet provided on the surface of the joint balls. In this arrangement, voids can hardly be caught during contact-bonding. Further, the necessity of providing a resin (optionally filler) or the like at the electrode connecting portion can be eliminated. Thus, conduction at the connecting portion can be further assured.

Figure 25:
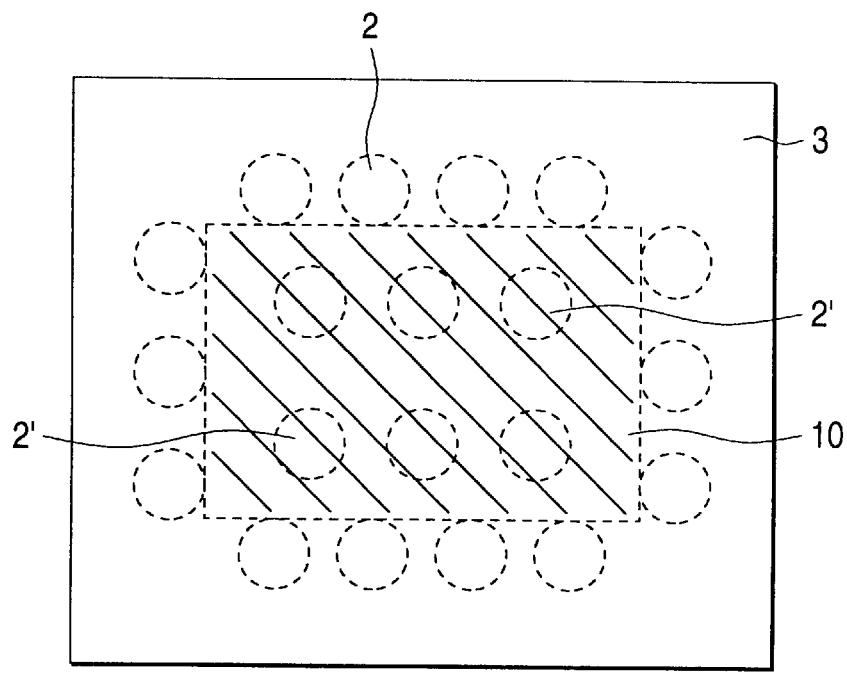
Figure 26:
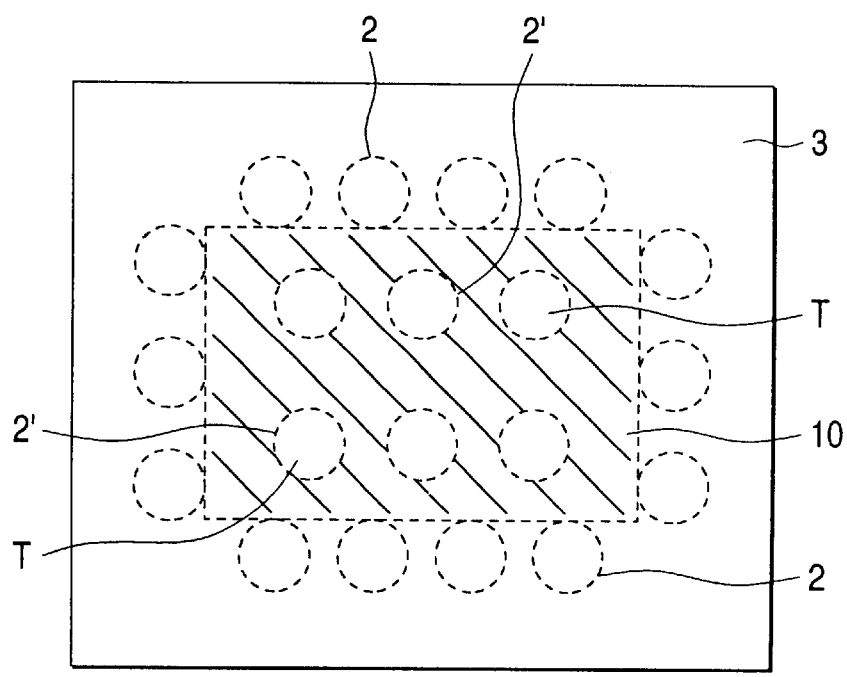

Embodiments of the process for the production of a semiconductor device wherein a plurality of connecting electrode portions are provided within a spatial portion surrounded by the foregoing periphery are shown in FIGS. 25 and 26.

FIG. 25 illustrates a process for the production of a semiconductor device in the same manner as described in connection with FIGS. 23 and 24. FIG. 26 illustrates a preferred embodiment of the production process of FIG. 25.

In other words, in FIG. 26, holes T are made in the underfill resin sheet corresponding to connecting electrode portions 2' provided within a middle portion surrounded by the periphery of a plurality of connecting electrode portions 2.

Preferred embodiments of the first to third aspects of the present application will be described hereinafter.

These preferred embodiments are particularly desirable in the case where a semiconductor device is produced using a printed circuit board which is liable to warpage.

Figure 27:
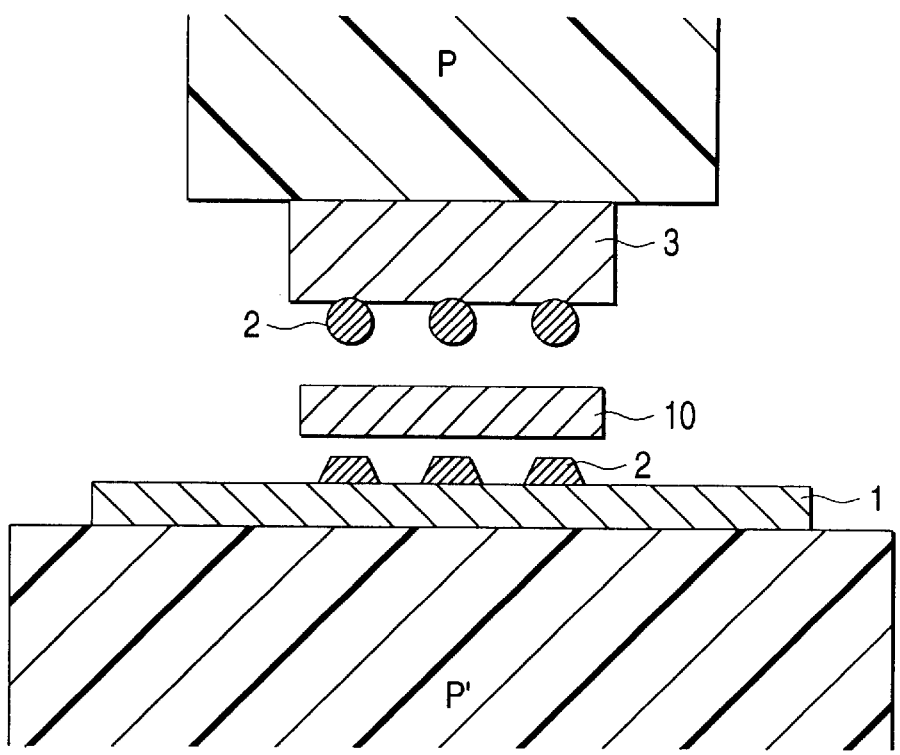
FIGS. 27 and 28 are diagrams illustrating a preferred embodiment of the process for the production of a semiconductor device according to the present invention.
Figure 28:
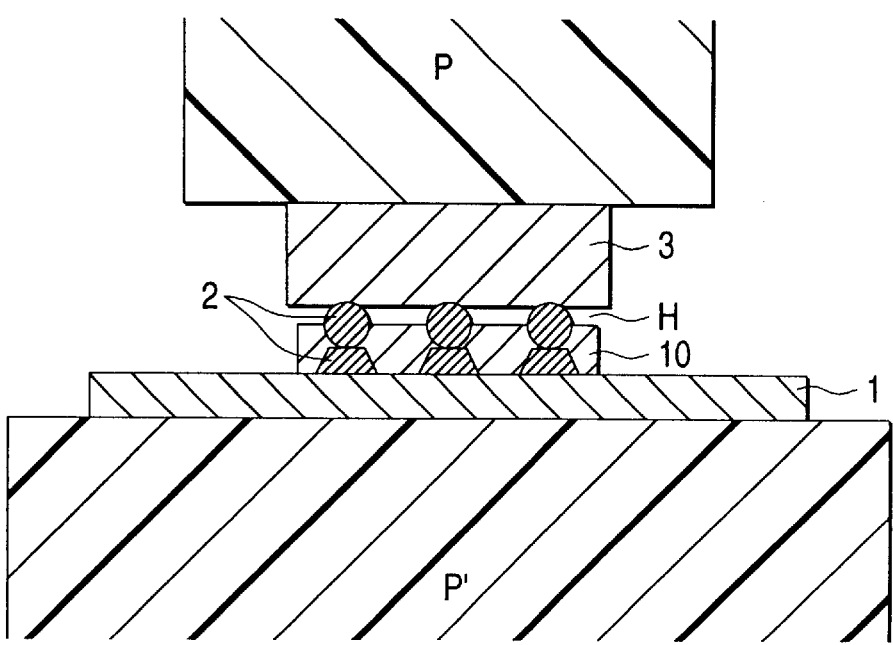

In some detail, in order to produce a semiconductor device according to the present invention, a printed circuit board 1 having connecting electrode portions 2 provided thereon and a semiconductor element 3 having connecting electrode portions 2 provided thereon are properly positioned relative to each other in such an arrangement that the two electrode portions are allowed to come in contact with each other (see FIG. 27). The upper plate and the lower plate of a heat press are then allowed to approach each gradually. As shown in FIG. 28, the two electrode portions 2, 2 then come in contact with each other (the distance between the semiconductor element 3 and the printed circuit board at this point is defined as "total connection height N" herein).

In the present invention, it is preferred that the thickness of the underfill resin sheet 10 for use in the production of a semiconductor device be from 50 to 95% of the "total connection height N".

This is because the use of an underfill resin sheet having a height of from 50 to 95% of the total connection height N prevents the printed circuit board liable to warpage from warping normally because of the contact of the two electrode portions and the pressure by the two electrode portions as shown in FIG. 28, resulting in the formation of a gap H having an almost uniform thickness which acts as a passage for air vent.

After going through the state shown in FIG. 28, the laminate is further subjected to pressure by the heat press so that the electrode portions 2, 2 are flattened (normally to a height of from 60 to 95% of the initial height before pressing). Further, when the underfill resin sheet is melted and hardened (e.g., at 180° C.), the semiconductor element and the printed circuit board are bonded to each other with the flattened electrode portions 2, 2 provided interposed therebetween (production of bonded material).

The electrode portions 2, 2 are normally formed by a hot-flowing material such as solder.

In order to melt the solder forming the electrode portions, the bonded material thus produced is normally heated to a temperature of about 215° C. to produce a semiconductor device according to the present invention. The step of melting the material forming the electrode portions, e.g., solder after the hardening of the underfill resin sheet is normally effected in the first to third aspects of the present application, though not described hereinabove.

Referring to the sealing with the underfill resin sheet according to the present invention, the following practice can apply in most cases.

In other words, if as the connecting electrode portion there is used solder, it is usual that the chip electrode portion and the board electrode portion (land portion) can be fairly melt-bonded to each other even free from flux.

The reason for this phenomenon is unknown. However, this phenomenon is probably attributed to the fact that the solder as connecting electrode portion is mostly covered with a hardened resin to screen itself from oxygen at the point when the bonded material is obtained and the fact that when the electrode portion is flattened under pressure, cracking occurs on the surface of the solder, causing the fresh surface of the solder (unoxidized surface) to be exposed. It is also thought that if an underfill resin sheet containing an extremely slight amount of chlorine and/or organic acid components, such as sheet made of an epoxy resin composition, is used, these chlorine and/or organic acid components exert an effect of removing oxide layer from the surface of the solder electrode portion. Subsequently, the bonded material is heated to a temperature of about 215° C. under these circumstances. As a result, the two electrode portions are melted.

Embodiments of the first aspect of the present invention will be described hereinafter.

Prior to the examples, the following various components were prepared.

[Epoxy resin a1]

The epoxy resin a1 is a biphenyl type epoxy resin having the structural formula represented by the following general formula (4):

(4)

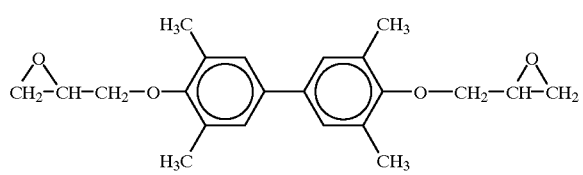

Epoxy equivalent: 195 g/eq; melting point: 107° C.
[Epoxy resin a2]
The epoxy resin a2 is a cresol novolac type epoxy resin (epoxy equivalent: 195 g/eq; melting point: 60 to 90° C.).
[Hardener b]
The hardener b is a phenol novolac resin (hydroxyl group equivalent: 105 g/eq; softening point: 60° C.].
[Inorganic fillers c1 to c5]
The inorganic fillers c1 to c5 are spherical silica powders set forth in Table 1.

TABLE 1

|  | Average grain diameter (μm) | Maximum grain diameter (μm) | Shape |
|---|---|---|---|
| Silica powder |  |  |  |
| c1 | 3 | 18 | Sphere |
| c2 | 6 | 18 | Sphere |
| c3 | 6 | 30 | Sphere |
| c4 | 3 | 18 | Crushed |
| c5 | 15 | 98 | Sphere |

[Catalyst d1]
The catalyst d1 is triphenyl phosphine.
[Catalyst d2]
The catalyst d2 is a 1/1 mixture (molar ratio) of tetraphenyl phosphate and tetraphenyl borate.
[Agent for reducing stress]
The agent for reducing stress is an acrylonitrile-butadiene rubber.
[Flame retardant]
The flame retardant is a bromated epoxy phenol novolac.
[Flame retarding aid]
The flame retarding aid is diantimony trioxide.
[Wax]
The wax is a polyethylene wax.
[Coupling agent]
The coupling agent is γ-glycidoxypropyltrimethoxy silane.

EXAMPLES 1–13

The foregoing various components were mixed in proportions set forth in Tables 2 and 3. The mixtures thus obtained were each withdrawn by a pallet, cooled, and then press-rolled into a sheet. Thus, desired sheet-like epoxy resin compositions were prepared.

TABLE 2

(unit: parts by weight)

|  |  | Example Nos. | | | | | | |
|---|---|---|---|---|---|---|---|---|
|  |  | 1 | 2 | 3 | 4 | 5 | 6 | 7 |
| Epoxy resin | a1 | 19 | 19 | 19 | — | 19 | 19 | 19 |
|  | a2 | — | — | — | 19 | — | — | — |
| Hardener b |  | 11 | 11 | 11 | 11 | 11 | 11 | 11 |

TABLE 2-continued (unit: parts by weight)

|  |  | Example Nos. | | | | | | |
|---|---|---|---|---|---|---|---|---|
|  |  | 1 | 2 | 3 | 4 | 5 | 6 | 7 |
| Silica powder | c1 | 89 | — | — | 89 | — | 480 | — |
|  | c2 | — | 89 | — | — | — | — | — |
|  | c3 | — | — | 89 | — | — | — | — |
|  | c4 | — | — | — | — | 89 | — | — |
|  | c5 | — | — | — | — | — | — | 89 |
| Catalyst | d1 | 1 | 1 | 1 | 1 | 1 | 1 | 1 |
|  | d2 | — | — | — | — | — | — | — |
| Agent for reducing stress |  | 20 | 20 | 20 | 20 | 20 | 20 | 20 |
| Flame retardant |  | 2.5 | 2.5 | 2.5 | 2.5 | 2.5 | 2.5 | 2.5 |
| Flame retarding aid |  | 5.0 | 5.0 | 5.0 | 5.0 | 5.0 | 5.0 | 5.0 |
| Wax |  | 0.5 | 0.5 | 0.5 | 0.5 | 0.5 | 0.5 | 0.5 |
| Coupling agent |  | 0.3 | 0.3 | 0.3 | 0.3 | 0.3 | 0.3 | 0.3 |

TABLE 3

(unit: parts by weight)

|  |  | Example Nos. | | | | | |
|---|---|---|---|---|---|---|---|
|  |  | 8 | 9 | 10 | 11 | 12 | 13 |
| Epoxy resin | a1 | — | — | — | — | 18 | — |
|  | a2 | 19 | 19 | 19 | 19 | — | 18 |
| Hardener b |  | 11 | 11 | 11 | 11 | 11 | 11 |
| Silica powder | c1 | 237 | 40 | 20 | 0 | 89 | 89 |
|  | c2 | — | — | — | — | — | — |
|  | c3 | — | — | — | — | — | — |
|  | c4 | — | — | — | — | — | — |
|  | c5 | — | — | — | — | — | — |
| Catalyst | d1 | 1 | 1 | 1 | 1 | — | — |
|  | d2 | — | — | — | — | 2 | 2 |
| Agent for reducing stress |  | 20 | 30 | 30 | 40 | 20 | 20 |
| Flame retardant |  | 2.5 | 2.5 | 2.5 | 2.5 | 2.5 | 2.5 |
| Flaiue retarding aid |  | 5.0 | 5.0 | 5.0 | 5.0 | 5.0 | 5.0 |
| Wax |  | 0.5 | 0.5 | 0.5 | 0.5 | 0.5 | 0.5 |
| Coupling agent |  | 0.3 | 0.3 | 0.3 | 0.3 | 0.3 | 0.3 |

The sheet-like epoxy resin compositions (underfill resin sheets) of the various examples thus obtained were then processed according to the first embodiment of the process for the production of a semiconductor device to produce a semiconductor device. In some detail, as shown in FIG. 2, the various underfill resin sheets 10 were each placed on a board 1 having spherical joint balls 2 provided thereon with the joint balls 2 provided interposed therebetween. Subsequently, as shown in FIG. 3, a semiconductor chip 3 was placed on the underfill resin sheet 10. Thereafter, the underfill resin sheet 10 was heated and melted at a heating temperature of 180° C. under a load of 0.06 kg per joint ball so that the gap between the board 1 and the semiconductor chip 3 was filled with the resin thus molten. The resin was then heat-cured at a temperature of 200° C. for 20 minutes to prepare a semiconductor device having the gap filled with an underfill resin layer 4 as shown in FIG. 1. The semiconductor device thus obtained was then checked for initial conduction. The semiconductor device was then subjected to pressure cooker test [PCT test (allowed to stand at 121° C. and 100% RH under 2 atm for 200 hours)]. The semiconductor device was then checked for conduction. The percentage of occurrence of defectives (percent defective) was then calculated. Along with the percent defective, symbol X (defectives occur) or O (no defectives occur) is given. The results are set forth in Tables 4 and 5.

The semiconductor chip used in the present examples had a thickness of 0.6 mm and a 13.5 mm-square area. The connecting electrode portions formed on the chip were each formed by a spherical solder having a height of 90 μm and a diameter of 150 μm. The printed circuit board used in the present examples had a thickness of 1.0 mm and a 21 mm-square area. The connecting electrode portions formed on the printed circuit board were each formed by a spherical solder having a height of 30 μm and a diameter of 120 μm.

TABLE 4

| | Example Nos. | | | | | | | |
|---|---|---|---|---|---|---|---|---|
| | 1 | 2 | 3 | 4 | 5 | 6 | 7 | 8 |
| Percent defective on conduction test* | | | | | | | | |
| Initial | o (0) | o (0) | o (0) | o (0) | o (0) | o (0) | o (0) | o (0) |
| 200 hr after PCT test | o (0) | o (0) | o (0) | o (0) | o (0) | o (0) | o (0) | o (0) |

*The figure in parenthesis indicates % defective.

TABLE 5

| | Example Nos. | | | | |
|---|---|---|---|---|---|
| | 9 | 10 | 11 | 12 | 13 |
| Percent defective on conduction test* | | | | | |
| Initial | o (0) | o (0) | o (0) | o (0) | o (0) |
| 200 hr after PCT test | o (0) | o (0) | o (0) | o (0) | o (0) |

*The figure in parenthesis indicates % defective.

As can be seen in the results set forth in Tables 4 and 5, no defectives occurred in the check for initial conduction and the check for conduction 200 hours after PCT test. This demonstrates that all the present examples comprise an underfill resin layer formed in the gap between the board and the semiconductor chip. It is thus obvious that the gap has been fairly filled with the underfill resin.

The epoxy resin compositions of Examples 1 to 13 were each processed according to the second aspect of the process for the production of a semiconductor device to produce a semiconductor device. In some detail, as shown in FIG. 2, the various underfill resin sheet 10 were each placed on a board 1 having joint balls 2 provided thereon with the joint balls 2 provided interposed therebetween. Subsequently, the underfill resin sheet 10 was heated and melted at a temperature of 180° C. to form an underfill resin layer 13 on the surface of the board 1 in such an arrangement that the top of the joint balls 2 were exposed as shown in FIG. 2. Subsequently, as shown in FIG. 7, a semiconductor chip 3 was mounted on the board 1 in such an arrangement that the electrode portions of the semiconductor chip 3 came in contact with the joint balls 2 the top of which had been exposed to the exterior of the underfill resin layer 13. Subsequently, the entire laminate was heated (to 180° C.) to melt the underfill resin layer 13 provided on the surface of the board 1. Under these conditions, the laminate was pressed so that the semiconductor chip 3 and the board 1 were connected to each other (condition: heat-cured at 200° C. for 20 minutes) to prepare a semiconductor device having the gap filled with an underfill resin layer 4 as shown in FIG. 4. The semiconductor device thus obtained was then checked for initial conduction and conduction 200 hours of standing after PCT test in the same manner as mentioned above. As a result, no defectives occurred in the check for initial conduction and conduction 200 hours after PCT test as in the foregoing evaluation results. This demonstrates that all the present examples comprise an underfill resin layer formed in the gap between the board 1 and the semiconductor chip 3. It is thus obvious that the gap has been fairly filled with the underfill resin.

The epoxy resin compositions of Examples 1 to 13 were each processed according to the third aspect of the process for the production of a semiconductor device to produce a semiconductor device. In some detail, as shown in FIG. 16, a semiconductor chip 3 having each of the various underfill resin sheets 14 provided on one side thereof was prepared. Subsequently, the semiconductor chip 3 was placed on a board 1 having a plurality of joint balls 2 provided thereon in such an arrangement that the underfill resin sheet 14 came in contact with the joint balls 2. Subsequently, the entire laminate was heated (to 180° C.) to melt the underfill resin sheet 14. Under these conditions, the laminate was pressed so that the semiconductor chip 3 and the board 1 were connected to each other (condition: heat-cured at 200° C. for 20 minutes) to prepare a semiconductor device having the gap filled with an underfill resin layer 4 as shown in FIG. 1. The semiconductor device thus obtained was then checked for initial conduction and conduction 200 hours of standing after PCT test in the same manner as mentioned above. As a result, no defectives occurred in the check for initial conduction and conduction 200 hours after PCT test as in the foregoing evaluation results. This demonstrates that all the present examples comprise an underfill resin layer formed in the gap between the board 1 and the semiconductor chip 3. It is thus obvious that the gap has been fairly filled with the underfill resin.

[Preparation of underfill resin sheet]

The various components set forth in Table 6 below were mixed in proportions set forth in Table 6. The mixture was withdrawn by a pallet, cooled, and then press-rolled into sheet to prepare a desired sheet-like epoxy resin composition (underfill resin sheet).

TABLE 6

| | | (unit: parts by weight) Underfill resin sheet | | | | | | |
|---|---|---|---|---|---|---|---|---|
| | | A | B | C | D | E | F | G |
| Epoxy resin | a1 | 19 | — | 19 | 19 | 19 | 19 | 19 |
| | a2 | — | 19 | — | — | — | — | — |
| Hardener b | | 11 | 11 | 11 | 11 | 11 | 11 | 11 |
| Silica powder | c1 | 89 | 89 | 89 | 89 | 89 | 89 | 89 |
| Catalyst | d1 | 1.0 | 1.0 | 1.0 | 1.0 | 1.0 | 1.0 | 1.0 |
| | d2 | — | — | — | — | — | — | — |
| Agent for reducing stress | | 20 | 30 | 30 | 40 | 20 | 40 | 20 |
| Flame retardant | | 2.5 | 2.5 | 2.5 | 2.5 | 2.5 | 2.5 | 2.5 |
| Flame retarding aid | | 5.0 | 5.0 | 5.0 | 5.0 | 5.0 | 5.0 | 5.0 |
| Wax | | 0.5 | 0.5 | 0.5 | 0.5 | 0.5 | 0.5 | 0.5 |
| Coupling agent | | 0.3 | 0.3 | 0.3 | 0.3 | 0.3 | 0.3 | 0.3 |
| Melt viscosity (poise) | | 1800 | 2000 | 800 | 3300 | 4000 | 3300 | 1600 |
| Retention time after heated (sec.) | | 10 | 10 | 15 | 10 | 10 | 10 | 10 |
| Pressing time (sec.) | | 15 | 15 | 15 | 10 | 10 | 6 | 15 |

TABLE 6-continued

Underfill resin sheet (unit: parts by weight)

|  | A | B | C | D | E | F | G |
|---|---|---|---|---|---|---|---|
| Viscosity at end of pressing (poise) | 6000 | 8500 | 5600 | 7000 | 15000 | 4000 | 5000 |
| Gelling time (sec.) | 30 | 28 | 40 | 23 | 19 | 23 | 32 |
| % Gelling time retention | 17 | 11 | 25 | 13 | 0 | 30 | 22 |
| % DSC residual heat of reaction | 70 | 69 | 70 | 67 | 63 | 72 | 70 |

EXAMPLES 14–20

The sheet-like epoxy resin compositions (underfill resin sheets) of the various examples thus obtained were then processed according to the first embodiment of the process for the production of a semiconductor device to produce a semiconductor device. In some detail, as shown in FIG. 2, the various underfill resin sheets 10 were each placed on a board 1 having spherical joint balls 2 provided thereon with the joint balls 2 provided interposed therebetween. Subsequently, as shown in FIG. 3, a semiconductor chip 3 was placed on the underfill resin sheet 10. Subsequently, the entire laminate was heated (at 180° C. under a load of 0.08 kgf per joint ball) where it was then allowed to stand under pressure (melt viscosity, pressing time, viscosity at the end of pressing, gelling time, percent retention of gelling time and DSC residual heat of reaction are set forth in Table 6) for a predetermined period of time (standing time after heated is set forth in Table 6). In this manner, the semiconductor chip 3 and the board 1 were connected to each other (conditions: heat-cured at 200° C. for 20 minutes) to prepare a semiconductor device having the gap between the semiconductor chip 3 and the board 1 filled with an underfill resin layer 4 as shown in FIG. 1.

EXAMPLES 21–27

The sheet-like epoxy resin compositions (underfill resin sheets) of the various examples thus obtained were then processed according to the second embodiment of the process for the production of a semiconductor device to produce a semiconductor device. In some detail, as shown in FIG. 2, the various underfill resin sheets 10 were each placed on a board 1 having spherical joint balls 2 provided thereon with the joint balls 2 provided interposed therebetween. Subsequently, the underfill resin sheet 10 was heated and melted at a temperature of 180° C. to form an underfill resin layer 13 on the surface of the board 1 in such an arrangement that the top of the joint balls 2 were exposed as shown in FIG. 6. Subsequently, as shown in FIG. 7, a semiconductor chip 3 was mounted on the board 1 in such an arrangement that the electrode portions of the semiconductor chip 3 came in contact with the joint balls 2 the top of which were exposed to the exterior of the underfill resin layer 13. Subsequently, the entire laminate was heated (at 180° C. under a load of 0.08 kgf per joint ball) where it was then allowed to stand under pressure (melt viscosity, pressing time, viscosity at the end of pressing, gelling time, percent retention of gelling time and DSC residual heat of reaction are set forth in Table 6) for a predetermined period of time (standing time after heated is set forth in Table 6). In this manner, the semiconductor chip 3 and the board 1 were connected to each other (conditions: heat-cured at 200° C. for 20 minutes) to prepare a semiconductor device having the gap between the semiconductor chip 3 and the board 1 filled with an underfill resin layer 4 as shown in FIG. 1.

EXAMPLES 28–34

The sheet-like epoxy resin compositions (underfill resin sheets) of the various examples thus obtained were then processed according to the third embodiment of the process for the production of a semiconductor device to produce a semiconductor device. In some detail, as shown in FIG. 16, a semiconductor chip 3 having the underfill resin sheet 14 laminated on one side thereof was prepared. Subsequently, the semiconductor 3 was placed on a board 1 having a plurality of joint balls 2 provided thereon in such an arrangement that the underfill resin sheet 14 laminated on the semiconductor chip 3 came in contact with the joint balls 2. Subsequently, the entire laminate was heated (at 180° C. under a load of 0.08 kgf per joint ball) where it was then allowed to stand under pressure (melt viscosity, pressing time, viscosity at the end of pressing, gelling time, percent retention of gelling time and DSC residual heat of reaction are set forth in Table 6) for a predetermined period of time (standing time after heated is set forth in Table 6). In this manner, the semiconductor chip 3 and the board 1 were connected to each other (conditions: heat-cured at 200° C. for 20 minutes) to prepare a semiconductor device having the gap between the semiconductor chip 3 and the board 1 filled with an underfill resin layer 4 as shown in FIG. 1.

[viscosity]

The viscosity was read from the viscosity curve given by a flow tester.

[Percent retention of gelling time]

The percent retention of gelling time was calculated from the following equation (1):

$$\text{(Gelling time} - \text{standing time after heated} + \text{heating time)/gelling time} \quad (1)$$

[Residual heat of reaction]

The resin sheet was placed on a heating plate. The resin sheet was sampled every ageing. The sample was then measured for residual heat of reaction by DSC.

The semiconductor devices thus obtained according to the various embodiments were each then checked for initial conduction and conduction 200 hours of standing after PCT test in the same manner as mentioned above. As a result, no defectives occurred in the check for initial conduction and conduction 200 hours after PCT test as in the foregoing evaluation results. This demonstrates that all the present examples comprise an underfill resin layer formed in the gap between the board 1 and the semiconductor chip 3. It is thus obvious that the gap has been fairly filled with the underfill resin.

Further, the various semiconductor devices thus obtained were each subjected to conduction test under the following conditions [before and after moisture-absorption vapor phase soldering (VPS)]. Moreover, these semiconductor devices were each evaluated for adhesion between the semiconductor element and the printed circuit board under the following conditions (before and after moisture-absorption VPS). The results are set forth in Tables 7 to 9 given later.

[Conduction test conditions/adhesion evaluation conditions]

Moisture-absorption VPS conditions: 30° C./60 RH % ×168 hours+215° C. ×90 seconds For the conduction test, the resistivity determined after moisture-absorption VPS was represented relative to the initial value (resistivity) determined before moisture-absorption VPS as reference (100). For the evaluation of adhesion, supersonic flaw detection was effected. In some detail, the occurrence of voids in the underfill resin layer portion and peeling in the vicinity of the joint balls were mainly evaluated.

TABLE 7

[First embodiment]

| | | Example Nos. | | | | | | |
|---|---|---|---|---|---|---|---|---|
| | | 14 | 15 | 16 | 17 | 18 | 19 | 20 |
| Underfill resin sheet | | A | B | C | D | E | F | G |
| Con- | Initial | 100 | 100 | 100 | 100 | 100 | 100 | 100 |
| duction test *1 | After VPS | 100 | 100 | 100 | 100 | 100 | 100 | 100 |
| Evaluation of adhesion *2 | Initial | None | None | None | None | None | None | None |
| | After VPS | None | None | None | None | None | None | None |

*1: The resistivity determined after moisture-absorption VPS was represented relative to the initial value as 100.
*2: Ultrasonic microscope detection method was used to see if delamination occurs at the interface of the semiconductor chip with the board.

TABLE 8

[Second embodiment]

| | | Example Nos. | | | | | | |
|---|---|---|---|---|---|---|---|---|
| | | 21 | 22 | 23 | 24 | 25 | 26 | 27 |
| Underfill resin sheet | | A | B | C | D | E | F | G |
| Con- | Initial | 100 | 100 | 100 | 100 | 100 | 100 | 100 |
| duction test *1 | After VPS | 100 | 100 | 100 | 100 | 100 | 100 | 100 |
| Evaluation of adhesion *2 | Initial | None | None | None | None | None | None | None |
| | After VPS | None | None | None | None | None | None | None |

*1: The resistivity determined after moisture-absorption VPS was represented relative to the initial value as 100.
*2: Ultrasonic microscope detection method was used to see if delamination occurs at the interface of the semiconductor chip with the board.

TABLE 9

[Third embodiment]

| | | Example Nos. | | | | | | |
|---|---|---|---|---|---|---|---|---|
| | | 21 | 22 | 23 | 24 | 25 | 26 | 27 |
| Underfill resin sheet | | A | B | C | D | E | F | G |
| Con- | Initial | 100 | 100 | 100 | 100 | 100 | 100 | 100 |
| duction test *1 | After VPS | 100 | 100 | 100 | 100 | 100 | 100 | 100 |
| Evaluation of adhesion *2 | Initial | None | None | None | None | None | None | None |
| | After VPS | None | None | None | None | None | None | None |

*1: The resistivity determined after moisture-absorption VPS was represented relative to the initial value as 100.
*2: Ultrasonic microscope detection method was used to see if delamination occurs at the interface of the semiconductor chip with the board.

In Tables 7 to 9, the results of conduction test before and after moisture-absorption VPS show that the products of the present examples obtained by heating the underfill resin sheet under pressure for a predetermined period of time in such a manner that the melt viscosity was not less than 5,000 poise, the percent retention of gelling time was not more than 30% or the residual heat of reaction was not more than 70% of the initial value so that the gap between the printed circuit board and the semiconductor element was filled with an underfill resin layer exhibit a high reliability. Further, the results of evaluation for adhesion before and after moisture-absorption VPS show that these products had no delamination observed and no fine voids formed in the underfill resin layer and thus comprised a good underfill resin layer formed. These results show that semiconductor devices having an excellent reliability in conductivity were obtained.

Examples of the second aspect of the present application will be described hereinafter.

Prior to the examples, the following various components were prepared.

[Epoxy resin a1]

The epoxy resin a1 is a biphenyl type epoxy resin having the structural formula represented by the following general formula (4):

$$\text{(4)}$$

$$CH_2\text{-}CH\text{-}CH_2\text{-}O\text{-}\underset{H_3C}{\overset{H_3C}{\bigcirc}}\text{-}\underset{CH_3}{\overset{CH_3}{\bigcirc}}\text{-}O\text{-}CH_2\text{-}CH\text{-}CH_2$$

Epoxy equivalent: 195 g/eq; melting point: 107° C.

[Epoxy resin a2]

The epoxy resin a2 is a cresol novolac type epoxy resin (epoxy equivalent: 195 g/eq; melting point: 60 to 90° C.).

[Hardener b]

The hardener b is a phenol novolac resin (hydroxyl group equivalent: 105 g/eq; softening point: 60° C.].

[Inorganic filler c]

The inorganic filler c is a spherical silica powder (average grain diameter: 3 μm; maximum grain diameter: 18 μm).

[Catalyst d]

The catalyst d is a 1/1 mixture (molar ratio) of tetraphenyl phosphate and tetraphenyl borate.

[Agent for reducing stress]

The agent for reducing stress is an acrylonitrile-butadiene rubber.

[Flame retardant]

The flame retardant is a brominated epoxy phenol novolac.

[Flame retarding aid]

The flame retarding aid is diantimony trioxide.

[Wax]

The wax is a polyethylene wax.

[Coupling agent]

The coupling agent is γ-glycidoxypropyltrimethoxy silane.

[Preparation of underfill resin sheets a to f]

The foregoing various components were mixed in proportions set forth in Tables 10 and 11. The mixtures thus obtained were each withdrawn by a pallet, cooled, and then press-rolled into a sheet. Thus, desired sheet-like epoxy resin compositions were prepared.

TABLE 10

(unit: parts by weight)
Underfill resin sheet

|  |  | a | b | c | d | e | f |
|---|---|---|---|---|---|---|---|
| Epoxy resin | a1 | 19 | 19 | — | 19 | 19 | 19 |
|  | a2 | — | — | 19 | — | — | — |
| Hardener b |  | 11 | 11 | 11 | 11 | 11 | 11 |
| Silica powder c |  | 0 | 60 | 0 | 0 | 0 | 0 |
| Catalyst d |  | 1.0 | 1.0 | 1.0 | 1.0 | 1.0 | 1.0 |
| Agent for reducing stress |  | 20 | 20 | 20 | 20 | 20 | 20 |
| Flame retardant |  | 2.5 | 2.5 | 2.5 | 2.5 | 2.5 | 2.5 |
| Flame retarding aid |  | 5.0 | 5.0 | 5.0 | 5.0 | 5.0 | 5.0 |
| Wax |  | 0.5 | 0.5 | 0.5 | 0.5 | 0.5 | 0.5 |
| Coupling agent |  | 0.3 | 0.3 | 0.3 | 0.3 | 0.3 | 0.3 |

TABLE 11

(unit: parts by weight)
Underfill resin sheet

|  | g | h | i | j | k |
|---|---|---|---|---|---|
| Epoxy resin a1 | 19 | 19 | 19 | 19 | 19 |
| Hardener b | 11 | 11 | 11 | 11 | 11 |
| Silica powder c | 0 | 0 | 0 | 0 | 0 |
| Catalyst d | 1.0 | 1.0 | 1.0 | 1.0 | 1.0 |
| Agent for reducing stress | 20 | 20 | 20 | 20 | 20 |
| Flame retardant | 2.5 | 2.5 | 2.5 | 2.5 | 2.5 |
| Flame retarding aid | 5.0 | 5.0 | 5.0 | 5.0 | 5.0 |
| Wax | 0.5 | 0.5 | 0.5 | 0.5 | 0.5 |
| Coupling agent | 0.3 | 0.3 | 0.3 | 0.3 | 0.3 |

EXAMPLES 35–40

The sheet-like epoxy resin compositions (underfill resin sheets) thus obtained were then processed according to the first embodiment of the process for the production of a semiconductor device to produce a semiconductor device. In some detail, as shown in FIG. 2, the various underfill resin sheets 10 were each placed on a board 1 having spherical joint balls 2 provided thereon with the joint balls 2 provided interposed therebetween. Subsequently, as shown in FIG. 3, a semiconductor chip 3 was placed on the underfill resin sheet 10. The underfill resin sheet 10 had previously been subjected to heat treatment (at 130° C. for 150 seconds or at 110° C. for 60 seconds). Subsequently, the entire laminate was heated (to 180° C. under a load of 0.08 kgf per joint ball) under pressure (pressure, pressing time and residual heat of reaction after DSC contact-bonding are set forth in Table 12 below). The temperature of the semiconductor chip 3 and the board (substrate) 1 were then adjusted to the value set forth in Table 12 below. Under these conditions, the semiconductor chip 3 and the board 1 were connected to each other (conditions: heat-cured at 200° C. for 20 minutes) to prepare a semiconductor device having the gap between the semiconductor chip 3 and the board 1 filled with an underfill resin layer 4 as shown in FIG. 1.

TABLE 12

[First embodiment]

| | Example Nos. | | | | | |
|---|---|---|---|---|---|---|
| | 35 | 36 | 37 | 38 | 39 | 40 |
| Resin preheating conditions | 130° C. × 150 sec. | | | | | |
| Chip temperature (° C.) | 175 | 175 | 250 | 175 | 175 | 175 |
| Board temperature (° C.) | 125 | 125 | 148 | — | — | — |
| Pressure (kg/cm²) | 15 | 15 | 15 | 15 | 15 | 15 |
| Pressing time (sec.) | 120 | 120 | 60 | 30 | 30 | 30 |
| Secondary heated chip temperature (° C.) | — | — | — | 250 | 300 | 350 |
| Secondary heated board temperature (° C.) | — | — | — | 122 | 125 | 129 |
| Pressure (kg/cm²) | — | — | — | 0.5 | 0.5 | 0.5 |
| Pressure retention time (sec.) | — | — | — | 30 | 30 | 30 |
| Temperature difference between chip and board (° C.) | 50 | 50 | 102 | 128 | 175 | 221 |
| Residual heat of reaction after DSC contact bonding (%) | 70 | 69 | 62 | 65 | 62 | 58 |

EXAMPLES 41–46

The sheet-like epoxy resin compositions (underfill resin sheets) thus obtained were then processed according to the second embodiment of the process for the production of a semiconductor device to produce a semiconductor device. In some detail, as shown in FIG. 2, the various underfill resin sheets 10 were each placed on a board 1 having spherical joint balls 2 provided thereon with the joint balls 2 provided interposed therebetween. Subsequently, the underfill resin sheet 10 was heated and melted at a temperature of 180° C. to form an underfill resin layer 13 on the surface of the board 1 in such an arrangement that the top of the joint balls 2 were exposed as shown in FIG. 6. Subsequently, as shown in FIG. 7, a semiconductor chip 3 was mounted on the board 1 in such an arrangement that the electrode portions of the semiconductor chip 3 came in contact with the joint balls 2 the top of which were exposed to the exterior of the underfill resin layer 13. The underfill resin layer 13 had previously been subjected to heat treatment (at 130° C. for 150 seconds or at 110° C. for 60 seconds). Subsequently, the entire laminate was heated (at 180° C. under a load of 0.08 kgf per joint ball) where it was then allowed to stand under pressure (pressure, pressing time, and residual heat of reaction after DSC contact bonding are set forth in Table 13 below). The temperature of the semiconductor chip 3 and the board (substrate) 1 were then adjusted to the value set forth in Table 12 below. Under these conditions, the semiconductor chip 3 and the board 1 were connected to each other (conditions: heat-cured at 200° C. for 20 minutes) to prepare a semiconductor device having the gap between the semiconductor chip 3 and the board 1 filled with a underfill resin layer 4 as shown in FIG. 1.

TABLE 13

[Second embodiment]

| | Example Nos. | | | | | |
|---|---|---|---|---|---|---|
| | 35 | 36 | 37 | 38 | 39 | 40 |
| Resin preheating conditions | 130° C. × 150 sec. | | | | | |
| Chip temperature (° C.) | 175 | 175 | 250 | 175 | 175 | 175 |

TABLE 13-continued

[Second embodiment]

| | Example Nos. | | | | | |
|---|---|---|---|---|---|---|
| | 35 | 36 | 37 | 38 | 39 | 40 |
| Board temperature (° C.) | 125 | 125 | 148 | — | — | — |
| Pressure (kg/cm²) | 15 | 15 | 15 | 15 | 15 | 15 |
| Pressing time (sec.) | 120 | 120 | 60 | 30 | 30 | 30 |
| Secondary heated chip temperature (° C.) | — | — | — | 250 | 300 | 350 |
| Secondary heated board temperature (° C.) | — | — | — | 122 | 125 | 129 |
| Pressure (kg/cm²) | — | — | — | 0.5 | 0.5 | 0.5 |
| Pressure retention time (sec.) | — | — | — | 30 | 30 | 30 |
| Temperature difference between chip and board (° C.) | 50 | 50 | 102 | 128 | 175 | 221 |
| Residual heat of reaction after DSC contact bonding (%) | 70 | 69 | 62 | 65 | 62 | 58 |

EXAMPLES 47–52

The sheet-like epoxy resin compositions (underfill resin sheets) thus obtained were then processed according to the third embodiment of the process for the production of a semiconductor device to produce a semiconductor device. In some detail, as shown in FIG. 16, a semiconductor chip 3 having the underfill resin sheet 14 laminated on one side thereof was prepared. Subsequently, the semiconductor 3 was placed on a board 1 having a plurality of joint balls 2 provided thereon in such an arrangement that the underfill resin sheet 14 laminated on the semiconductor chip 3 came in contact with the joint balls 2. The underfill resin layer 13 had previously been subjected to heat treatment (at 130° C. for 150 seconds or at 110° C. for 60 seconds). Subsequently, the entire laminate was heated (at 180° C. under a load of 0.08 kgf per joint ball) where it was then allowed to stand under pressure (pressure, pressing time, and residual heat of reaction after DSC contact bonding are set forth in Table 14 below). The temperature of the semiconductor chip 3 and the board (substrate) 1 were then adjusted to the value set forth in Table 14 below. Under these conditions, the semiconductor chip 3 and the board 1 were connected to each other (conditions: heat-cured at 200° C. for 20 minutes) to prepare a semiconductor device having the gap between the semiconductor chip 3 and the board 1 filled with an underfill resin layer 4 as shown in FIG. 1.

TABLE 14

[Third embodiment]

| | Example Nos. | | | | | |
|---|---|---|---|---|---|---|
| | 35 | 36 | 37 | 38 | 39 | 40 |
| Resin preheating conditions | 130° C. × 150 sec. | | | | | |
| Chip temperature (° C.) | 175 | 175 | 250 | 175 | 175 | 175 |
| Board temperature (° C.) | 125 | 125 | 148 | — | — | — |
| Pressure (kg/cm²) | 15 | 15 | 15 | 15 | 15 | 15 |
| Pressing time (sec.) | 120 | 120 | 60 | 30 | 30 | 30 |
| Secondary heated chip temperature (° C.) | — | — | — | 250 | 300 | 350 |
| Secondary heated board temperature (° C.) | — | — | — | 122 | 125 | 129 |
| Pressure (kg/cm²) | — | — | — | 0.5 | 0.5 | 0.5 |
| Pressure retention time (sec.) | — | — | — | 30 | 30 | 30 |

TABLE 14-continued

[Third embodiment]

| | Example Nos. | | | | | |
|---|---|---|---|---|---|---|
| | 35 | 36 | 37 | 38 | 39 | 40 |
| Temperature difference between chip and board (° C.) | 50 | 50 | 102 | 128 | 175 | 221 |
| Residual heat of reaction after DSC contact bonding (%) | 70 | 69 | 62 | 65 | 62 | 58 |

[Residual heat of reaction]

The resin sheet was placed on a heating plate. The resin sheet was sampled every ageing. The sample was then measured for residual heat of reaction by DSC.

The semiconductor devices thus obtained were each then after-cured at a temperature of 150° C. for 30 minutes. The degree of warpage of the semiconductor device thus after-cured was then determined by measuring the warpage of the semiconductor chip on the diagonal line by means of a surface roughness meter. For the evaluation of warpage, the maximum value was determined. The results are set forth in Tables 15 to 17.

The semiconductor devices thus obtained were each then subjected to conduction test under the following conditions [before and after moisture-absorption vapor phase soldering (VPS)]. These semiconductor devices were each evaluated for adhesion between the semiconductor element and the printed circuit board under the following conditions (before and after moisture-absorption VPS). Further, these semiconductor devices were each subjected to thermal shock test (TST: −40° C. ×5 minutes 125° C. ×5 minutes) in predetermined cycles (100 cycles, 500 cycles). Thereafter, these semiconductor chips were visually evaluated for occurrence of cracking. The results are set forth in Tables 15 to 17 given later.

[Conduction test conditions/adhesion evaluation conditions]

Moisture-absorption VPS conditions: 30° C./60 RH % ×168 hours+215° C. ×90 seconds For the conduction test, the resistivity determined after moisture-absorption VPS was represented relative to the initial value (resistivity) determined before moisture-absorption VPS as reference (100). For the evaluation of adhesion, ultrasonic microscope detection was effected. In some detail, the occurrence of voids in the underfill resin layer portion and delamination in the vicinity of the joint balls were mainly evaluated.

TABLE 15

[First embodiment]

| | | Example Nos. | | | | | |
|---|---|---|---|---|---|---|---|
| | | 35 | 36 | 37 | 38 | 39 | 40 |
| Underfill resin sheet | | a | b | c | d | e | f |
| Warpage after after-curing (mm) | | 32 | 35 | 36 | 24 | 20 | 18 |
| Conduction test *1 | Initial | 100 | 100 | 100 | 100 | 100 | 100 |
| | Moisture-absorption VPS | 100 | 100 | 100 | 100 | 100 | 100 |
| Evaluation of adhesion *2 | Initial | None | None | None | None | None | None |
| | Moisture-absorption VPS | None | None | None | None | None | None |

TABLE 15-continued

[First embodiment]

| | | Example Nos. | | | | | |
|---|---|---|---|---|---|---|---|
| | | 35 | 36 | 37 | 38 | 39 | 40 |
| Evaluation chip crack after TST *3 | After 100 cycles of TST | None | None | None | None | None | None |
| | After 500 cycles of TST | None | None | None | None | None | None |

*1: The resistivity determined after moisture-absorption VPS was represented relative to the initial value as 100.
*2: Ultrasonic microscope detection method was used to see if delamination occurs at the interface of the semiconductor chip with the board.
*3: The chip which had been subjected to predetermined cycles of TST under the conditions of - 40° C. × 5 minutes ⇋ 125° C. × 5 minutes was evaluated for occurrence of cracking.

TABLE 16

[Second embodiment]

| | | Example Nos. | | | | | |
|---|---|---|---|---|---|---|---|
| | | 41 | 42 | 43 | 44 | 45 | 46 |
| Underfill resin sheet | | a | b | c | d | e | f |
| Warpage after after-curing (mm) | | 30 | 34 | 35 | 24 | 19 | 16 |
| Conduction test *1 | Initial | 100 | 100 | 100 | 100 | 100 | 100 |
| | Moisture-absorption VPS | 100 | 100 | 100 | 100 | 100 | 100 |
| Evaluation of adhesion *2 | Initial | None | None | None | None | None | None |
| | Moisture-absorption VPS | None | None | None | None | None | None |
| Evaluation chip crack after TST *3 | After 100 cycles of TST | None | None | None | None | None | None |
| | After 500 cycles of TST | None | None | None | None | None | None |

*1: The resistivity determined after moisture-absorption VPS was represented relative to the initial value as 100.
*2: Ultrasonic Microscope detection method was used to see if delamination occurs at the interface of the semiconductor chip with the board.
*3: The chip which had been subjected to predetermined cycles of TST under the conditions of - 40° C. × 5 minutes ⇋ 125° C. × 5 minutes was evaluated for occurrence of cracking.

TABLE 17

[Third embodiment]

| | | Example Nos. | | | | | |
|---|---|---|---|---|---|---|---|
| | | 47 | 48 | 49 | 50 | 51 | 52 |
| Underfill resin sheet | | a | b | c | d | e | f |
| Warpage after after-curing (mm) | | 33 | 35 | 36 | 25 | 20 | 18 |
| Conduction test *1 | Initial | 100 | 100 | 100 | 100 | 100 | 100 |
| | Moisture-absorption VPS | 100 | 100 | 100 | 100 | 100 | 100 |
| Evaluation of adhesion *2 | Initial | None | None | None | None | None | None |
| | Moisture-absorption VPS | None | None | None | None | None | None |
| Evaluation chip crack after TST *3 | After 100 cycles of TST | None | None | None | None | None | None |
| | After 500 cycles of TST | None | None | None | None | None | None |

*1: The resistivity determined after moisture-absorption VPS was represented relative to the initial value as 100.
*2: Ultrasonic microscope detection method was used to see if delamination occurs at the interface of the semiconductor chip with the board.
*3: The chip which had been subjected to predetermined cycles of TST under the conditions of - 40° C. × 5 minutes ⇋ 125° C. × 5 minutes was evaluated for occurrence of cracking.

In Tables 15 to 17, the results of conduction test before and after moisture-absorption VPS show that the products of the present examples (all in the first to third embodiments) obtained by connecting the printed circuit board and the semiconductor element under pressure un the foregoing specific conditions (X) and (Y) so that the underfill resin sheet and the underfill resin layer were melted to form a seal layer exhibit a high reliability. Further, the results of evaluation for adhesion before and after moisture-absorption VPS show that these products had no delamination observed and no fine voids formed in the underfill resin layer and thus comprised a good underfill resin layer formed. Further, these products showed no cracking in the semiconductor chip when evaluated for chip cracking after TST. Moreover, these products showed a smaller degree of warpage after after-curing than the comparative products. Thus, it can be seen that the occurrence of warpage can be effectively inhibited. These facts show that semiconductor devices having no conduction problems and having an excellent reliability in thermal shock can be obtained.

Examples and comparative examples which go through a continuous line of production for the production of a semiconductor device where the previously mentioned steps of putting the underfill resin in B stage state, positioning and contact-bonding the semiconductor element and the printed circuit board, gelling the underfill resin and curing the resin are separately effected will be described hereinafter.

Prior to these examples, the same various components as mentioned above were prepared. These various components were mixed in proportions set forth in Tables 10 and 11 above. The mixture was withdrawn by a pallet, cooled, and then press-rolled into sheet to prepare a desired sheet-like epoxy resin composition (underfill resin sheet).

EXAMPLES 53–57

Figure 19:
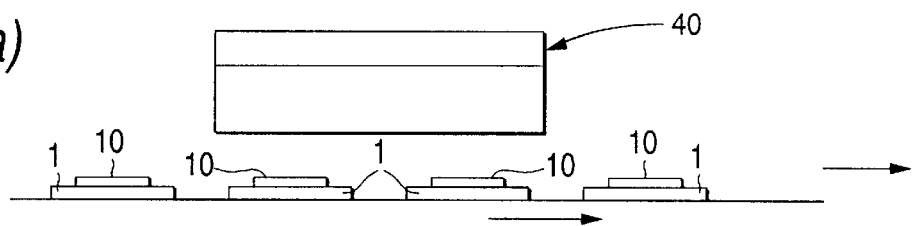
Figure 19:
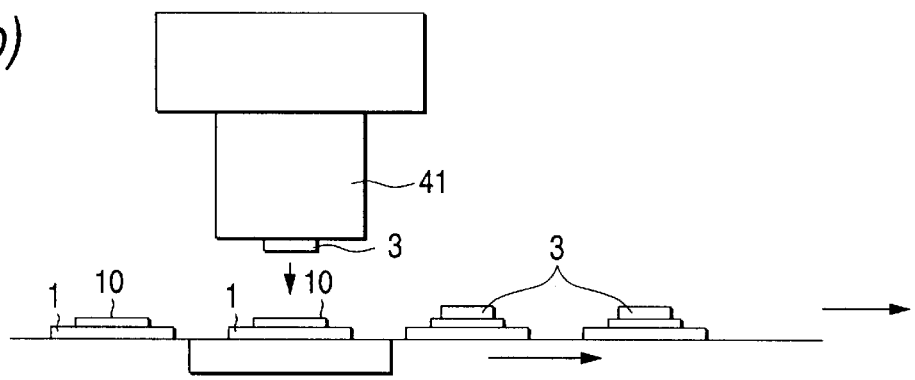
Figure 19:
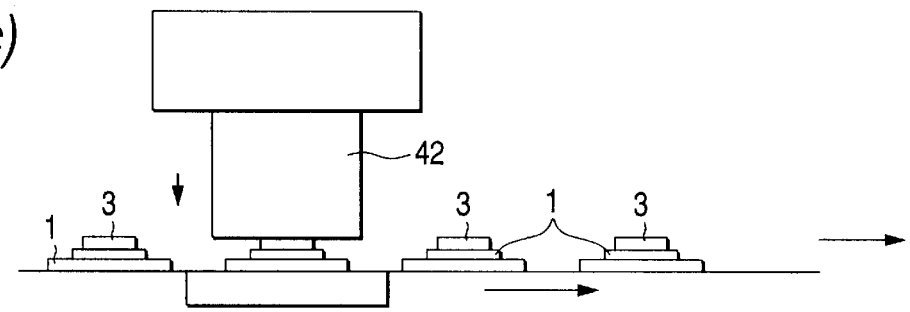
Figure 19:
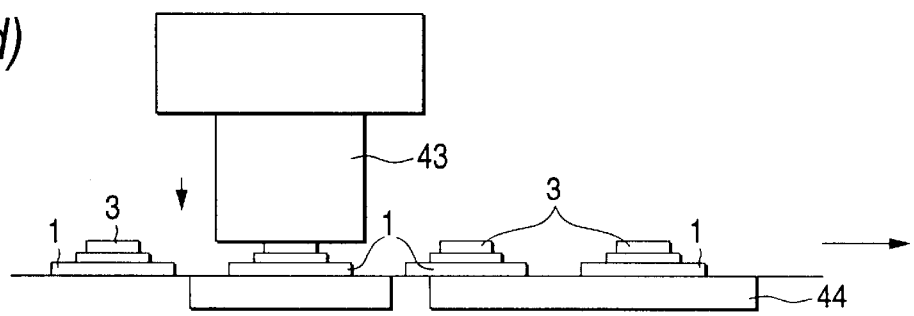

The sheet-like epoxy resin compositions (underfill resin sheets) thus obtained were then processed according to the first embodiment of the process for the production of a semiconductor device in a continuous line where the various steps are separately effected to produce a semiconductor device. In some detail, a laminate comprising an underfill resin sheet 10 placed on a board 1 having joint balls 2 provided thereon was prepared. As shown in FIG. 19(*a*), the laminate was then passed through a drying furnace 40 so that the underfill resin sheet 10 was put in B stage state (half-cured) (B stage step). Subsequently, as shown in FIG. 19(*b*), a semiconductor element 3 attached to the end of a heating contact-bonding tool 41 was positioned above the board 1 in such an arrangement that the semiconductor element 3 was placed on the underfill resin sheet 10 which had been put in B stage state in a predetermined position. At the same time, the semiconductor element 3 was placed on and tentatively bonded to the underfill resin sheet 10 provided on the board 1 in a predetermined position (positioning and contact-bonding step). Subsequently, as shown in FIG. 19(c), the heating tool 42 was allowed to come in contact with the surface of the semiconductor element 3 which had been tentatively bonded to the underfill resin sheet 10 so that the underfill resin sheet 10 was heated for a predetermined period of time. In this manner, the underfill resin sheet 10 was gelled (step of gelling underfill resin). In this manner, the underfill resin thus gelled was packed into the gap between the board 1 and the semiconductor element 3. After the packing of underfill resin, as shown in FIG. 19(d), the underfill resin which had been gelled by bringing the heating tool 43 into contact with the semiconductor element 3 was cured at a predetermined temperature. Subsequently, the board 1 was cooled by a cooling plate 44 positioned below the board 1 (curing step). In this manner, a semiconductor device having the gap between the semiconductor chip 3 and the board 1 filled with an underfill resin layer 4 as shown in FIG. 1 was prepared.

The various conditions such as temperature and time used at the foregoing B stage step of putting the resin in B stage state, the positioning and contact-bonding step, the underfill resin gelling step and the curing step are set forth in Table 18 below.

TABLE 18

| | | Example Nos. | | | | |
|---|---|---|---|---|---|---|
| | | 53 | 54 | 55 | 56 | 57 |
| Underfill resin sheet | | a | b | c | a | a |
| B stage step (135° C. x) (sec.) | | 150 | 150 | 135 | 135 | 135 |
| Positioning and contact-bonding step | Chip temp. (° C.) | 175 | 175 | 175 | 175 | 175 |
| | Board temp. (° C.) | 47 | 42 | 42 | 34 | 47 |
| | Pressing tiine (sec.) | 8 | 6 | 6 | 3 | 8 |
| Gelling step | % Residual heat of reaction | 67 | 67 | 70 | 66 | 66 |
| | Board temp. (° C.) | 75 | 64 | 64 | 47 | 75 |
| | Pressing time (sec.) | 10 | 8 | 8 | 5 | 10 |
| Curing step | Board temp. (° C.) | 119 | 115 | 143 | 151 | 153 |
| | Pressing time (sec.) | 10 | 8 | 8 | 5 | 10 |
| | Total sealing time (sec.) | 10 | 8 | 8 | 5 | 10 |

The various semiconductor devices thus obtained were each measured or evaluated for occurrence of voids, warpage after contact bonding and warpage of semiconductor device after post-curing at 150° C. for 30 minutes in the same manner as used above.

Further, these semiconductor devices were each subjected to thermal shock test (TST: −40° C. ×5 minutes ⇌125° C. ×5 minutes) in predetermined cycles (100 cycles, 500 cycles). Thereafter, these semiconductor chips were visually evaluated for occurrence of cracking.

Moreover, these semiconductor devices were each measured and evaluated for initial malconduction.

The results are set forth in Table 19 below.

TABLE 19

| | | Example Nos. | | | | |
|---|---|---|---|---|---|---|
| | | 53 | 54 | 55 | 56 | 57 |
| Occurrence of voids | | None | None | None | None | None |
| Warpage after contact bonding (μm) | | 22 | 11 | 15 | 5 | 24 |
| Warpage after standing at 150° C. for 30 minutes (μm) | | 26 | 16 | 19 | 11 | 28 |
| Occurrence of initial malfunction | | None | None | None | None | None |
| Evaluation chip crack after TST *3 | After 100 cycles of TST | None | None | None | None | None |
| | After 500 cycles of TST | None | None | None | None | None |

The results in Table 16 show that the products of the present examples produced by processing the board and the semiconductor chip under the foregoing specific conditions (X) and (Y) in a continuous line had no voids formed in the underfill resin layer and thus had a good underfill resin layer formed. These products showed a small warpage after contact bonding as well as after standing at 150° C. for 30 minutes. Further, these products showed normal condition. Moreover, these products had no cracking generated in the semiconductor chip when evaluated for chip crack after TST. All these semiconductor devices having a good underfill resin layer formed therein were efficiently produced in a total sealing time of not more than 10 seconds.

Subsequently, these underfill resin sheets were each processed according to the second and third embodiments of the process for the production of a semiconductor device in a continuous line, respectively, to produce semiconductor devices. The semiconductor devices thus obtained were each measured and evaluated in the same manner as mentioned above. As a result, almost the same good results as obtained with the semiconductor device obtained according to the first embodiment of the process for the production of a semiconductor device in a continuous line were obtained. In other words, the semiconductor devices thus obtained had no voids formed in the underfill resin layer and thus had a good underfill resin layer formed. These products showed a small warpage after contact bonding as well as after standing at 150° C. for 30 minutes. Further, these products showed normal condition. Moreover, these products had no cracking generated in the semiconductor chip when evaluated for chip crack after TST. All these semiconductor devices having a good underfill resin layer formed therein were efficiently produced in a total sealing time of not more than 10 seconds.

Examples of the third aspect of the present invention will be described hereinafter.

Prior to the examples, the following various components were prepared.

[Epoxy resin a1]

The epoxy resin a1 is a biphenyl type epoxy resin represented by the following structural formula:

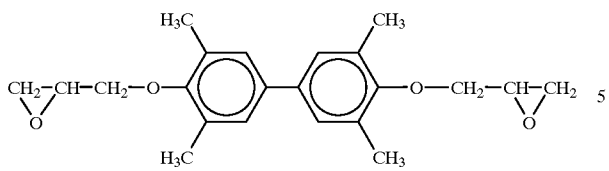

Epoxy equivalent: 195 g/eq; melting point: 107° C.
[Epoxy resin a2]

The epoxy resin a2 is a cresol novolac type epoxy resin (epoxy equivalent: 195 g/eq; melting point: 80° C.).
[Acrylonitrile-butadiene copolymer b1]

Acrylonitrile-butadiene-methacrylic acid copolymer [Mooney viscosity: 50; bonded acrylonitrile content: 30 wt-%; bonded carboxyl group content: 0.05 ephr (mols per 100 g of rubber)]
[Acrylonitrile-butadiene copolymer b2]

Acrylonitrile-butadiene-methacrylic acid copolymer (Mooney viscosity: 80; bonded acrylonitrile content: 20 wt-%; bonded carboxyl group content: 0.02 ephr)
[Hardener c1]

The hardener c1 is a phenol novolac resin (hydroxyl group equivalent: 175 g/eq; softening point: 75° C.) represented by the structural formula:

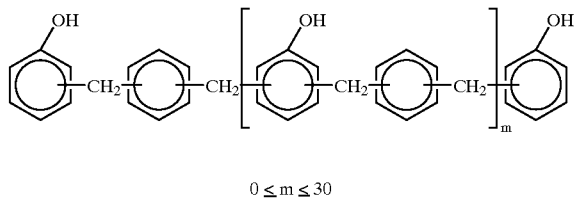

$0 \leq m \leq 30$

[Hardener c2]

The hardener c2 is a phenol novolac resin (hydroxyl group equivalent: 105 g/eq; softening point: 60° C.].
[Hardening accelerator]

The hardening accelerator is triphenyl phosphine.
[Inorganic filler]

The inorganic filler is a spherical silica powder (average grain diameter: 3 μm; maximum grain diameter: 30 μm).

EXAMPLES 58–67

The various components set forth in Tables 20 and 21 below were mixed in proportions set forth in these tables to prepare epoxy resin compositions. These epoxy resin compositions were each dissolved in toluene. The mixture solution was then applied to a polyester film which had been treated for easy release. The coated polyester film was then dried at a temperature of 120° C. to remove toluene therefrom. Thus, a desired sheet-like underfill material having a thickness of 100 μm was formed on the polyester film.

TABLE 20

(unit: parts by weight)

| | | Example Nos. | | | | | | |
|---|---|---|---|---|---|---|---|---|
| | | 58 | 59 | 60 | 61 | 362 | 63 | 64 |
| Epoxy resin | a1 | 47.4 | 36.9 | 47.4 | — | 58.5 | 31.6 | 47.4 |
| | a2 | — | — | — | 47.4 | — | — | — |
| Hardener | c1 | 42.6 | 33.1 | 42.6 | 42.6 | — | 28.4 | 42.6 |
| | c2 | — | — | — | — | 31.5 | — | — |

TABLE 20-continued (unit: parts by weight)

| | | Example Nos. | | | | | | |
|---|---|---|---|---|---|---|---|---|
| | | 58 | 59 | 60 | 61 | 362 | 63 | 64 |
| Acrylonitrile-butadiene copolymer | b1 | 10 | 30 | 10 | 10 | 10 | 40 | 10 |
| | b2 | — | — | — | — | — | — | — |
| Hardening accelerator | | 1.0 | 1.0 | 1.0 | 1.0 | 1.0 | 1.0 | 1.0 |
| Inorganic filler | | 101 | — | 303 | 101 | 101 | — | 404 |

TABLE 21

(unit: parts by weight)

| | | Example Nos. | | |
|---|---|---|---|---|
| | | 58 | 59 | 60 |
| Epoxy resin | a1 | 31.6 | 47.4 | 47.4 |
| | a2 | — | — | — |
| Hardener | c1 | 28.4 | 42.6 | 42.6 |
| | c2 | — | — | — |
| Acrylonitrile-butadiene copolymer | b1 | — | — | — |
| | b2 | 40 | 10 | 10 |
| Hardening accelerator | | 1.0 | 1.0 | 1.0 |
| Inorganic filler | | — | 101 | 404 |

The sheet-like underfill materials of the various examples thus obtained were each then processed according to the foregoing process for the production of a semiconductor device to produce semiconductor devices. In some detail, as shown in FIG. 21, the sheet-like underfill material 10 was then placed on a printed circuit board 1 (glass epoxy board having a thickness of 1 mm) having connecting electrode portions 2 (material: solder; melting point: 183° C.; shape: column having a diameter of 150 μm and a height of 30 μm) provided thereon. Thereafter, as shown in FIG. 22, a semiconductor element 3 (thickness: 350 m; size: 13 mm ×9 mm) having connecting electrode portions 2' (material: solder; melting point: 299° C.; shape: sphere having a diameter of 120 μ and a height of 90 μm) provided thereon was placed on the sheet-like underfill material 10. Thereafter, the sheet-like underfill material was heated and melted at a heating temperature of 150° C. under a load of 0.1 kgf per electrode for 1 minute so that the resin thus molten was packed into the gap between the printed circuit board 1 and the semiconductor element 3. In this manner, the two components were tentatively bonded to each other while the connecting electrode portions 2, 2' of the two components were electrically connected to each other. Subsequently, the resin was heat-cured (at 150° C. for 60 minutes) and the connecting electrode portions 2 were melted (at 250° C. for 30 seconds) to produce eight samples of semiconductor device having the gap filled with an underfill resin layer 4 each for the example as shown in FIG. 20.

The semiconductor devices thus obtained were each subjected to initial conduction test. Further, four out of the eight samples were subjected to 500 cycles of thermal shock test [TST (condition: –40° C. ×5 minutes ⇌125° C. ×5 minutes). Thereafter, these samples were subjected to conduction test and examined for cracking on semiconductor element. The results are set forth in Tables 22 and 23 below.

The other four out of the eight samples which had not been subjected to TST were subjected to moisture absorption at 30° C. and 60% RH for 168 hours and then to VPS (vapor phase soldering) at 215° C. for 90 seconds before conduction test. The results are set forth in Tables 22 and 23 below.

Separately, the sheet-like underfill materials obtained in the foregoing examples and comparative examples are each singly heated at a temperature of 150° C. for 60 minutes to obtain sheet-like hardened materials. These sheet-like hardened materials were each then measured for elastic modulus in tension at 25° C. by means of a universal tensile testing machine (autograph available from Shimadzu Corp.). The results are set forth in Tables 22 and 23.

TABLE 22

| | Example Nos. | | | | | | |
|---|---|---|---|---|---|---|---|
| | 58 | 59 | 60 | 61 | 62 | 63 | 64 |
| Elastic modulus in tension (MPa) | 5000 | 500 | 11000 | 5500 | 6500 | 300 | 15000 |
| Initial conduction test (number of defectives/8 samples) | 0/8 | 0/8 | 0/8 | 0/8 | 0/8 | 0/8 | 0/8 |
| Conduction test after TST (number of defectives/4 samples) | 0/4 | 0/4 | 0/4 | 0/4 | 0/4 | 0/4 | 0/4 |
| Chip crack after TST (number of defectives/4 samples) | 0/4 | 0/4 | 0/4 | 0/4 | 0/4 | 0/4 | 0/4 |
| Conduction test after moisture-absorption VPS (number of defectives/4 samples) | 0/4 | 0/4 | 0/4 | 0/4 | 0/4 | 0/4 | 0/4 |

TABLE 23

| | Example Nos. | | |
|---|---|---|---|
| | 65 | 66 | 67 |
| Elastic modulus in tension (MPa) | 300 | 5000 | 15000 |
| Initial conduction test (number of defectives/8 samples) | 0/8 | 0/8 | 0/8 |
| Conduction test after TST (number of defectives/4 samples) | 0/4 | 0/4 | 0/4 |
| Chip crack after TST (number of defectives/4 samples) | 0/4 | 0/4 | 0/4 |
| Conduction test after moisture-absorption VPS (number of defectives/4 samples) | 0/4 | 0/4 | 0/4 |

The results in Tables 22 and 23 show that the products of the present examples had no defectives all in the initial conduction test, conduction test after TST test, examination for crack on semiconductor chip after TST and conduction test after moisture-absorption VPS. In other words, the products of the present examples exhibit stable conductivity against stress tests such as initial conduction test, TST and moisture-absorption VPS.

Industrial applicability

The present invention can provide a process for the production of a semiconductor device which allows an easy formation of an underfill resin layer in the gap between the semiconductor element and the board and facilitates the resin sealing of the gap. The present invention also can provide a process for the production of a semiconductor device which can inhibit warpage of the entire device during the formation of an underfill resin layer in the gap between the semiconductor element and the board, making it easy to produce a semiconductor device excellent in reliability. Further, the present invention can provide a semiconductor device which exerts an excellent effect of relaxing the stress on the semiconductor element, printed circuit board and connecting electrode portions and thus exhibits a high reliability.

What is claimed is:

1. A process for the production of a semiconductor device comprising a semiconductor element on a printed circuit board with a plurality of connecting electrode portions interposed therebetween, and a gap between said printed circuit board and said semiconductor element being sealed with an underfill resin layer, wherein said process comprises melting a lamellar solid resin interposed between said printed circuit board and said semiconductor element to form said underfill resin layer, wherein said solid resin of the following epoxy resin composition (A):

comprises an epoxy resin composition comprising components (a) to (c), the proportion of said component (c) being not more than 90% by weight of the total weight of said epoxy resin composition:
(a) epoxy resin;
(b) phenol resin; and
(c) inorganic filler having a maximum grain diameter of not more than 100 $\mu$m.

2. The process for the production of a semiconductor device according to claim 1, which comprises forming the underfill resin layer by placing an underfill resin sheet as the lamellar solid resin on said printed circuit board, placing said semiconductor element on said underfill resin sheet to form a laminate, and then pressing the laminate until said underfill resin sheet exhibits at least one of the following physical properties (a) to (c) while being heated for a predetermined period of time so that the underfill resin thus molten is packed into the gap between said printed circuit board and said semiconductor element and hardened:
(a) resin viscosity is 5,000 poise or more;
(b) the gelling time of the underfill resin sheet is 30% or less of the gelling time of the underfill resin sheet before heating; and
(c) the residual heat of reaction of the underfill resin sheet as determined by a differential scanning calorimeter (DSC), is not more than 70% of the initial residual heat of reaction of the underfill resin sheet before heating.

3. The process for the production of a semiconductor device according to claim 1, which comprises forming the underfill resin layer by placing an underfill resin sheet on said printed circuit board so that the connecting electrode portions provided on the surface of said printed circuit board are each partly exposed, placing a semiconductor element on said connecting electrode portions so that electrode portions of said semiconductor element come in contact with said connecting electrode portions, and then pressing a resulting laminate until said underfill resin sheet exhibits at least one of the following physical properties (a) to (c) while being heated for a predetermined period of time so that the underfill resin thus molten is packed into the gap between said printed circuit board and said semiconductor element and hardened:

(a) resin viscosity is 5,000 poise or more;

(b) the gelling time of the underfill resin sheet is 30% or less of the gelling time of the underfill resin sheet before heating; and (c) the residual heat of reaction of the underfill resin sheet as determined by a differential scanning calorimeter (DSC), is not more than 70% of the initial residual heat of reaction of the underfill resin sheet before heating.

4. The process for the production of a semiconductor device according to claim 1, which comprises forming the underfill resin layer by placing an underfill resin sheet on said semiconductor element so that the connecting electrode portions provided on the surface of said semiconductor element are each partly exposed, placing a semiconductor element on said connecting electrode portions so that electrode portions of said semiconductor element come in contact with said connecting electrode portions, and then pressing a resulting laminate until said underfill resin sheet exhibits at least one of the following physical properties (a) to (c) while being heated for a predetermined period of time so that the underfill resin thus molten is packed into the gap between said printed circuit board and said semiconductor element and hardened:

(a) resin viscosity is 5,000 poise or more;

(b) the gelling time of the underfill resin sheet is 30% or less of the gelling time of the underfill resin sheet before heating, and (c) the residual heat of reaction of the underfill resin sheet as determined by a differential scanning calorimeter (DSC), is not more than 70% of the initial residual heat of reaction of the underfill resin sheet before heating.

5. The process for the production of a semiconductor device according to claim 1, which comprises forming the underfill resin layer by placing an underfill resin sheet on one side of said semiconductor element, placing said semiconductor element on a printed circuit board having a plurality of connecting electrode portions provided thereon so that said underfill resin sheet comes in contact with said connecting electrode portions, and then pressing a resulting laminate until said underfill resin sheet exhibits at least one of the following physical properties (a) to (c) while being heated for a predetermined period of time so that the underfill resin thus molten is packed into the gap between said printed circuit board and said semiconductor element and hardened:

(a) resin viscosity is 5,000 poise or more;

(b) the gelling time of the underfill resin sheet is 30% or less of the gelling time of the underfill resin sheet before heating; and (c) the residual heat of reaction of the underfill resin sheet as determined by a differential scanning calorimeter (DSC), is not more than 70% of the initial residual heat of reaction of the underfill resin sheet before heating.

6. The process for the production of a semiconductor device according to claim 1, which comprises forming the underfill resin layer by placing an underfill resin sheet on one side of said printed circuit board, placing a semiconductor element having a plurality of connecting electrode portions provided thereon on said printed circuit board so that said connecting electrode portions come in contact with said underfill resin sheet, and then pressing a resulting laminate until said underfill resin sheet exhibits at least one of the following physical properties (a) to (c) while being heated for a predetermined period of time so that the underfill resin thus molten is packed into the gap between said printed circuit board and said semiconductor element and hardened:

(a) resin viscosity is 5,000 poise or more;

(b) the gelling time of the underfill resin sheet is 30% or less of the gelling time of the underfill resin sheet before heating; and (c) the residual heat of reaction of the underfill resin sheet as determined by a differential scanning calorimeter (DSC), is not more than 70% of the initial residual heat of reaction of the underfill resin sheet before heating.

7. The process for the production of a semiconductor device according to any one of claims 3, 4, 5 or 6, wherein said underfill resin layer is formed by heating and melting the underfill resin sheet.

8. A process for the production of a semiconductor device comprising a semiconductor element on a printed circuit board with a plurality of connecting electrode portions interposed therebetween, and a gap between said printed circuit board and said semiconductor element being sealed with an underfill resin layer, said process comprising providing a lamellar solid resin interposed between said printed circuit board and said semiconductor element to form a laminate and heating the laminate under pressure under the following conditions (X) and (Y) so that said solid resin is melted to form said underfill resin layer:

(X) the residual heat of reaction of the solid resin as determined by a differential scanning calorimeter (DSC), is not more than 70% of the initial residual heat of reaction of the solid resin before heating; and (Y) the temperature of the semiconductor element is higher than that of the printed circuit board by at least 50° C.

9. The process for the production of a semiconductor device according to claim 1 or claim 8, wherein the lamellar solid resin has a thickness of from 50 to 95% of the total connection height.

10. The process for the production of a semiconductor device according to claim 2, wherein the underfill resin sheet has a thickness of from 50 to 95% of the total connection height.

11. A semiconductor device comprising a semiconductor element provided on a printed circuit board with a plurality of connecting electrode portions interposed therebetween, and a gap between said printed circuit board and said semiconductor element being sealed with an underfill resin layer, wherein said underfill resin layer comprises an epoxy resin composition comprising components (a) to (c), the proportion of said component (c) being not more than 90% by weight of the total weight of said epoxy resin composition;

(a) epoxy resin;

(b) phenol resin; and (c) inorganic filler having a maximum grain diameter of not more than 100 μm;

wherein said inorganic filler has a maximum grain diameter of ½ or less of a distance or gap between the printed circuit board and the semiconductor element wherein said underfill resin layer exhibits the following hardened physical property (Z):

(Z) elastic modulus in tension at 25° C. is from 300 to 15,000 MPa.

12. The process for the production of a semiconductor device according to claim 1, wherein said epoxy resin is a biphenyl epoxy resin.

13. The process for the production of a semiconductor device according to claim 1 or claim 12, wherein said the phenolic resin is represented by formula (2):

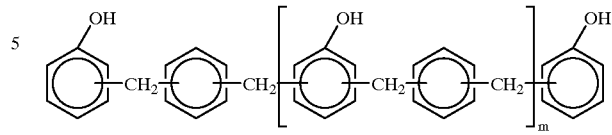
(2)

wherein m represents 0 or a positive integer.

14. The process for the production of semiconductor device according to any one of claims 1 or 12, wherein said inorganic filler has a maximum grain diameter of ½ or less of a distance or gap between the printed circuit board and the semiconductor element.

* * * * *